United States Patent
Choi et al.

(10) Patent No.: US 12,473,306 B2
(45) Date of Patent: Nov. 18, 2025

(54) BORON COMPOUND AND ORGANIC LIGHT-EMITTING DIODE INCLUDING SAME

(71) Applicant: SFC CO., LTD., Cheongju-si (KR)

(72) Inventors: Yeong-Tae Choi, Cheongju-si (KR); Se-Jin Lee, Cheongju-si (KR); Ji-Yung Kim, Cheongju-si (KR); Kyungtae Kim, Cheongju-si (KR); Myeong-Jun Kim, Cheongju-si (KR); Kyeong-Hyeon Kim, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 731 days.

(21) Appl. No.: 17/908,912

(22) PCT Filed: Mar. 19, 2021

(86) PCT No.: PCT/KR2021/003420
§ 371 (c)(1),
(2) Date: Sep. 2, 2022

(87) PCT Pub. No.: WO2021/187939
PCT Pub. Date: Sep. 23, 2021

(65) Prior Publication Data
US 2024/0147854 A1    May 2, 2024

(30) Foreign Application Priority Data
Mar. 19, 2020  (KR) .................. 10-2020-0034011

(51) Int. Cl.
*C07F 5/02*    (2006.01)
*C09K 11/06*   (2006.01)
(Continued)

(52) U.S. Cl.
CPC .............. *C07F 5/027* (2013.01); *C09K 11/06* (2013.01); *H10K 85/658* (2023.02);
(Continued)

(58) Field of Classification Search
CPC ..... C07F 5/027; C07F 7/0812; H10K 85/658; H10K 85/657; C09K 2211/1018
See application file for complete search history.

(56) References Cited

U.S. PATENT DOCUMENTS

2021/0184121 A1*  6/2021  Suh .................. C09K 11/06

FOREIGN PATENT DOCUMENTS

CN      108409761 A    8/2018
JP      6611825 B2     11/2019
(Continued)

OTHER PUBLICATIONS

International Search Report of PCT/KR2021/003420, Jul. 1, 2021, English translation.
(Continued)

*Primary Examiner* — Jenna N Chandhok
(74) *Attorney, Agent, or Firm* — STIP Law Group, LLC

(57) ABSTRACT

The present disclosure relates to a boron compound useful in an organic light-emitting diode and an organic light-emitting diode comprising same and, more particularly, to a boron compound represented by any one of [Chemical Formula A], wherein [Chemical Formula A] is as defined in the description.

19 Claims, 1 Drawing Sheet

(51) Int. Cl.
  *H10K 50/12*  (2023.01)
  *H10K 50/85*  (2023.01)
  *H10K 85/60*  (2023.01)

(52) U.S. Cl.
  CPC ...... *C09K 2211/1018* (2013.01); *H10K 50/12* (2023.02); *H10K 50/85* (2023.02)

(56) References Cited

FOREIGN PATENT DOCUMENTS

| | | | |
|---|---|---|---|
| KR | 20160119683 A | 10/2016 | |
| KR | 20180134850 A | 12/2018 | |
| KR | 20190042791 A | 4/2019 | |
| KR | 101990818 B1 | 6/2019 | |
| WO | WO2017188111 A1 | 11/2017 | |
| WO | WO2019164331 A1 | 8/2019 | |

OTHER PUBLICATIONS

The extended European search report of EP 21 77 2630, May 8, 2024.

\* cited by examiner

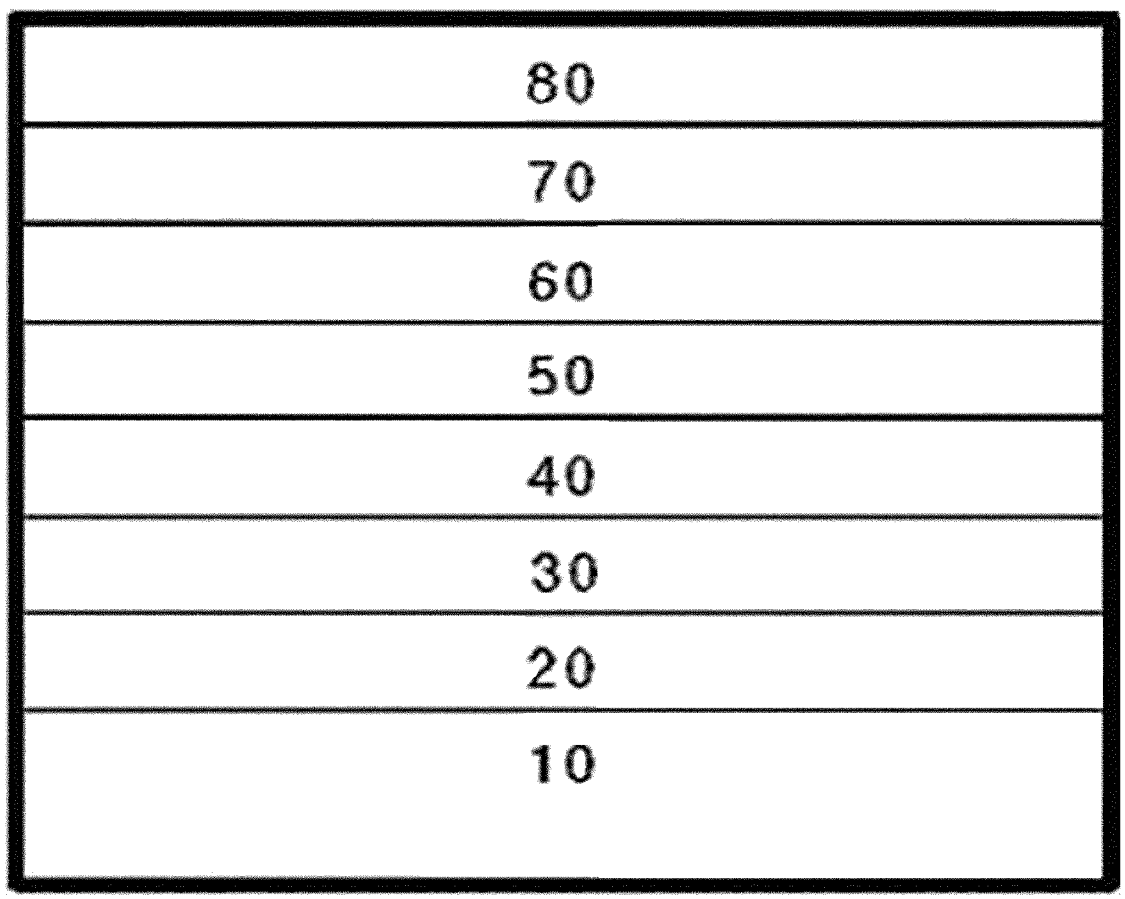

BORON COMPOUND AND ORGANIC LIGHT-EMITTING DIODE INCLUDING SAME

CROSS-REFERENCE TO RELATED APPLICATIONS

This application is the U.S. National Phase under 35 U.S.C. § 371 of International Application No. PCT/KR2021/003420 filed on Mar. 19, 2021, which in turn claims the benefit of Korean Application No. 10-2020-0034011 filed on Mar. 19, 2020, the disclosures of which are incorporated by reference into the present application.

TECHNICAL FIELD

The present disclosure relates to a novel boron compound useful for an organic light-emitting diode and, more particularly, to a novel boron compound that can be used as a dopant material in a light-emitting layer of an organic light-emitting diode and allow for excellent diode characteristics including high luminous efficiency and low driving voltage, and an organic light-emitting diode including the boron compound.

BACKGROUND ART

Organic light-emitting diodes (OLEDs), based on self-luminescence, are used to create digital displays with the advantage of having a wide viewing angle and being able to be made thinner and lighter than liquid crystal displays. In addition, an OLED display exhibits a very fast response time. Accordingly, OLEDs find applications in the full color display field or the illumination field.

In general, the term "organic light-emitting phenomenon" refers to a phenomenon in which electrical energy is converted to light energy by means of an organic material. An organic light-emitting diode using the organic light-emitting phenomenon has a structure usually including an anode, a cathode, and an organic material layer interposed therebetween. In this regard, the organic material layer may have, for the most part, a multilayer structure consisting of different materials, for example, a hole injection layer, a hole transport layer, a light-emitting layer, an electron transport layer, and an electron injection layer in order to enhance the efficiency and stability of the organic light-emitting diode. In the organic light-emitting diode having such a structure, application of a voltage between the two electrodes injects a hole from the anode and an electron from the cathode to the organic layer. In the luminescent zone, the hole and the electron recombine to produce an exciton. When the exciton returns to the ground state from the excited state, the molecule of the organic layer emits light. Such an organic light-emitting diode is known to have characteristics such as self-luminescence, high luminance, high efficiency, low driving voltage, a wide viewing angle, high contrast, and high-speed response.

Materials used as organic layers in OLEDs may be divided according to functions into luminescent materials and charge transport materials, for example, a hole injection material, a hole transport material, an electron transport material, and an electron injection material and, as needed, further into an electron-blocking material or a hole-blocking material.

As for the luminescent materials, there are two main families of OLED: those based on small molecules and those employing polymers. The light-emitting mechanism forms the basis of classification of luminescent materials as fluorescent and phosphorescent materials, which use excitons in singlet and triplet states, respectively.

When a single material is employed as the luminescent material, intermolecular actions cause the maximum luminescence wavelength to shift toward a longer wavelength, resulting in a reduction in color purity and luminous efficiency due to light attenuation. In this regard, a host-dopant system may be used as a luminescent material so as to increase the color purity and the luminous efficiency through energy transfer.

This is based on the principle whereby, when a dopant which is smaller in energy band gap than a host forming a light-emitting layer is added in a small amount to the light-emitting layer, excitons are generated from the light-emitting layer and transported to the dopant, emitting light at high efficiency. Here, light with desired wavelengths can be obtained depending on the kind of the dopant because the wavelength of the host moves to the wavelength range of the dopant.

Meanwhile, studies have been made to use boron compounds as dopant compounds. With regard to related art pertaining to the use of boron compounds, reference may be made to Korean Patent No. 10-2016-0119683 A (issued Oct. 14, 2016), which discloses an organic light-emitting diode employing a novel polycyclic aromatic compound in which multiple aromatic rings are connected via boron and oxygen atoms. In addition, International Patent No. WO 2017/188111 (Nov. 2, 2017) disclosed an organic light emitting diode in which a compound structured to connect multiple polycondensed aromatic rings via boron and nitrogen atoms is used as a dopant in a light emitting layer while an anthracene derivative is used as a host.

Despite a variety of kinds of compounds prepared for use in light emitting layers in organic light emitting diodes including the related arts, there is still a continuing need to develop a novel compound that allows an OLED to be stably driven at a lower voltage and exhibits high efficiency, and an OLED including the same.

DISCLOSURE

Technical Problem

Therefore, an aspect of the present disclosure is to provide a boron compound having a novel structure which can be used as a dopant material in a light-emitting layer of an organic light-emitting diode.

In addition, another aspect of the present invention is to provide an organic light-emitting diode (OLED) having the boron compound applied as a dopant material therein and exhibiting excellent diode characteristics including high luminous efficiency and low-voltage driving.

Technical Solution

In order to accomplish the purposes, the present disclosure provides a boron compound represented by Chemical Formula A:

[Chemical Formula A]

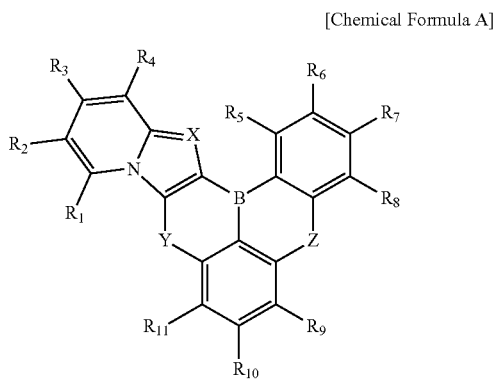

wherein,

Y is any one selected from $CR_{12}R_{13}$, $NR_{14}$, O, and S,

Z is any one selected from $CR_{15}R_{16}$, $NR_{17}$, O, and S,

X is $CR_{18}$ or a nitrogen atom (N), the substituents $R_1$ to $R_{17}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, a halogen, and $—N(R_{19})(R_{20})$, the substituents $R_{18}$ to $R_{20}$, which are same or different, are each independently selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, and a substituted or unsubstituted heteroaryl of 2 to 50 carbon atoms, wherein $R_{19}$ and $R_{20}$ may be connected to each other to additionally form an aliphatic or aromatic mono- or polycyclic ring, the substituents $R_{12}$ and $R_{13}$ may be connected to each other to form an additional mono- or polycyclic aliphatic or aromatic ring, the substituents $R_{15}$ and $R_{16}$ may be connected to each other to form an additional mono- or polycyclic aliphatic or aromatic ring, the substituents $R_{12}$ to $R_{14}$ may each be connected to $R_1$ or $R_{11}$ to form an additional mono- or polycyclic aliphatic or aromatic ring, the substituents $R_{15}$ to $R_{17}$ may each be connected to $R_8$ or $R_9$ to form an additional mono- or polycyclic aliphatic or aromatic ring, wherein the term "substituted" in the expression "substituted or unsubstituted" used for compounds of Chemical Formula A means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, a cycloalkyl of 3 to 24 carbon atoms, an aryl of 6 to 24 carbon atoms, an arylalkyl of 7 to 24 carbon atoms, an alkylaryl of 7 to 24 carbon atoms, a heteroaryl of 2 to 24 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl(heteroaryl)amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

Advantageous Effects

When used as a dopant material, the novel boron compound according to the present disclosure allows for the provision of an organic light-emitting diode that can be driven at a lower voltage with improved luminous efficiency, compared to conventional organic light-emitting diodes.

BRIEF DESCRIPTION OF THE DRAWINGS

The Figure is a schematic diagram of an organic light-emitting diode according to some embodiments of the present disclosure.

BEST MODE FOR CARRYING OUT THE INVENTION

Below, a detailed description will be given of the present disclosure. In each drawing of the present disclosure, sizes or scales of components may be enlarged or reduced from their actual sizes or scales for better illustration, and known components may not be depicted therein to clearly show features of the present disclosure. Therefore, the present disclosure is not limited to the drawings. When describing the principle of the embodiments of the present disclosure in detail, details of well-known functions and features may be omitted to avoid unnecessarily obscuring the presented embodiments.

In drawings, for convenience of description, sizes of components may be exaggerated for clarity. For example, since sizes and thicknesses of components in drawings are arbitrarily shown for convenience of description, the sizes and thicknesses are not limited thereto. Furthermore, throughout the description, the terms "on" and "over" are used to refer to the relative positioning, and mean not only that one component or layer is directly disposed on another component or layer but also that one component or layer is indirectly disposed on another component or layer with a further component or layer being interposed therebetween. Also, spatially relative terms, such as "below", "beneath", "lower", and "between" may be used herein for ease of description to refer to the relative positioning.

Throughout the specification, when a portion may "include" a certain constituent element, unless explicitly described to the contrary, it may not be construed to exclude another constituent element but may be construed to further include other constituent elements. Further, throughout the specification, the word "on" means W positioning on or below the object portion, but does not essentially mean positioning on the lower side of the object portion based on a gravity direction.

The present disclosure provides a boron compound represented by
Chemical Formula A:

[Chemical Formula A]

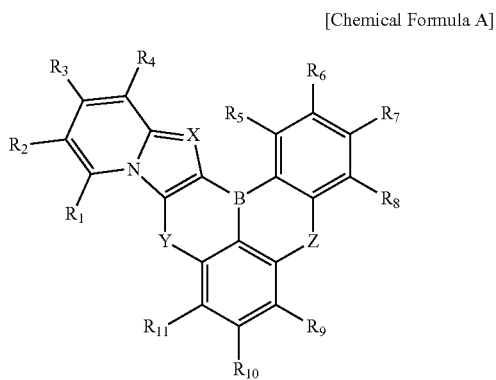

wherein,
Y is any one selected from $CR_{12}R_{13}$, $NR_{14}$, O, and S,
Z is any one selected from $CR_{15}R_{16}$, $NR_{17}$, O, and S,
X is $CR_{18}$ or a nitrogen atom (N),
the substituents $R_1$ to $R_{17}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, a halogen, and —$N(R_{19})(R_{20})$,
the substituents $R_{18}$ to $R_{20}$, which are same or different, are each independently selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, and a substituted or unsubstituted heteroaryl of 2 to 50 carbon atoms, wherein $R_{19}$ and $R_{20}$ may be connected to each other to additionally form an aliphatic or aromatic mono- or polycyclic ring,
the substituents $R_{12}$ and $R_{13}$ may be connected to each other to form an additional mono- or polycyclic aliphatic or aromatic ring,
the substituents $R_{15}$ and $R_{16}$ may be connected to each other to form an additional mono- or polycyclic aliphatic or aromatic ring,
the substituents $R_{12}$ to $R_{14}$ may each be connected to $R_1$ or $R_{11}$ to form an additional mono- or polycyclic aliphatic or aromatic ring,
the substituents $R_{15}$ to $R_{17}$ may each be connected to $R_8$ or $R_9$ to form an additional mono- or polycyclic aliphatic or aromatic ring,
wherein the term "substituted" in the expression "substituted or unsubstituted" used for compounds of Chemical Formula A means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, a cycloalkyl of 3 to 24 carbon atoms, an aryl of 6 to 24 carbon atoms, an arylalkyl of 7 to 24 carbon atoms, an alkylaryl of 7 to 24 carbon atoms, a heteroaryl of 2 to 24 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl(heteroaryl)amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

The expression indicating the number of carbon atoms, such as "a substituted or unsubstituted alkyl of 1 to 30 carbon atoms", "a substituted or unsubstituted aryl of 5 to 50 carbon atoms", etc. means the total number of carbon atoms of, for example, the alkyl or aryl radical or moiety alone, exclusive of the number of carbon atoms of substituents attached thereto. For instance, a phenyl group with a butyl at the para position falls within the scope of an aryl of 6 carbon atoms, even though it is substituted with a butyl radical of 4 carbon atoms.

As used herein, the term "aryl" means an organic radical derived from an aromatic hydrocarbon by removing one hydrogen that is bonded to the aromatic hydrocarbon. The aromatic system may include a fused ring that is formed by adjacent substituents on the aryl radical.

Concrete examples of the aryl include phenyl, o-biphenyl, m-biphenyl, p-biphenyl, o-terphenyl, m-terphenyl, p-terphenyl, naphthyl, anthryl, phenanthryl, pyrenyl, indenyl, fluorenyl, tetrahydronaphthyl, perylenyl, chrysenyl, naphthacenyl, and fluoranthenyl. At least one hydrogen atom of the aryl may be substituted by a deuterium atom, a halogen atom, a hydroxy, a nitro, a cyano, a silyl, an amino (—$NH_2$, —NH(R), —N(R') (R") wherein R' and R" are each independently an alkyl of 1 to 10 carbon atoms, in this case, called "alkylamino"), an amidino, a hydrazine, a hydrazone, a carboxyl, a sulfonic acid, a phosphoric acid, an alkyl of 1 to 24 carbon atoms, a halogenated alkyl of 1 to 24 carbon atoms, an alkenyl of 1 to 24 carbon atoms, an alkynyl of 1 to 24 carbon atoms, a heteroalkyl of 1 to 24 carbon atoms, an aryl of 6 to 24 carbon atoms, an arylalkyl of 6 to 24 carbon atoms, a heteroaryl of 2 to 24 carbon atoms, or a heteroarylalkyl of 2 to 24 carbon atoms.

The term "heteroaryl substituent" used in the compound of the present disclosure refers to a hetero aromatic radical of 2 to 50 carbon atoms, preferably 2 to 24 carbon atoms, bearing 1 to 3 heteroatoms selected from among N, O, P, Si, S, Ge, Se, and Te. In the aromatic radical, two or more rings may be fused. One or more hydrogen atoms on the heteroaryl may be substituted by the same substituents as on the aryl.

In addition, the term "heteroaromatic ring", as used herein, refers to an aromatic hydrocarbon ring bearing at least one heteroatom as aromatic ring member. In the heteroaromatic ring, one to three carbon atoms of the aromatic hydrocarbon may be substituted by at least one selected particularly from N, O, P, Si, S, Ge, Se, and Te.

As used herein, the term "alkyl" refers to an alkane missing one hydrogen atom and includes linear or branched structures. Examples of the alkyl substituent useful in the present disclosure include methyl, ethyl, propyl, isopropyl, isobutyl, sec-butyl, tert-butyl, pentyl, isoamyl, and hexyl. At least one hydrogen atom of the alkyl may be substituted by the same substituent as in the aryl.

The term "cyclo" as used in substituents of the present disclosure, such as cycloalkyl, cycloalkoxy, etc., refers to a structure responsible for a mono- or polycyclic ring of saturated hydrocarbons. Concrete examples of cycloalkyl radicals include cyclopropyl, cyclobutyl, cyclopentyl, cyclohexyl, methylcyclopentyl, methylcyclohexyl, ethylcyclopentyl, ethylcyclohexyl, adamantyl, dicyclopentadienyl, decahydronaphthyl, norbornyl, bornyl, and isobornyl. One or more hydrogen atoms on the cycloalkyl may be substituted by the same The term "alkoxy" as used in the compounds of the present disclosure refers to an alkyl or cycloalkyl singularly bonded to oxygen. Concrete examples of the alkoxy include methoxy, ethoxy, propoxy, isobutoxy, sec-butoxy, pentoxy, iso-amyloxy, hexyloxy, cyclobutyloxy, cyclopentyloxy, adamantyloxy, dicyclopentyloxy, bornyloxy, and isobornyloxy. One or more hydrogen atoms on the alkoxy may be substituted by the same substituents as on the aryl.

Concrete examples of the arylalkyl used in the compounds of the present disclosure include phenylmethyl (benzyl), phenylethyl, phenylpropyl, naphthylmethyl, and naphthylethyl. One or more hydrogen atoms on the arylalkyl may be substituted by the same substituents as on the aryl.

Concrete examples of the silyl radicals used in the compounds of the present disclosure include trimethylsilyl, triethylsilyl, triphenylsilyl, trimethoxysilyl, dimethoxyphenylsilyl, diphenylmethylsilyl, diphenylvinlysilyl, methylcyclobutylsilyl, and dimethyl furylsilyl. One or more hydrogen atoms on the silyl may be substituted by the same substituents as on the aryl.

As used herein, the term "alkenyl" refers to an unsaturated hydrocarbon group that contains a carbon-carbon double bond between two carbon atoms and the term "alkynyl" refers to an unsaturated hydrocarbon group that contains a carbon-carbon triple bond between two carbon atoms.

As used herein, the term "alkylene" refers to an organic aliphatic radical regarded as derived from a linear or branched saturated hydrocarbon alkane by removal of two hydrogen atoms from different carbon atoms. Concrete examples of the alkylene include methylene, ethylene, propylene, isopropylene, isobutylene, sec-butylene, tert-butylene, pentylene, iso-amylene, hexylene, and so on. One or more hydrogen atoms on the alkylene may be substituted by the same substituents as on the aryl.

Furthermore, as used herein, the term "diarylamino" refers to an amine radical having two identical or different aryl groups bonded to the nitrogen atom thereof, the term "diheteroarylamino" refers to an amine radical having two identical or different heteroaryl groups bonded to the nitrogen atom thereof, and the term "aryl(heteroaryl)amino" refers to an amine radical having an aryl group and a heteroarylgroup both bonded to the nitrogen atom thereof.

As more particular examples accounting for the term "substituted" in the expression "substituted or unsubstituted" used for compounds of Chemical Formula A, the compounds may be substituted by at least one substituent selected from the group consisting of a deuterium atom, a cyano, a halogen, a hydroxy, a nitro, an alkyl of 1 to 12 carbon atoms, a halogenated alkyl of 1 to 12 carbon atoms, an alkenyl of 2 to 12 carbon atoms, an alkynyl of 2 to 12 carbon atoms, a cycloalkyl of 3 to 12 carbon atoms, a heteroalkyl of 1 to 12 carbon atoms, an aryl of 6 to 18 carbon atoms, an arylalkyl of 7 to 20 carbon atoms, an alkylaryl of 7 to 20 carbon atoms, a heteroaryl of 2 to 18 carbon atoms, a heteroarylalkyl of 2 to 18 carbon atoms, an alkoxy of 1 to 12 carbon atoms, an alkylamino of 1 to 12 carbon atoms, an arylamino of 6 to 18 carbon atoms, a heteroarylamino of 1 to 18 carbon atoms, an alkylsilyl of 1 to 12 carbon atoms, an arylsilyl of 6 to 18 carbon atoms, an aryloxy of 6 to 18 carbon atoms, and an arylthionyl of 6 to 18 carbon atoms.

In the present disclosure, the boron compound represented by Chemical Formula A is a polycyclic fused ring characterized by the structure in which the nitrogen atom (N)-bearing, unsaturated hexagonal ring (hexagonal ring having $R_1$ to $R_4$) is fused with the unsaturated pentagonal ring sharing the nitrogen atom (N) with the hexagonal ring and bearing the linker X to form an unsaturated double ring of "hexagonal ring-pentagonal ring", wherein the two adjacent carbon atoms that is included within the pentagonal ring, but not within the unsaturated hexagonal ring are bonded to each other via a double bond, one of the two adjacent carbon atoms being bonded to the central atom boron (B) and the other carbon atom being bonded to the linker Y, and the carbon atom between the nitrogen atom and the linker X in the pentagonal ring is bonded to X via a double bond; the aromatic hexagonal ring having the substituents $R_9$ to $R_{11}$ is connected with the unsaturated pentagonal ring via the boron atom and the linker Y; and the aromatic hexagonal ring having the substituents $R_5$ to $R_8$ is connected with the aromatic hexagonal ring having the substituents $R_9$ to $R_{11}$ via the central atom boron element and the linker Z. With the structural characteristic, the compound can be used as a material in a light-emitting layer, particularly as a dopant, providing the organic light-emitting diode with a high luminous efficiency and a low driving voltage.

In an embodiment, the linker X in Chemical Formula A may be a nitrogen, or C—H or C—D.

In this regard, the unsaturated double ring of "hexagonal ring-pentagonal ring" in the compound represented by Chemical Formula A corresponds to the structure of the following Structural Formula B-1 when the linker X in Chemical Formula A is a nitrogen atom (N) and to the structure of the following Structural Formula B-2 when the linker X in Chemical Formula A is C—H or C—D:

[Structural Formula B-1]

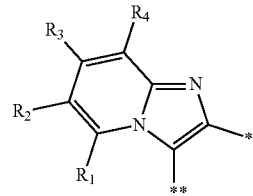

[Structural Formula B-2]

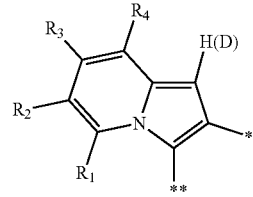

wherein "—*" denotes a bonding site to the central atom boron (B) in Chemical Formula A, and "—**" denotes a bonding site to the linker Y in Chemical Formula A.

When the linker X is a nitrogen atom (N), or C—H or C—D, the polycyclic ring represented by Structural Formula B-1 or B-2 is boned to the boron atom (B) and the linker Y; the aromatic ring of 6 carbon atoms having the substituents $R_5$ to $R_8$ and the aromatic ring of 6 carbon atoms having the substituents $R_9$ to $R_{11}$ each bond to the central atom boron (B); and the aromatic ring of 6 carbon atoms having the substituents $R_5$ to $R_8$ and the aromatic ring of 6 carbon atoms having the substituents $R_9$ to $R_{11}$ are connected to each other via the linker Z.

In an embodiment of Chemical Formula A, the linker Y may be $NR_{14}$ or the linker Z may be $NR_{17}$ wherein $R_{14}$ and $R_{17}$ are as defined above. Preferably, the linker Y is $NR_{14}$ and the linker Z is $NR_{17}$.

In an embodiment of Chemical Formula A, when the linker Y is $NR_{14}$ or the linker Z is $NR_{17}$, $R_{14}$ and $R_{17}$ may be same or different and each independently a substituted or unsubstituted aryl of 6 to 18 carbon atoms or a substituted or unsubstituted heteroaryl of 2 to 18 carbon atoms.

In an embodiment of Chemical Formula A, when the linker Y is $NR_{14}$ or the linker Z is $NR_{17}$, $R_{14}$ and $R_{17}$ may be same or different and each independently selected from a substituted or unsubstituted phenyl, a substituted or unsubstituted biphenyl, a substituted or unsubstituted naphthyl, a substituted or unsubstituted anthracenyl, a substituted or unsubstituted phenanthrenyl, and a substituted or unsubstituted fluorenyl.

In the boron compound represented by Chemical Formula A according to an embodiment, at least one of the substituents $R_1$ to $R_{11}$ may be $-N(R_{19})(R_{20})$ and preferably one or two of the substituents $R_1$ to $R_{11}$ may be $-N(R_{19})(R_{20})$.

When at least one of the substituents $R_1$ to $R_{11}$ in Chemical Formula A is $-N(R_{19})(R_{20})$, one or two of the substituents $R_1$ to $R_8$ may be preferably $-N(R_{19})(R_{20})$.

The substituent represented by $-N(R_{19})(R_{20})$ may have the following Structural Formula A:

[Structural Formula A]

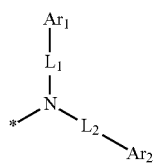

wherein, the linkers $L_1$ and $L_2$, which are same or different, are each independently a single bond or a substituted or unsubstituted arylene of 6 to 18 carbon atoms, and the substituents $Ar_1$ and $Ar_2$, which are same or different, are each independently selected from a substituted or unsubstituted alkyl of 1 to 15 carbon atoms, a substituted or unsubstituted aryl of 6 to 18 carbon atoms, a substituted or unsubstituted cycloalkyl of 3 to 15 carbon atoms, and a substituted or unsubstituted heteroaryl of 2 to 18 carbon atoms and may be bonded to each other to form an additional mono- or polycyclic aliphatic or aromatic ring. In Structural Formula A, more preferably, the substituent $Ar_1$ may be a substituted or unsubstituted aryl of 6 to 18 carbon atoms and the substituent $Ar_2$ may be a substituted or unsubstituted aryl of 6 to 18 carbon atoms.

In addition, the substituent represented by Structural Formula A may be preferably that represented by the following Structural Formula A-1 or A-2:

[Structural Formula A-1]

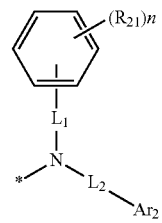

[Structural Formula A-2]

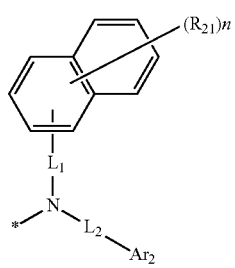

wherein, $L_1$, $L_2$ and $Ar_2$ are each as defined in Structural Formula A, $R_{21}$ and $R_{22}$ are each as defined for $R_1$ to $R_{17}$ in Chemical Formula A, and n is an integer of 1 to 7 wherein when n is 2 or greater, the $R_{21}$'s or $R_{22}$'s are same or different.

In an embodiment of Structural Formulas A-1 and A-2, $R_{21}$ and $R_{22}$, which are same or different, are each independently any one selected from a hydrogen atom, a deuterium atom, a substituted or unsubstituted alkyl of 1 to 30 carbon atoms, and a substituted or unsubstituted aryl of 6 to 50 carbon atoms.

Concrete examples of the boron compound represented by Chemical Formula A include any one selected from the following <Compound 1> to <Compound 132>:

<Compound 1>

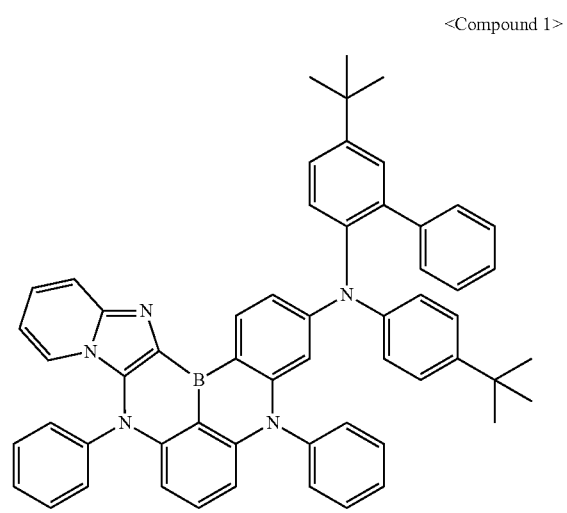

<Compound 2>
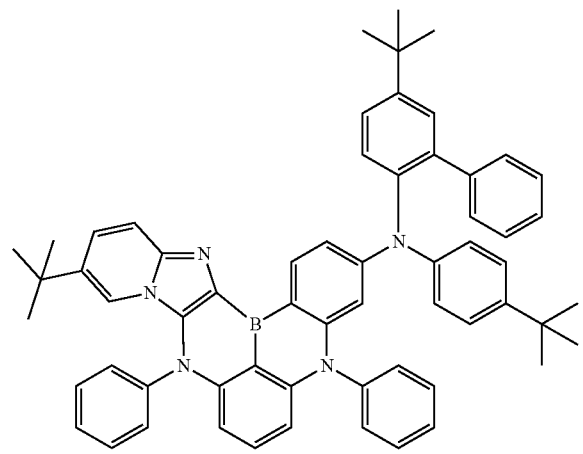
<Compound 3>
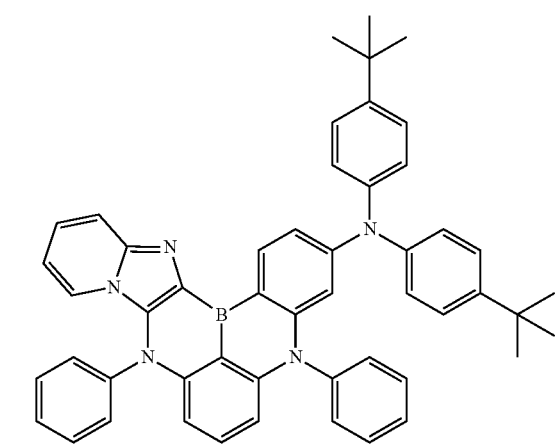
<Compound 4>
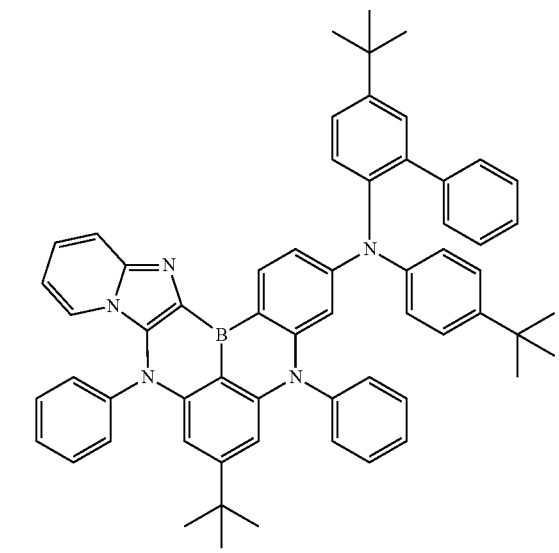
<Compound 5>
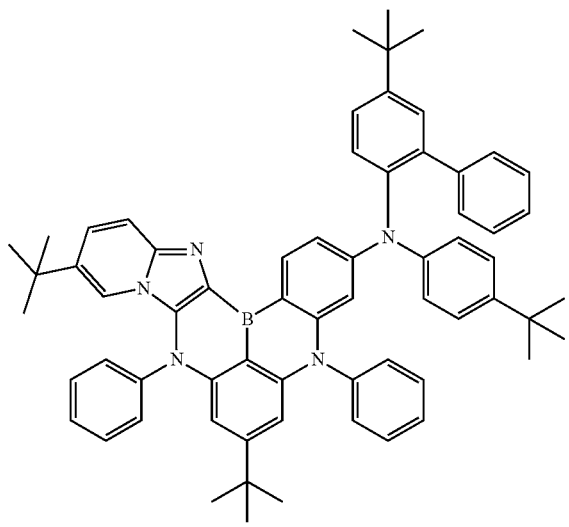
<Compound 6>
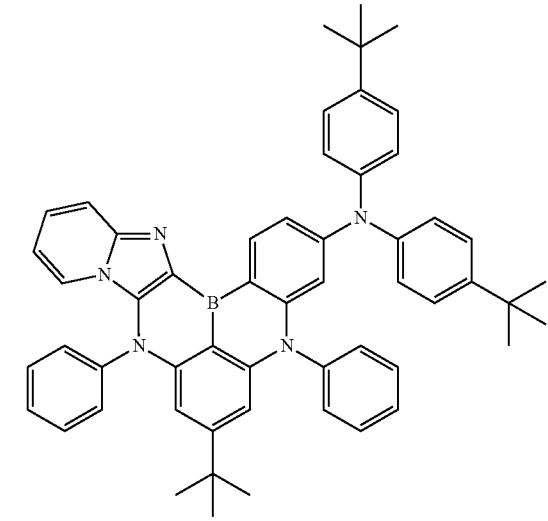
<Compound 7>
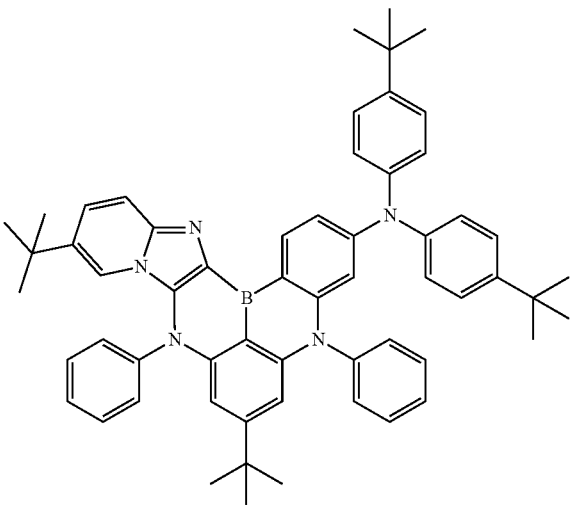

<Compound 8>
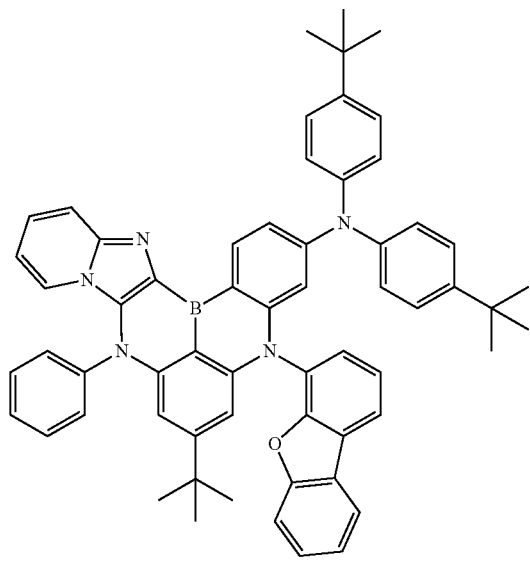
<Compound 9>
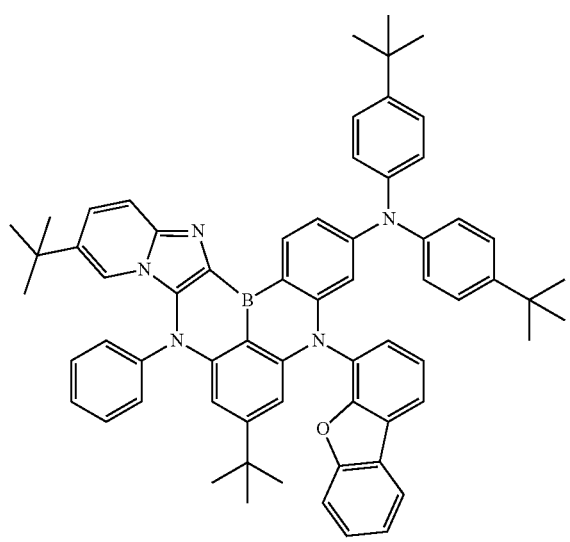
<Compound 10>
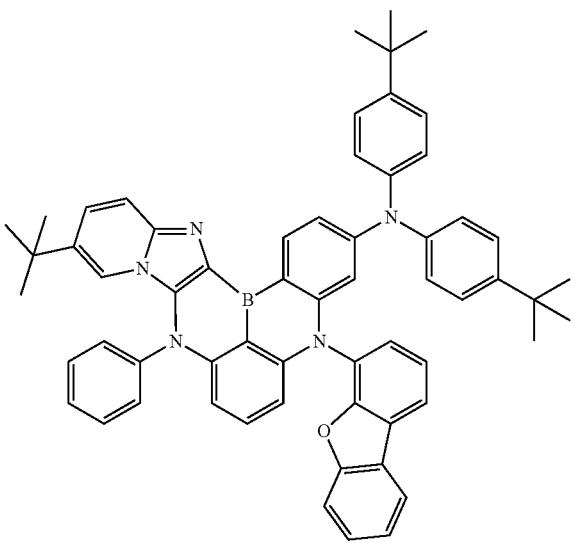
<Compound 11>
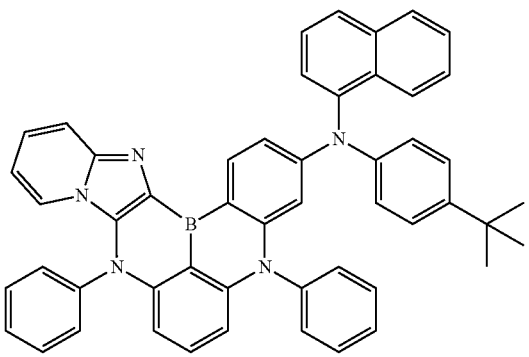
<Compound 12>
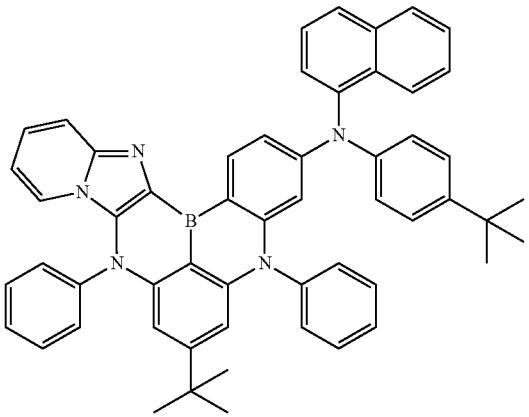

<Compound 13>
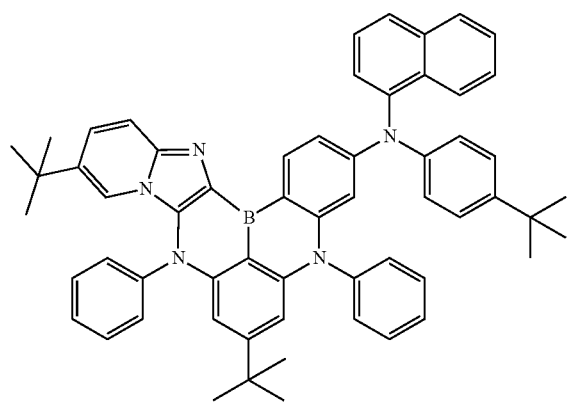
<Compound 14>
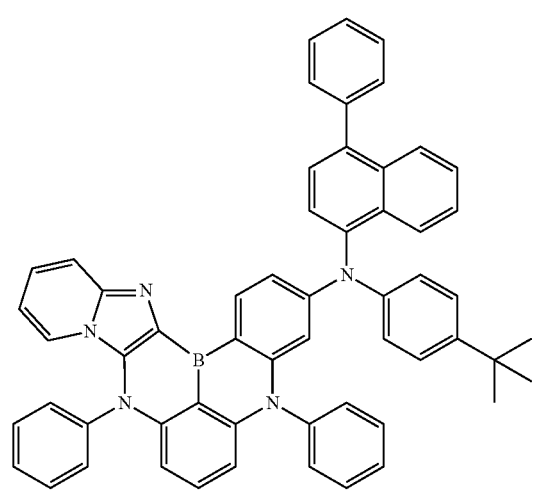
<Compound 15>
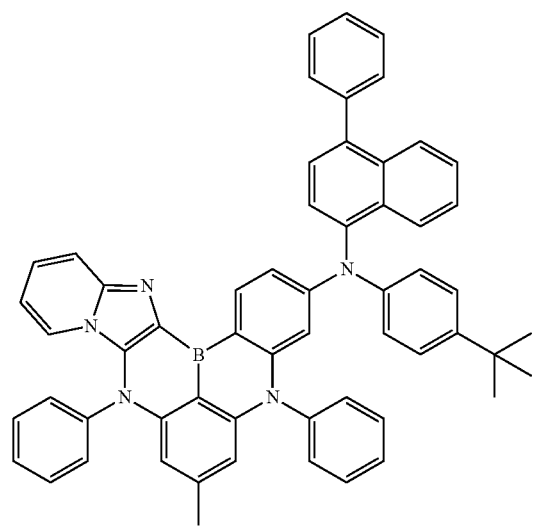
<Compound 16>
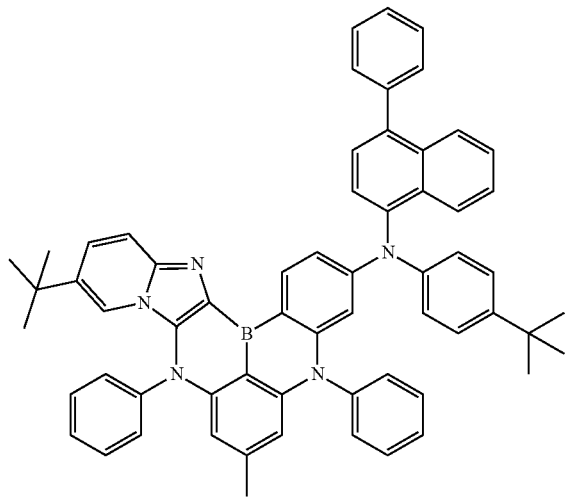
<Compound 17>
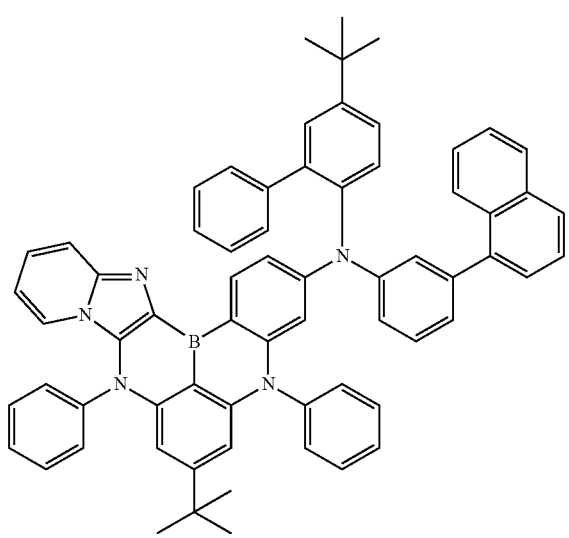
<Compound 18>

<Compound 19>
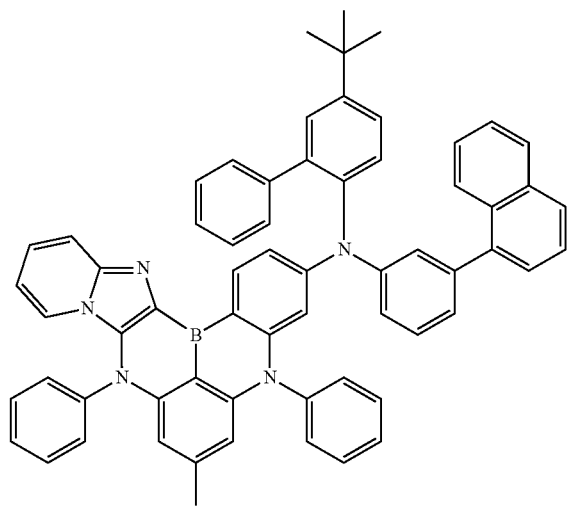
<Compound 20>
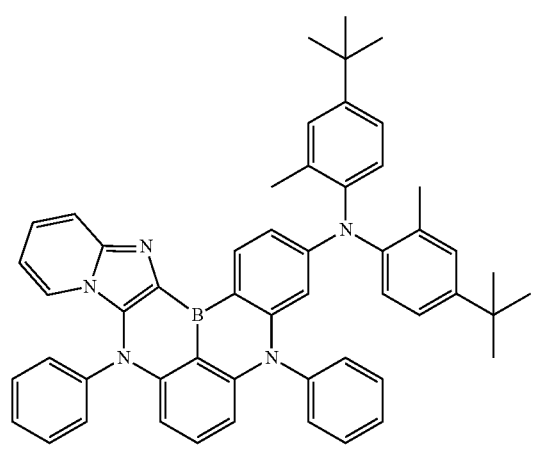
<Compound 21>
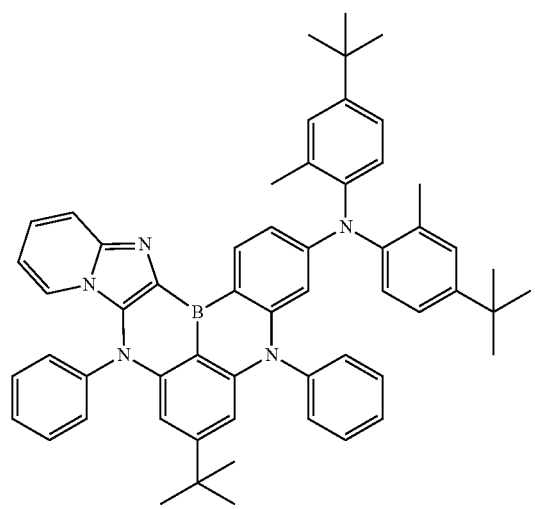
<Compound 22>
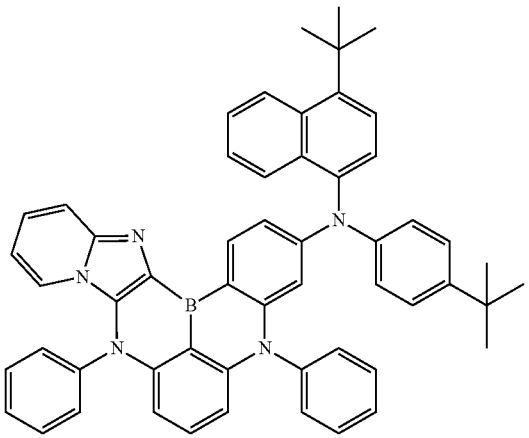
<Compound 23>
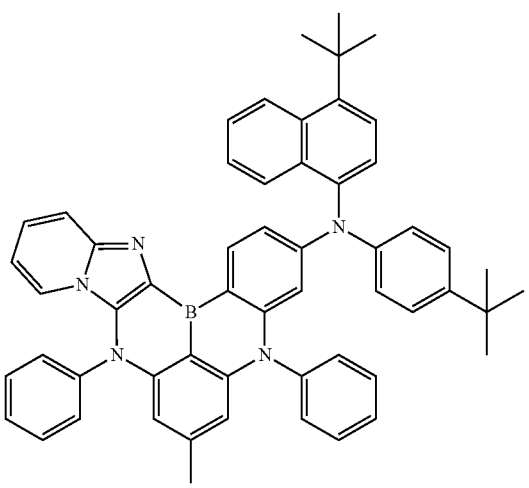
<Compound 24>

-continued
<Compound 25>
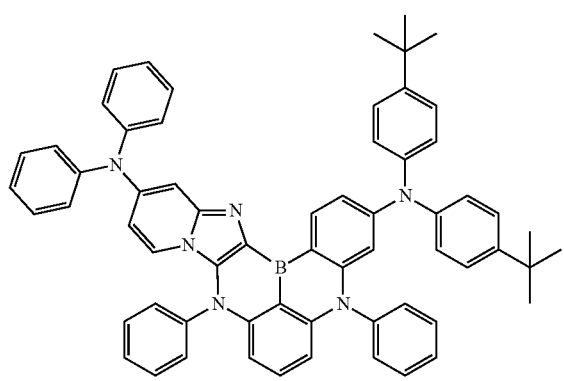
<Compound 26>
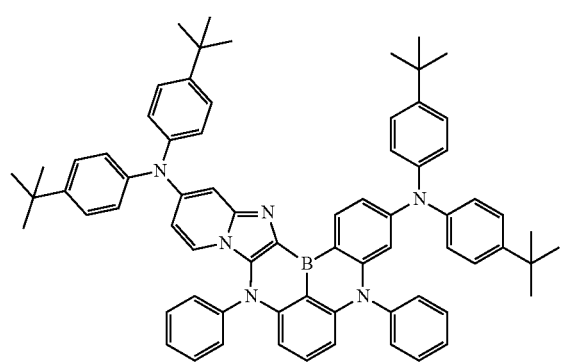
<Compound 27>
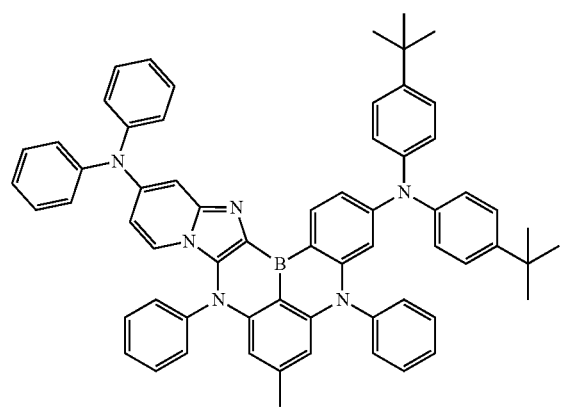
<Compound 28>
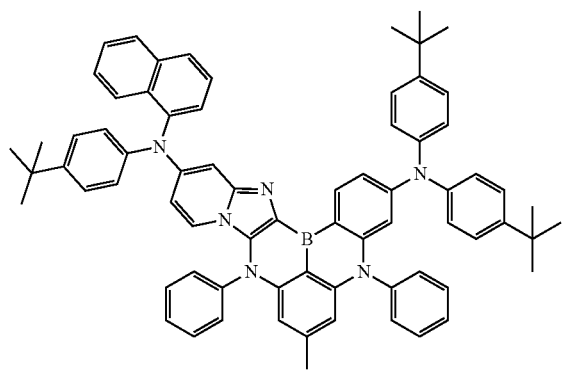
<Compound 29>
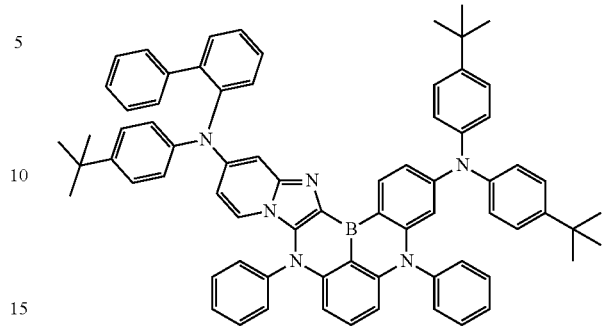
<Compound 30>
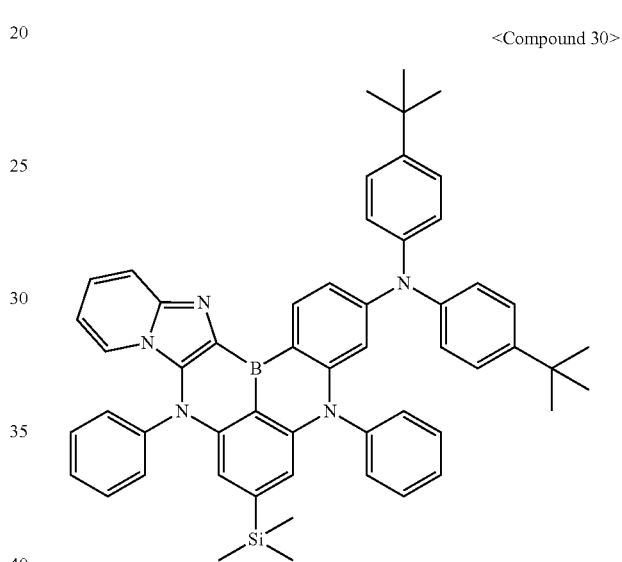
<Compound 31>
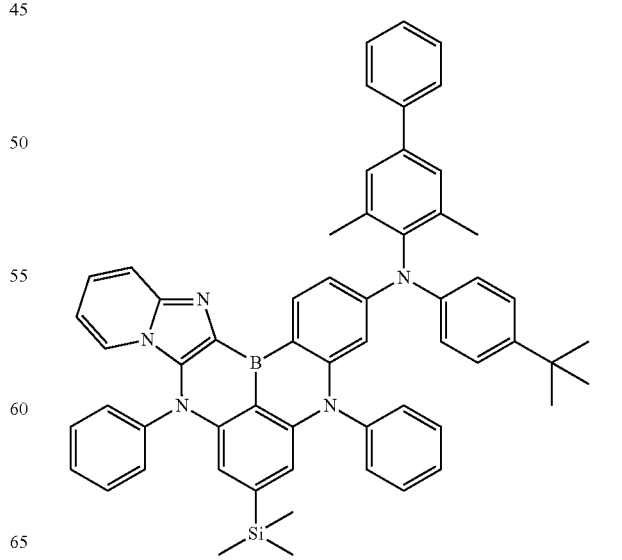

-continued
<Compound 32>
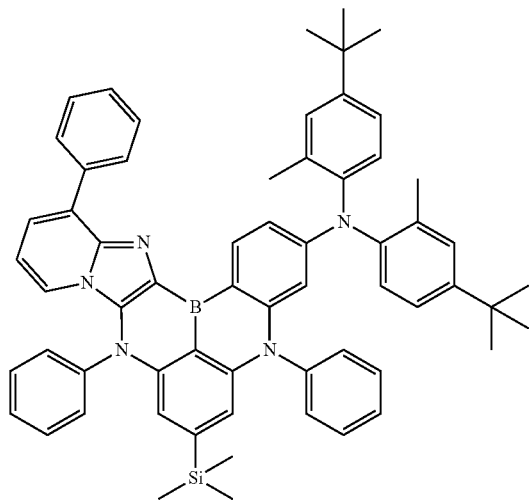
<Compound 33>
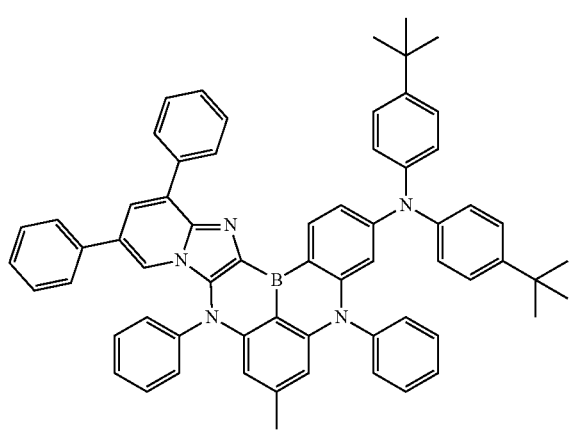
<Compound 34>
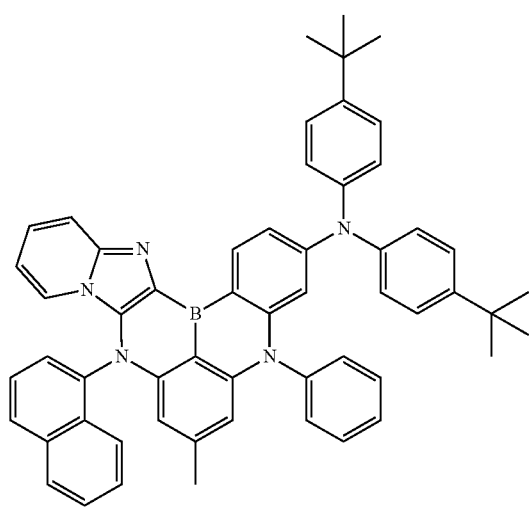
<Compound 35>
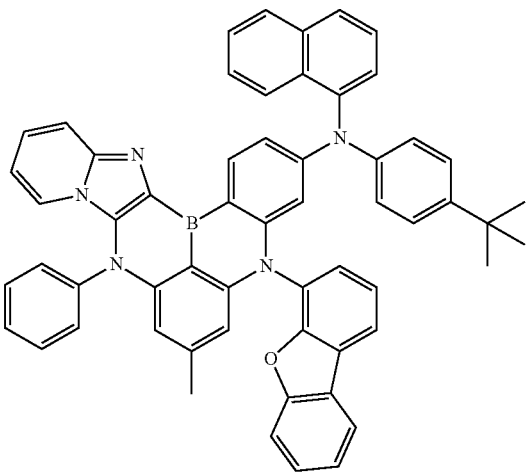
<Compound 36>
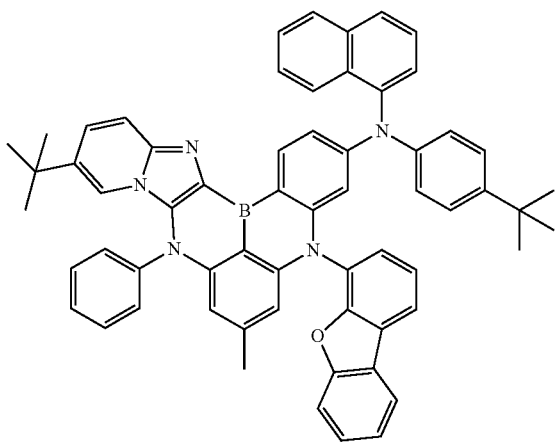
<Compound 37>
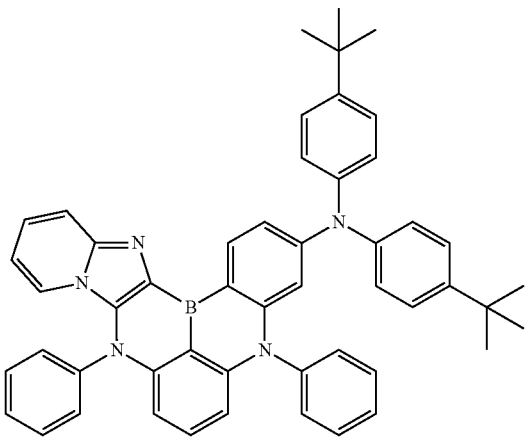

<Compound 38>
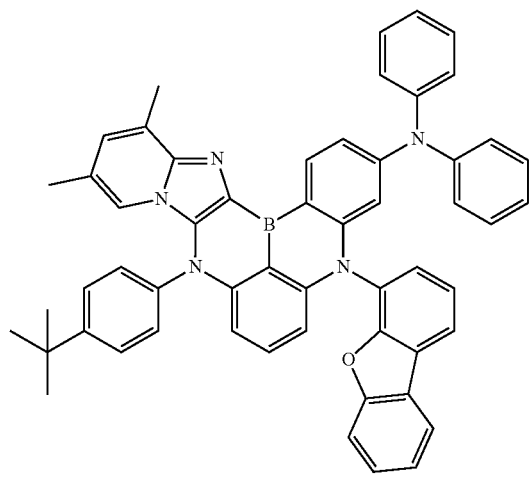
<Compound 39>
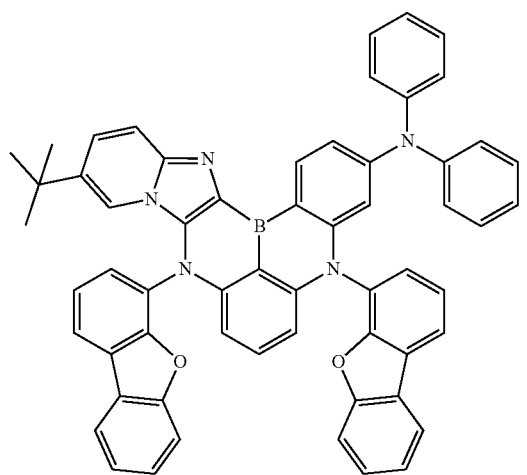
<Compound 40>
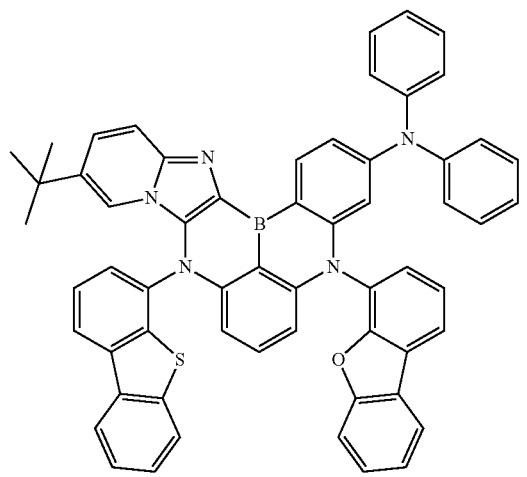
<Compound 41>
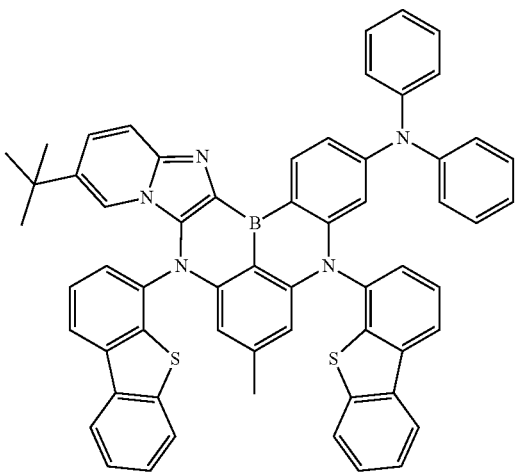
<Compound 42>
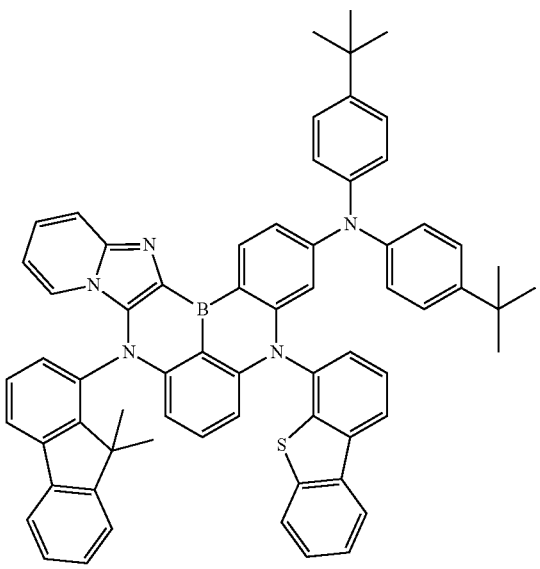
<Compound 43>
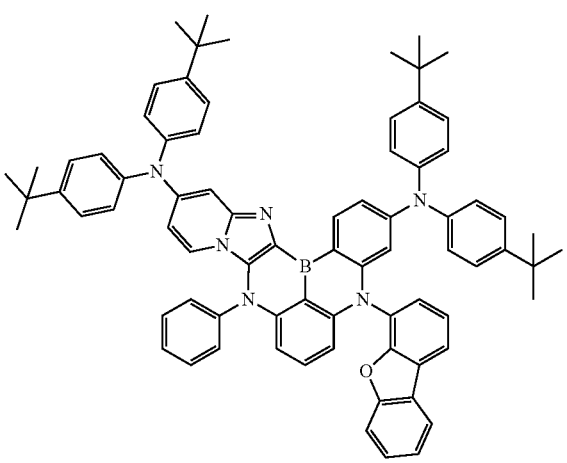

<Compound 44>
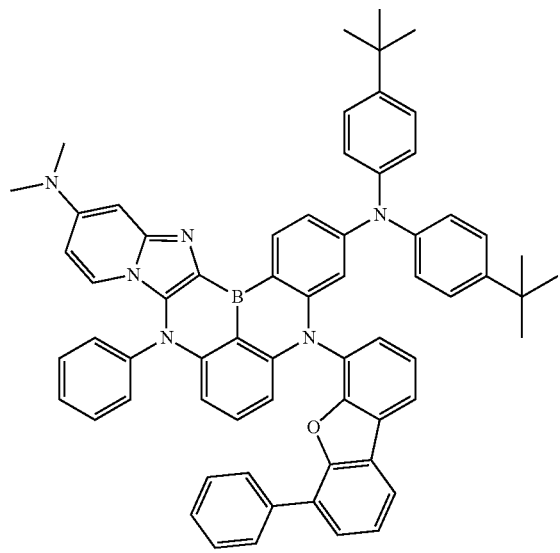
<Compound 46>
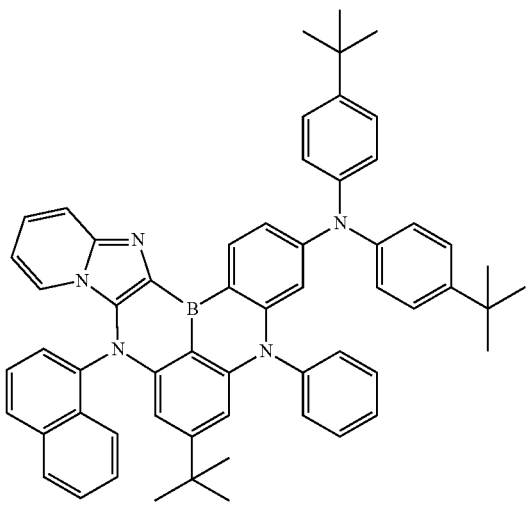
<Compound 45>
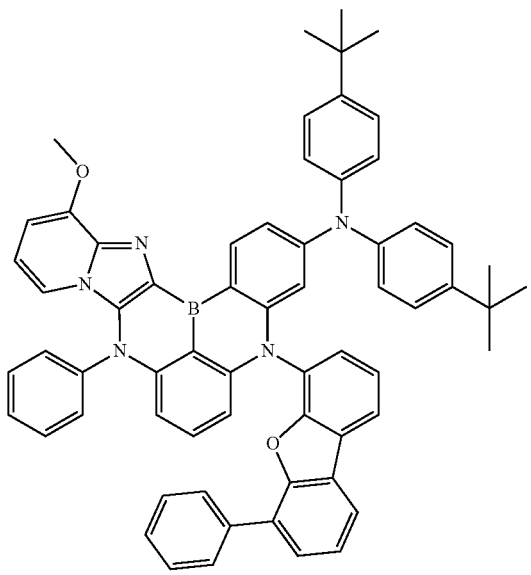
<Compound 47>
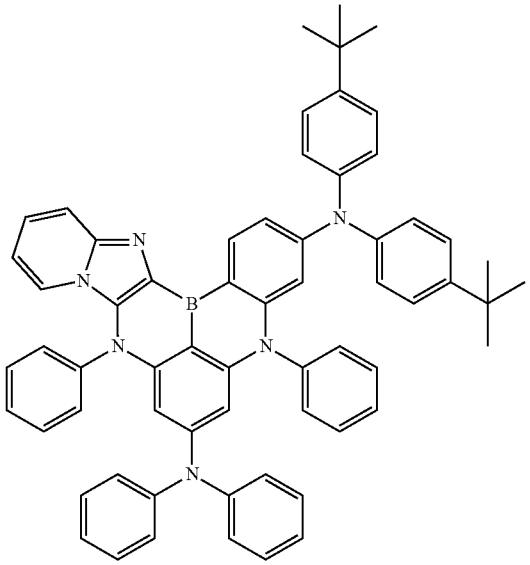

-continued
<Compound 48>
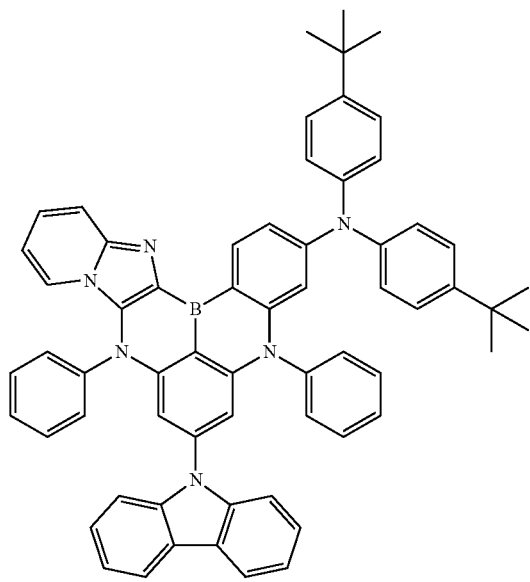
<Compound 49>
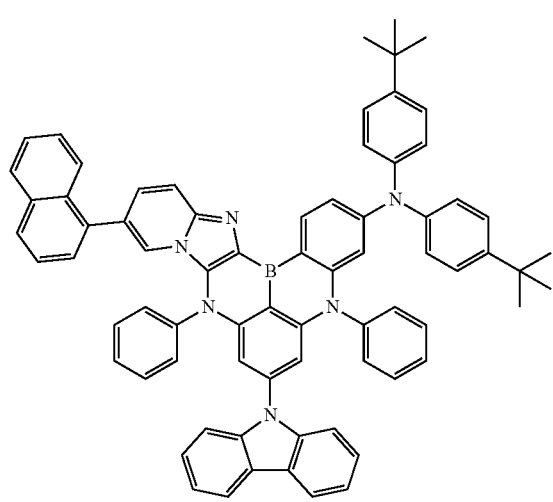
<Compound 50>
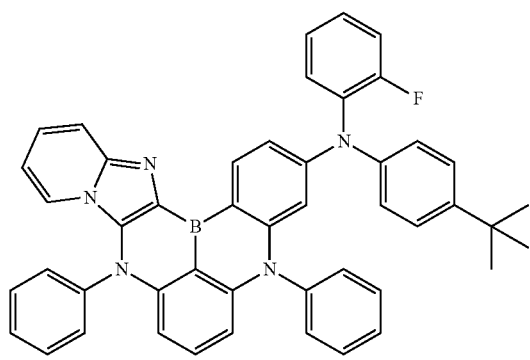
<Compound 51>
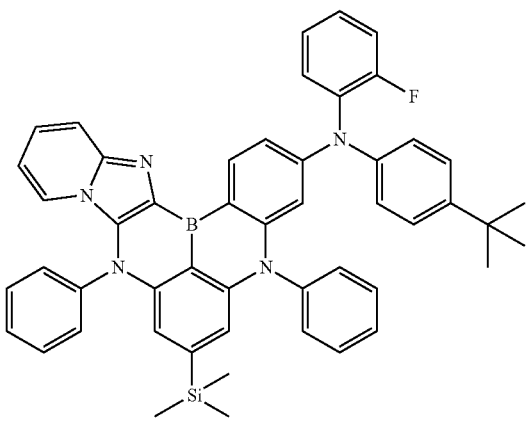
<Compound 52>
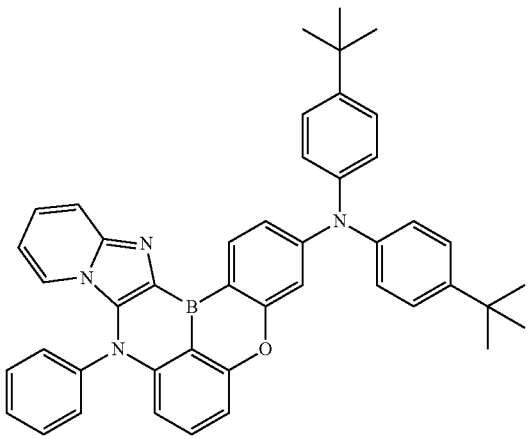
<Compound 53>
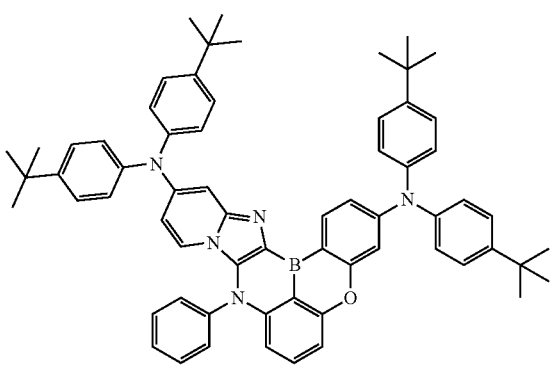

<Compound 54>
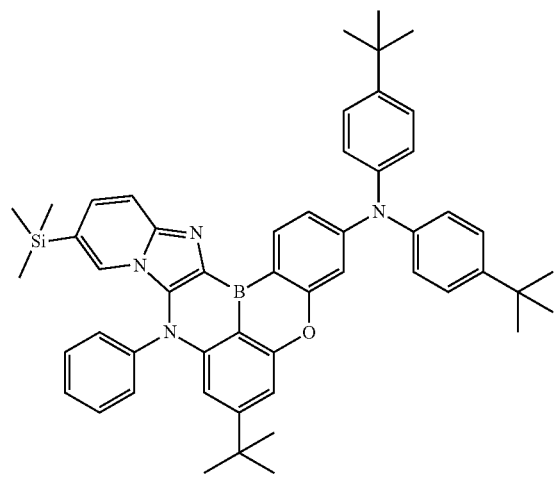
<Compound 55>
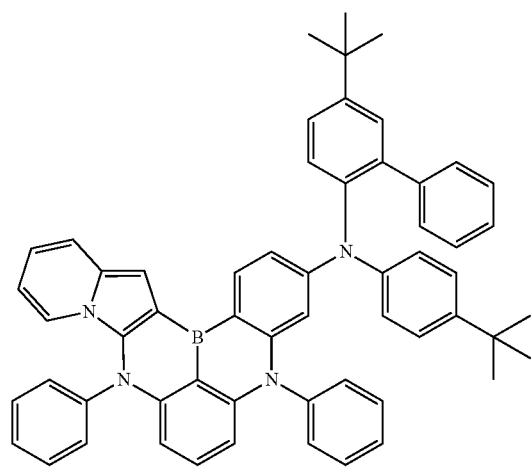
<Compound 56>
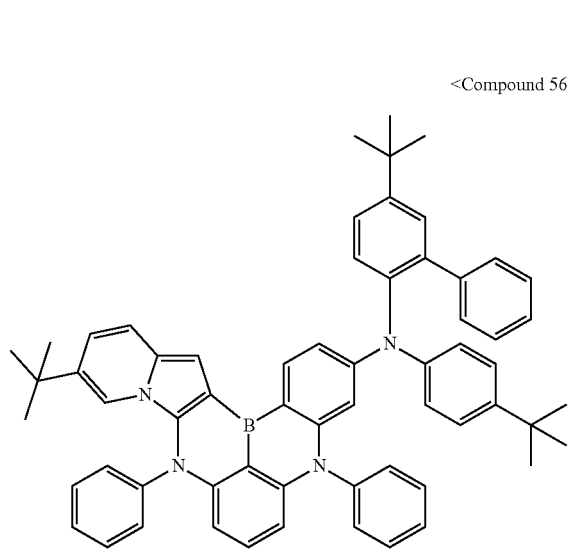
<Compound 57>
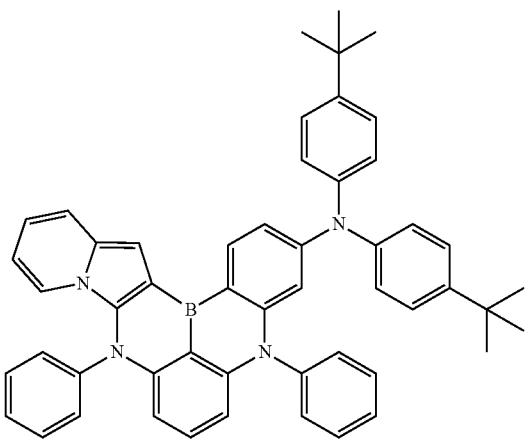
<Compound 58>
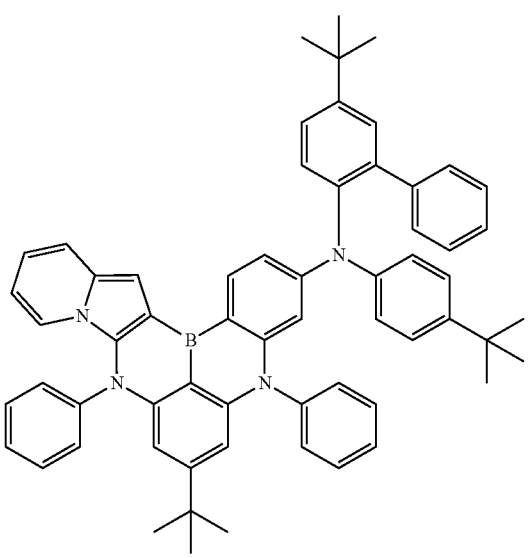
<Compound 59>
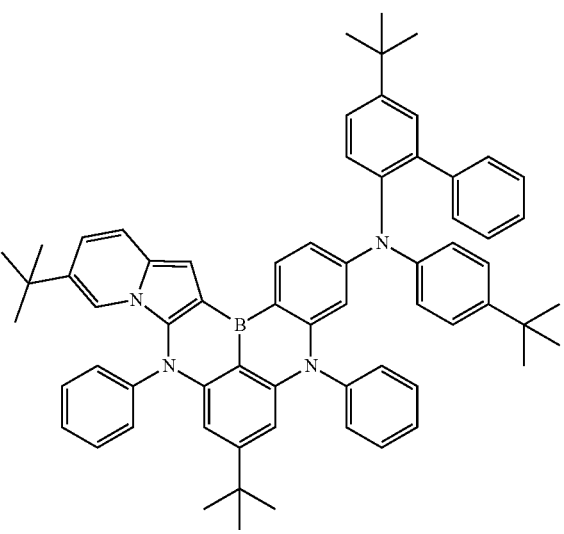

<Compound 60>
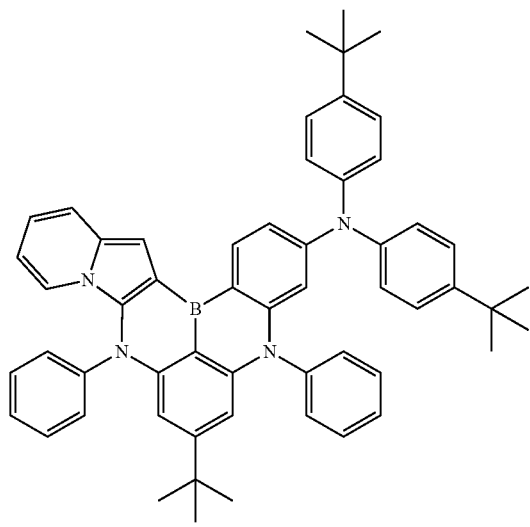
<Compound 61>
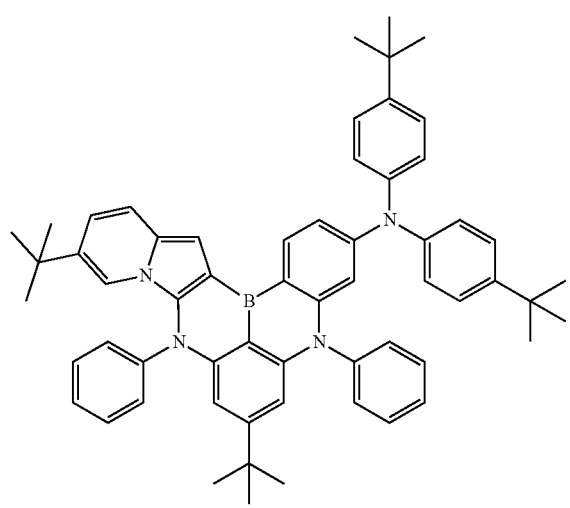
<Compound 62>
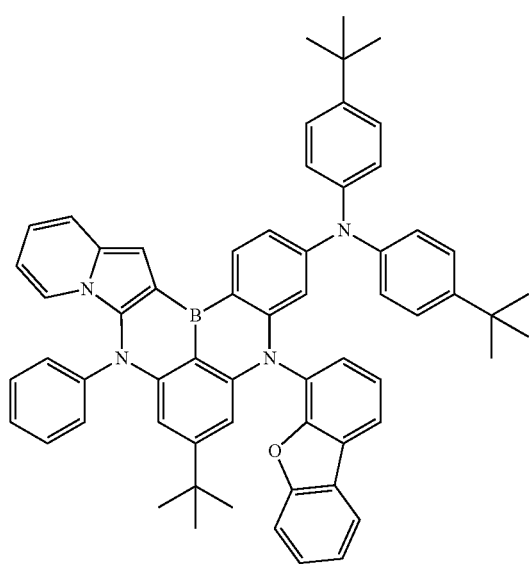
<Compound 63>
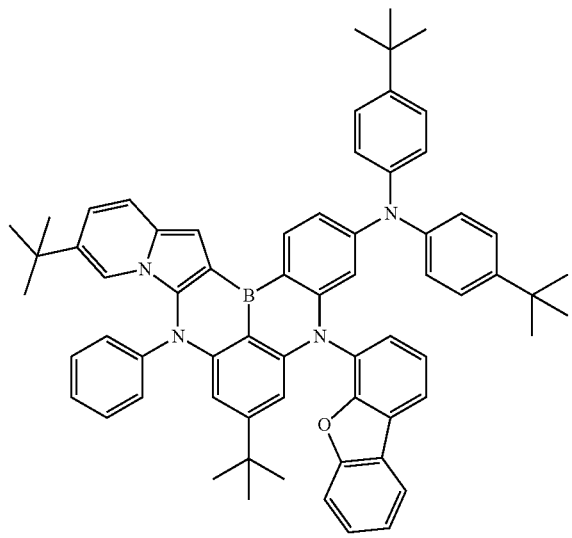
<Compound 64>
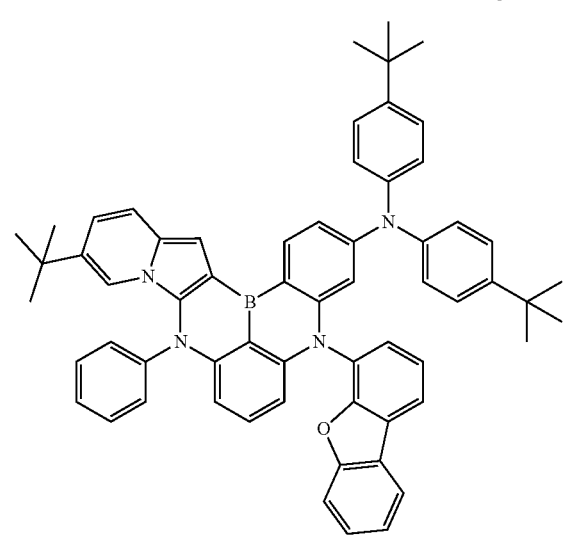
<Compound 65>
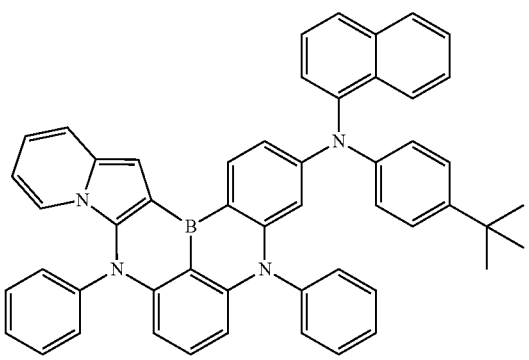

<Compound 66>
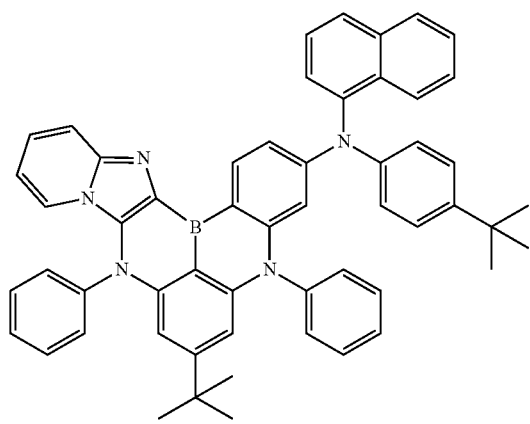
<Compound 67>
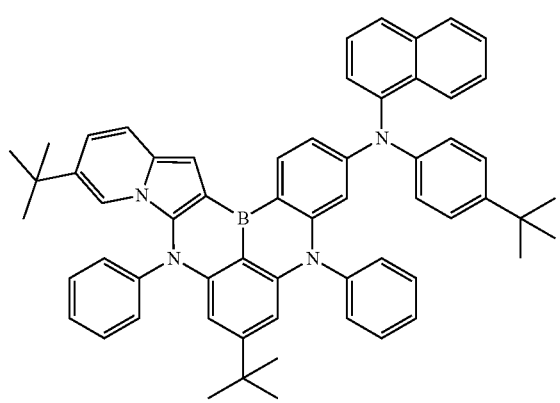
<Compound 68>
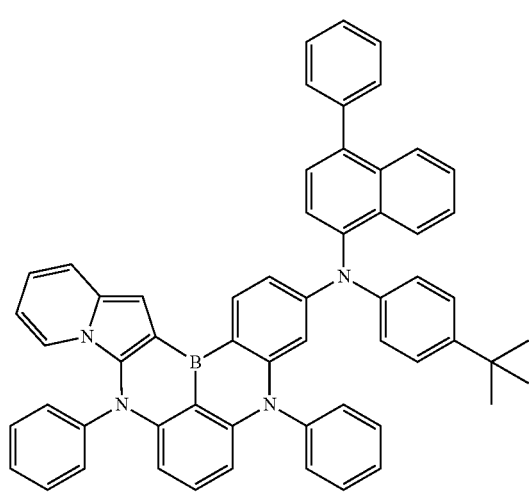
<Compound 69>
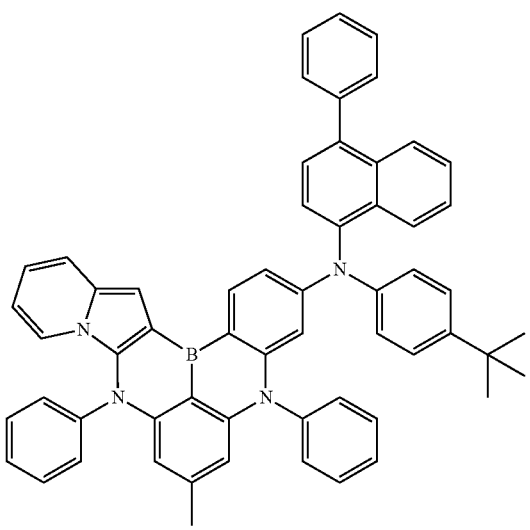
<Compound 70>
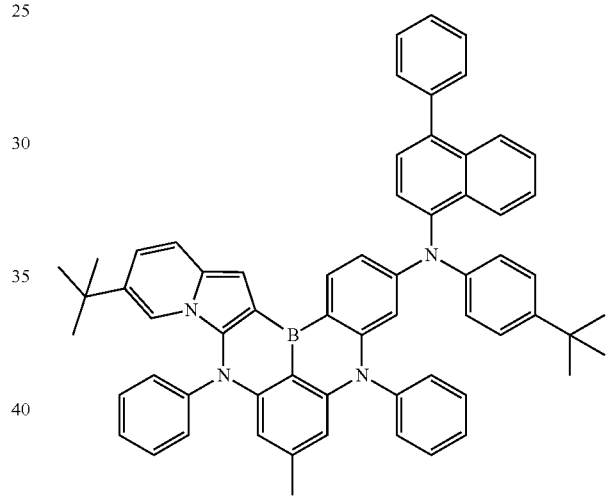
<Compound 71>
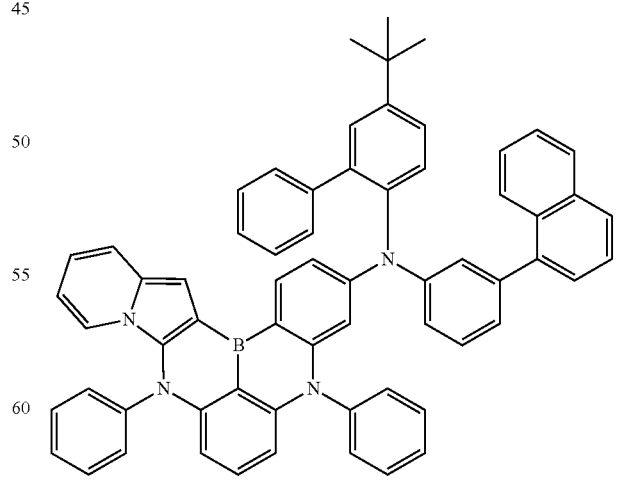

<Compound 72>
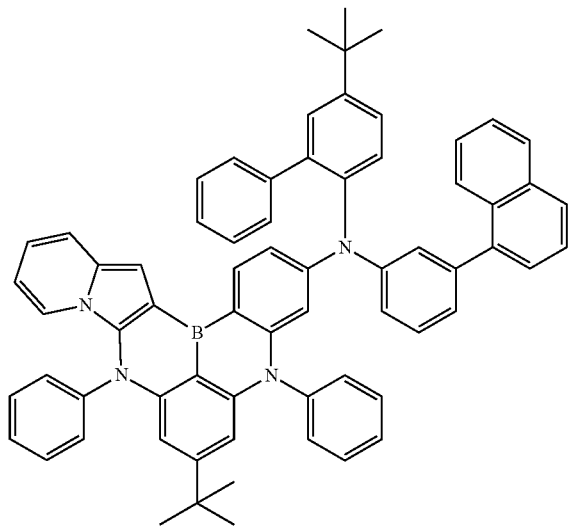
<Compound 73>
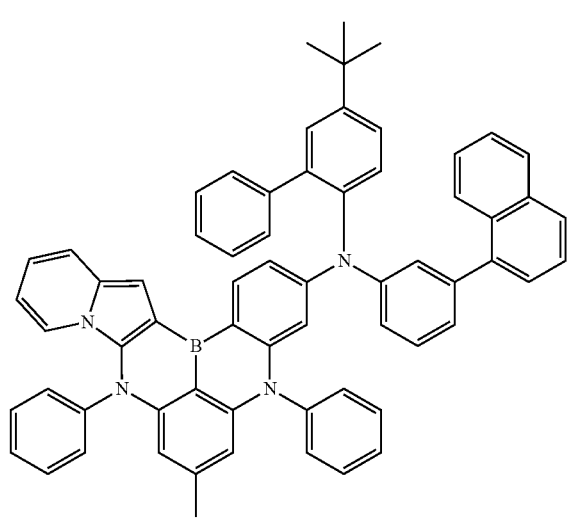
<Compound 74>
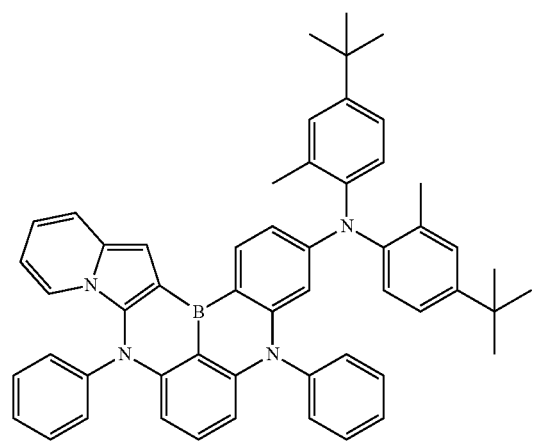
<Compound 75>
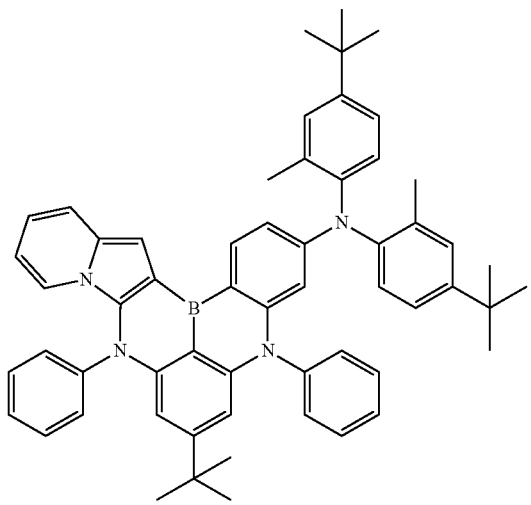
<Compound 76>
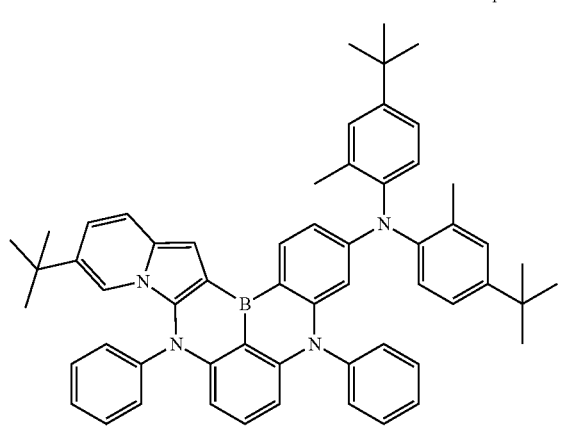
<Compound 77>
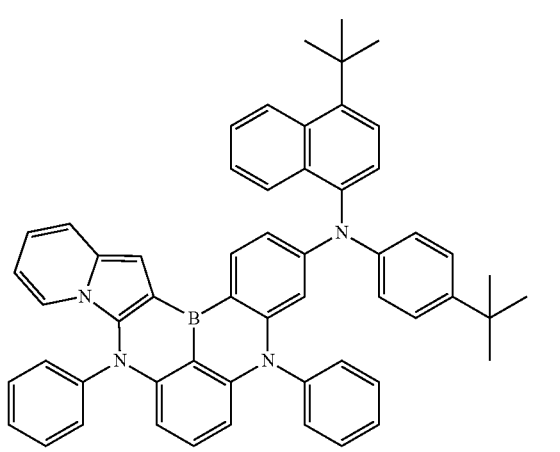

<Compound 78>
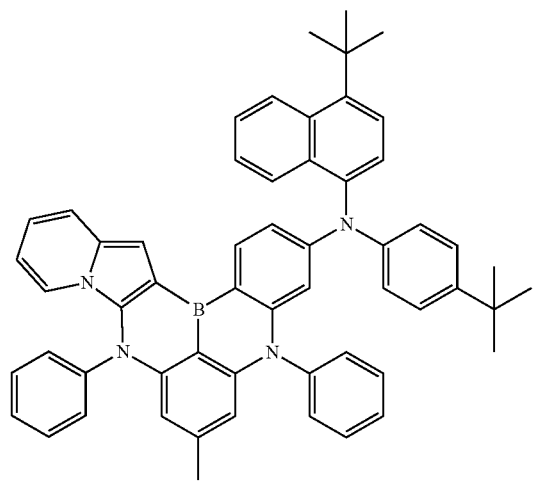
<Compound 81>
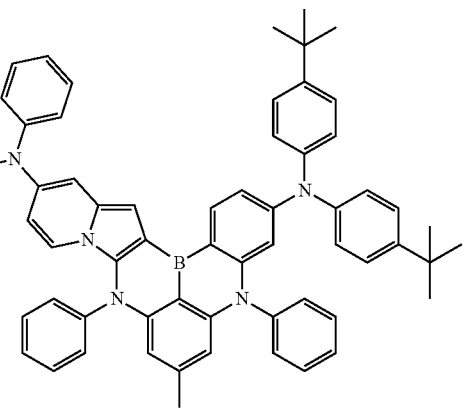
<Compound 79>
<Compound 82>
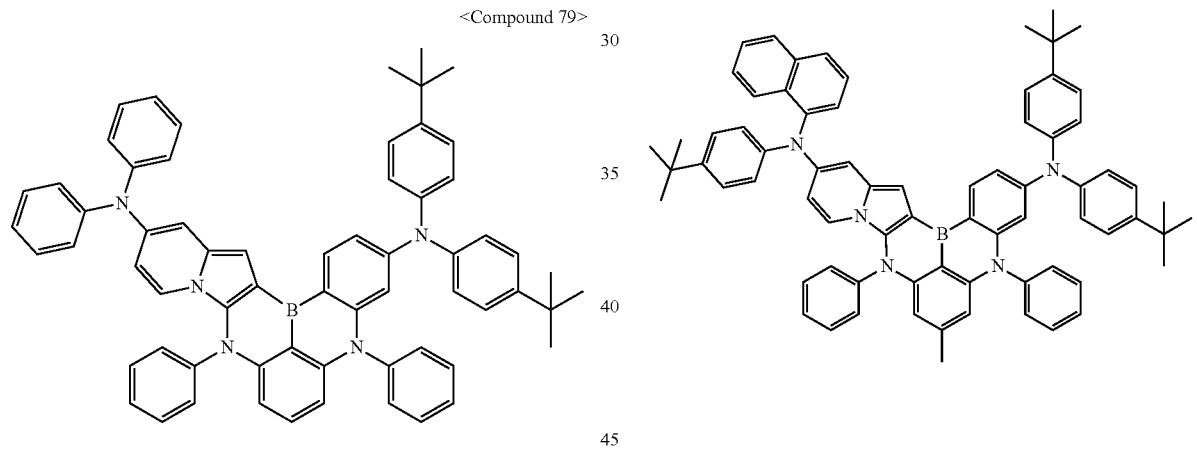
<Compound 80>
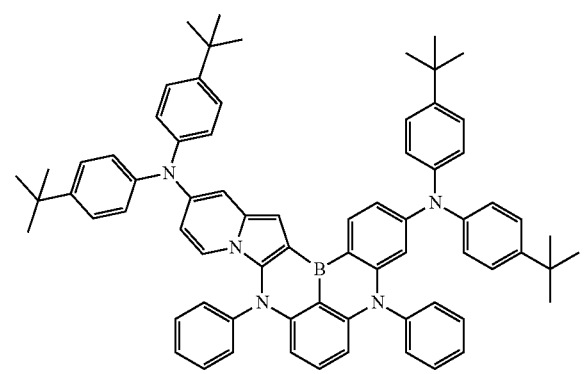
<Compound 83>
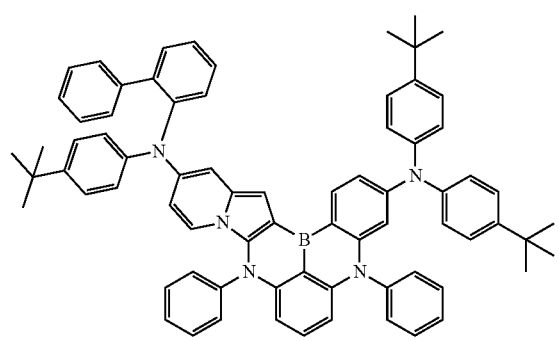

<Compound 84>
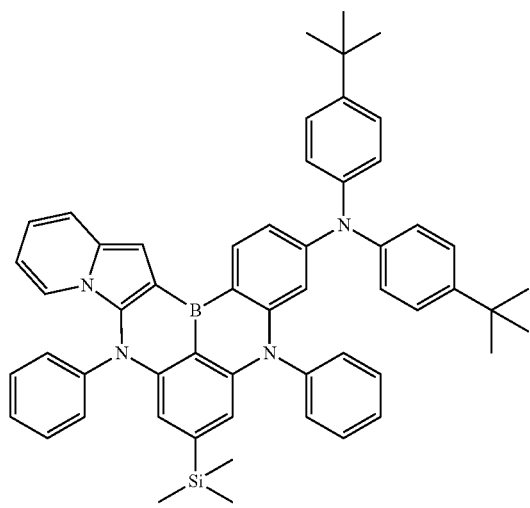
<Compound 85>
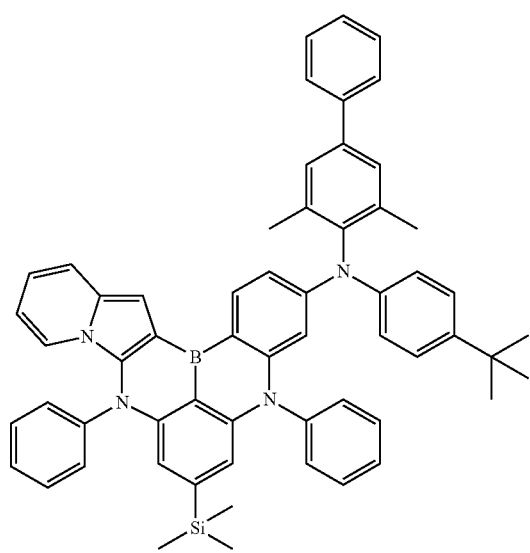
<Compound 86>
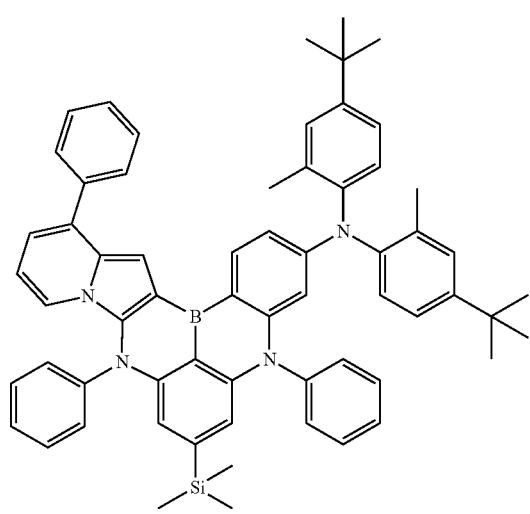
<Compound 87>
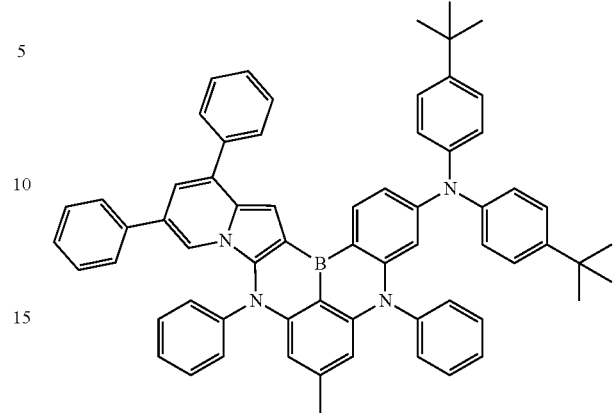
<Compound 88>
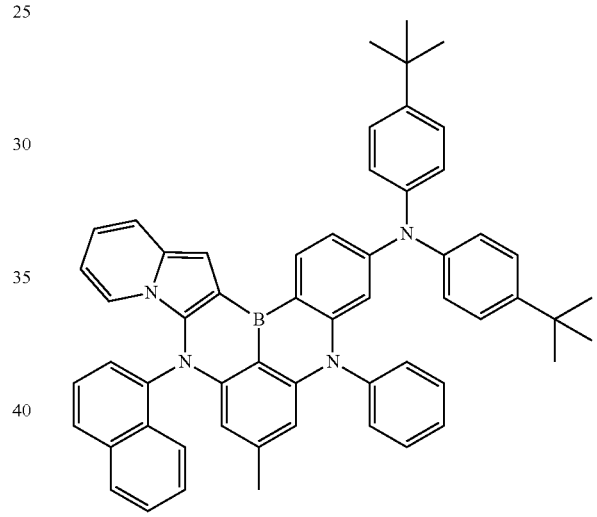
<Compound 89>
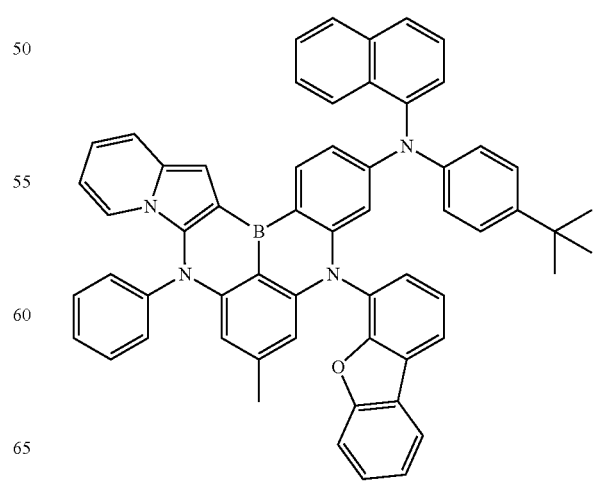

<Compound 90>
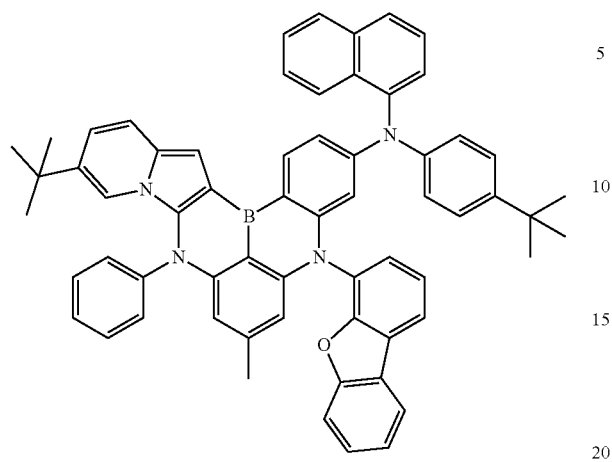
<Compound 91>
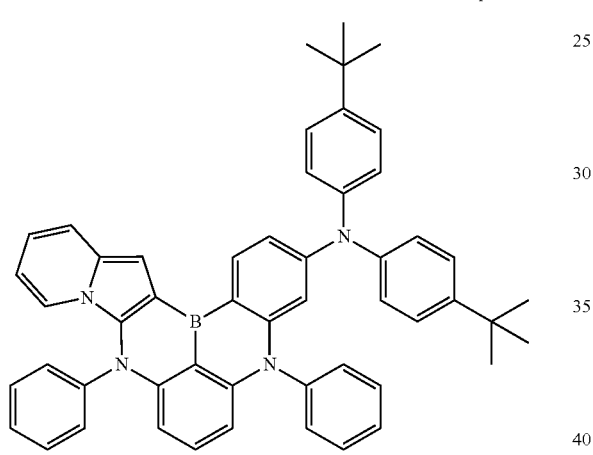
<Compound 92>
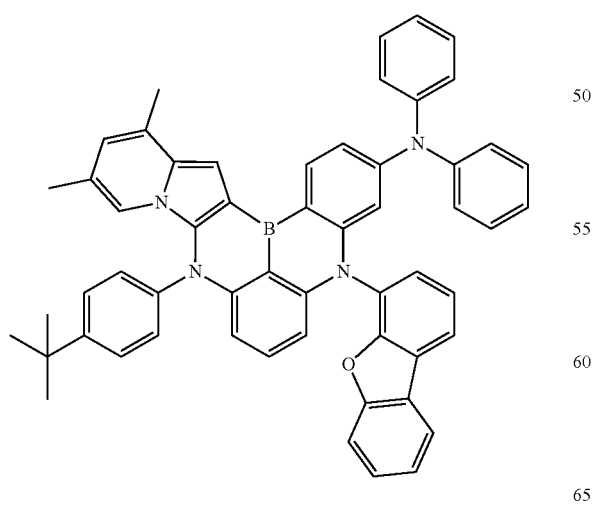
<Compound 93>
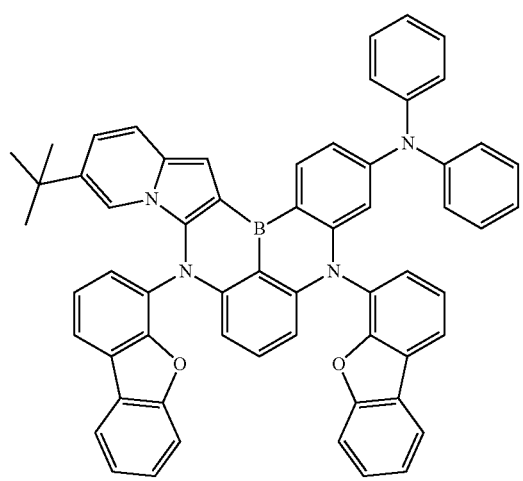
<Compound 94>
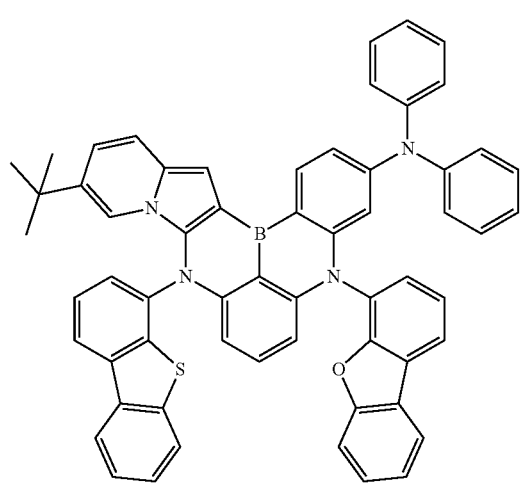
<Compound 95>
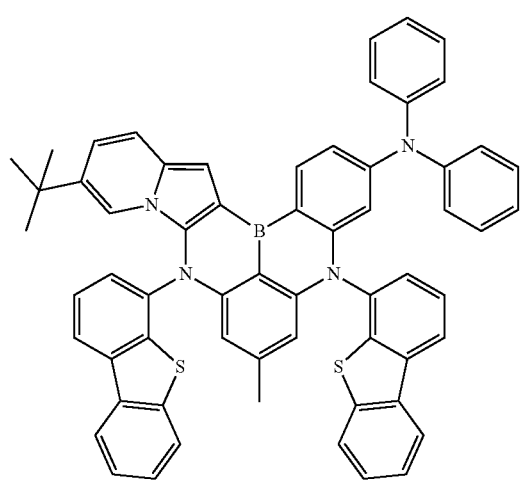

<Compound 96>
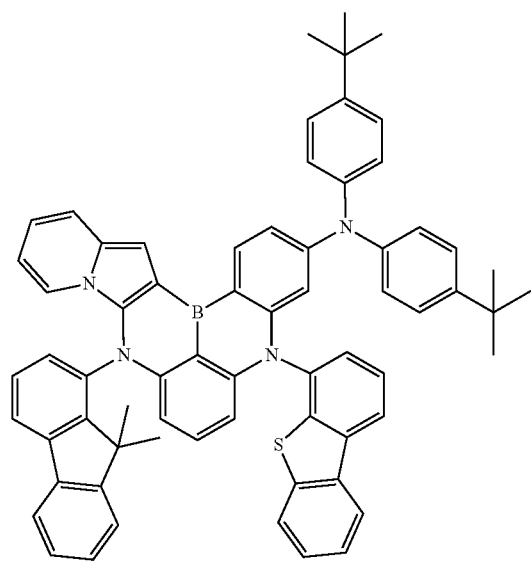
<Compound 97>
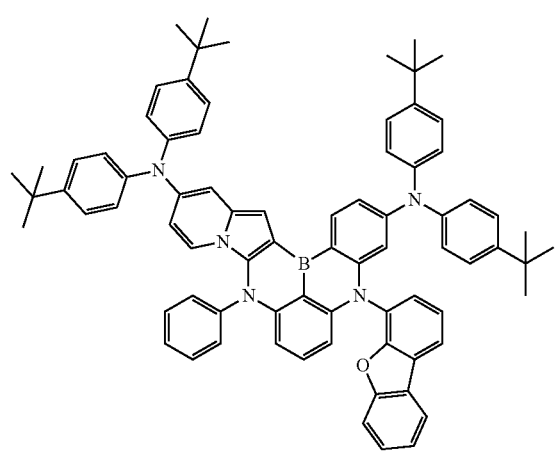
<Compound 98>
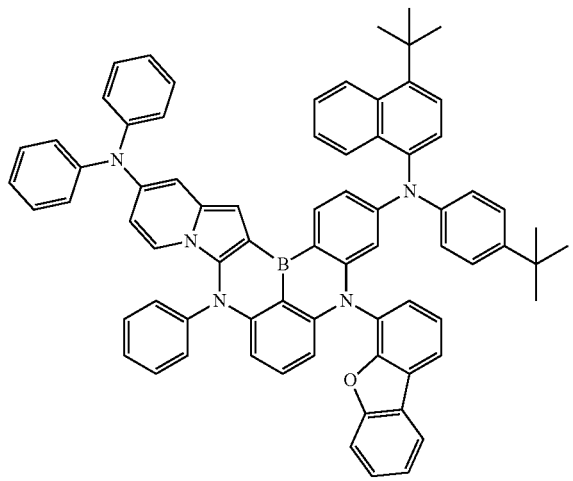
<Compound 99>
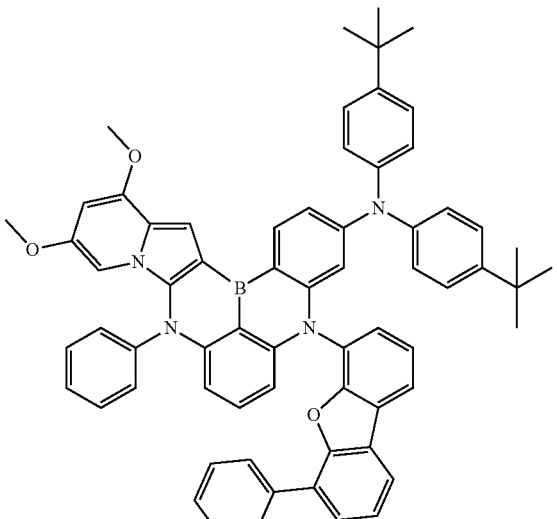
<Compound 100>
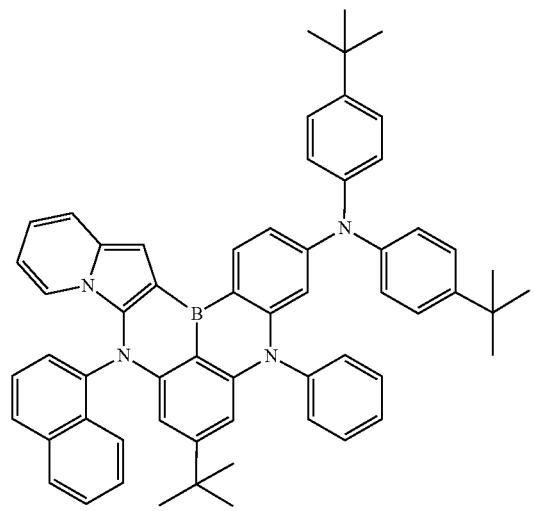
<Compound 101>
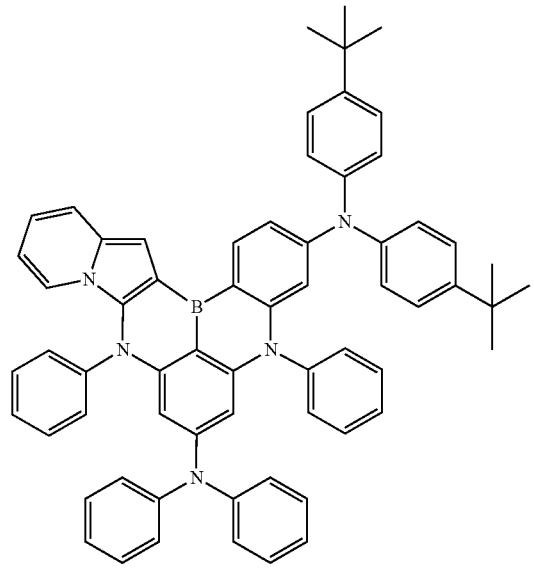

-continued
<Compound 102>
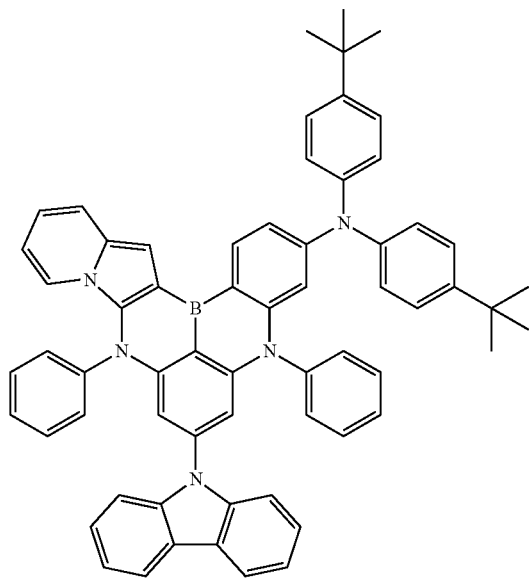
<Compound 103>
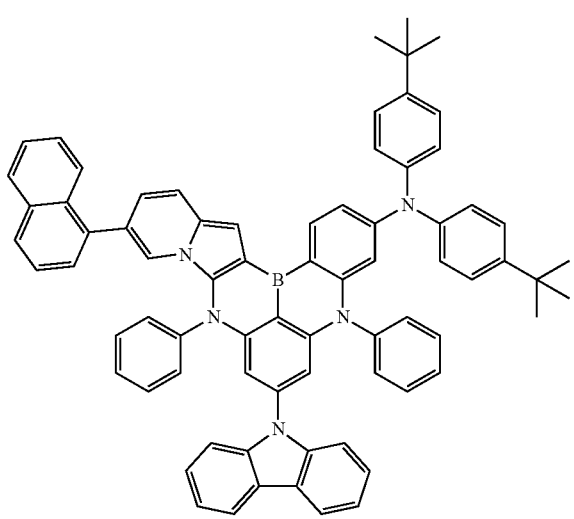
<Compound 104>
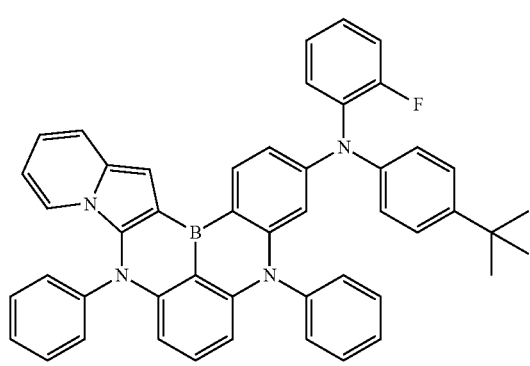
<Compound 105>
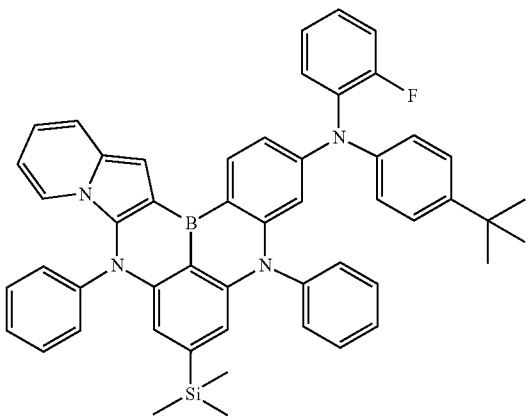
<Compound 106>
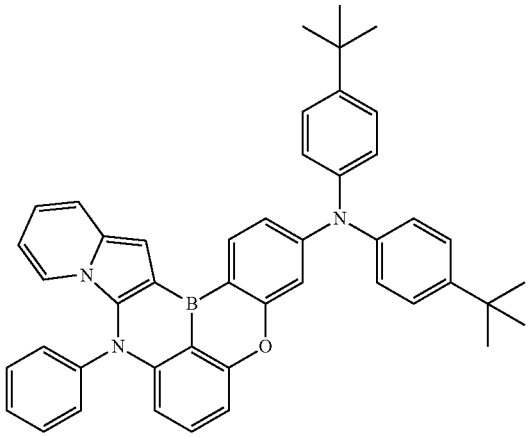
<Compound 107>
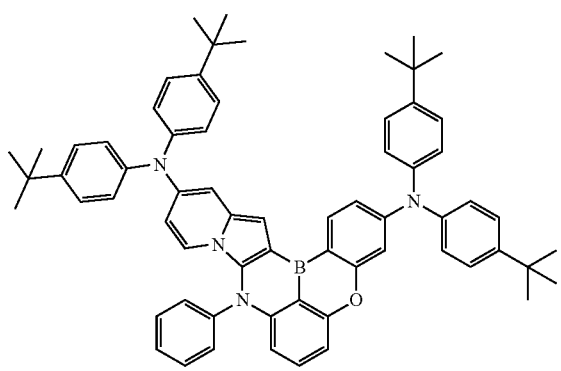

<Compound 108>
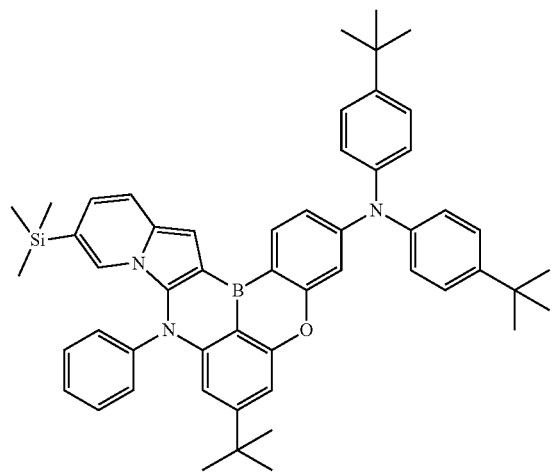
<Compound 109>
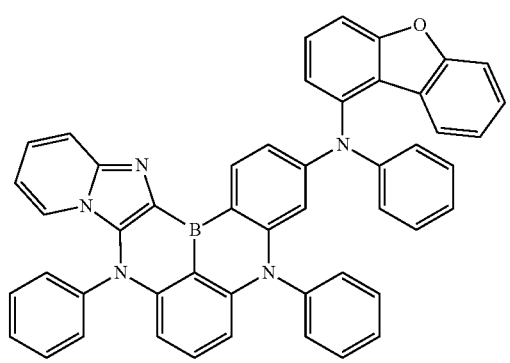
<Compound 110>
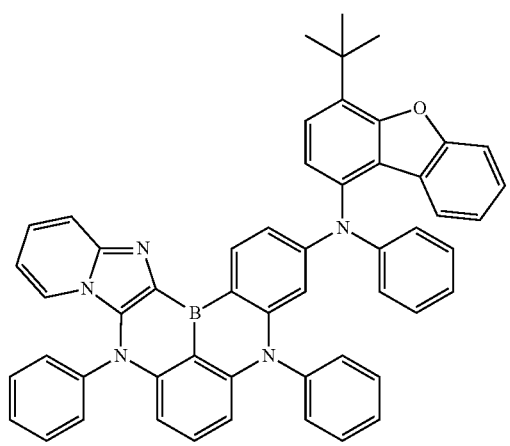
<Compound 111>
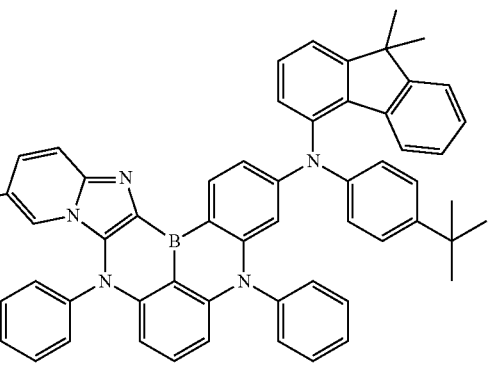
<Compound 112>
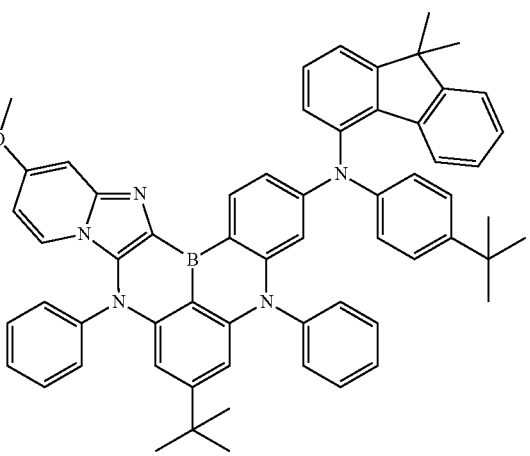
<Compound 113>
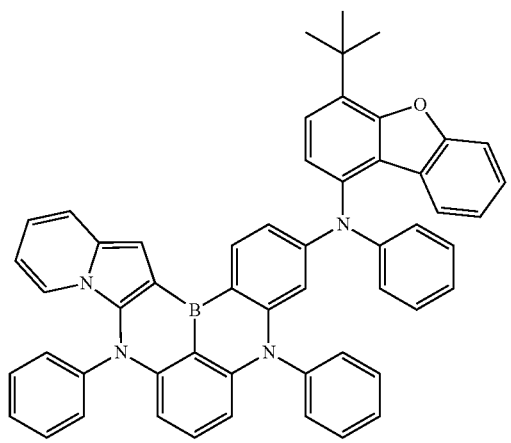

-continued
<Compound 114>
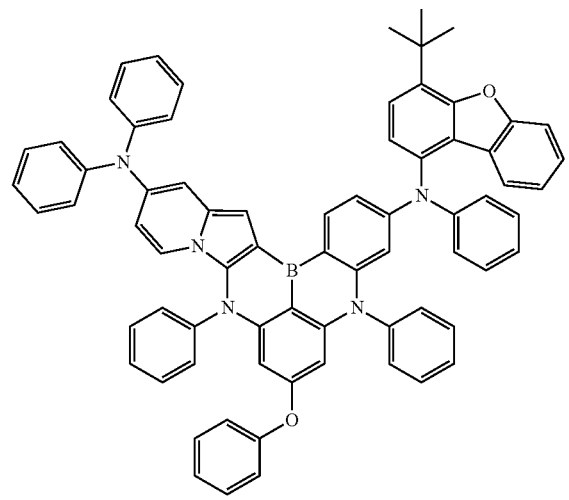
<Compound 115>
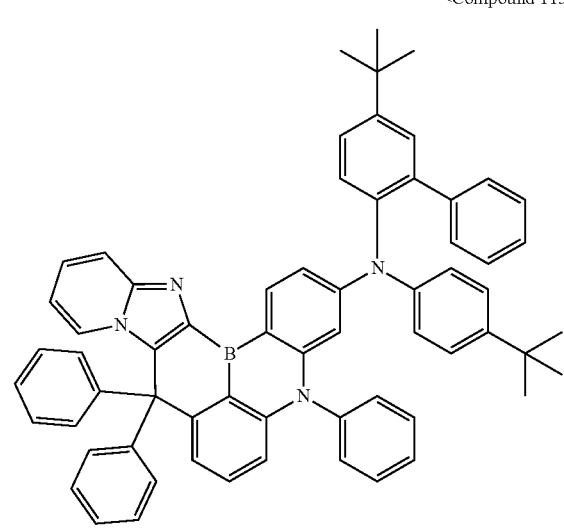
<Compound 116>
<Compound 117>
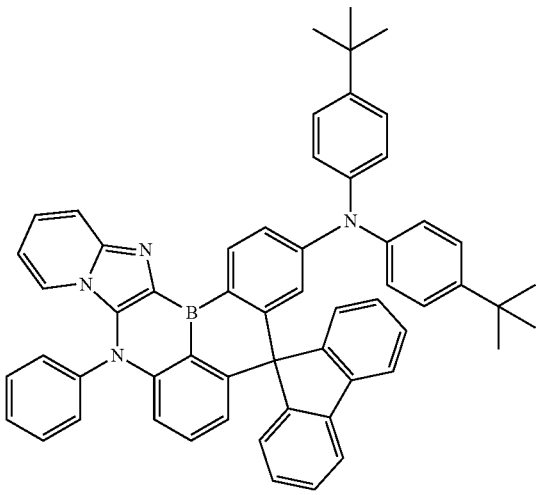
<Compound 118>
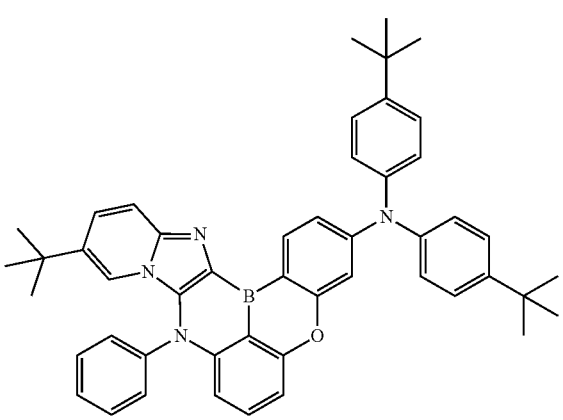
<Compound 119>
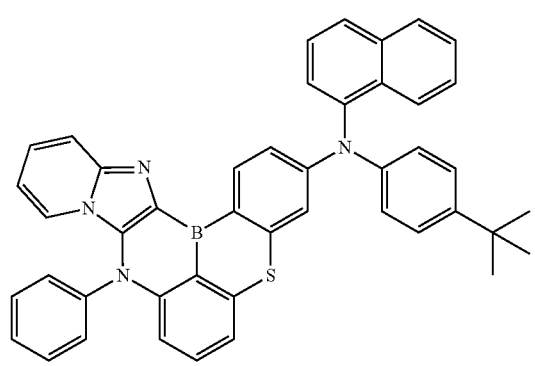

-continued
<Compound 120>
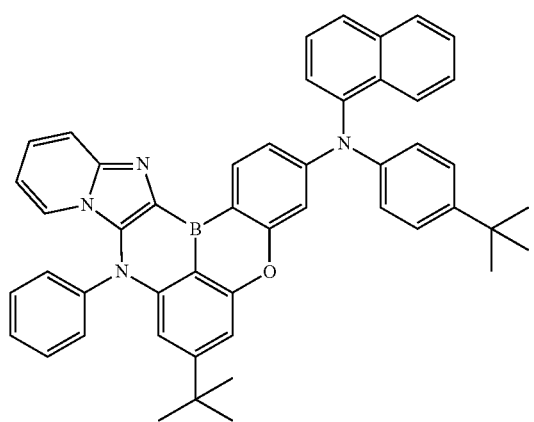
<Compound 121>
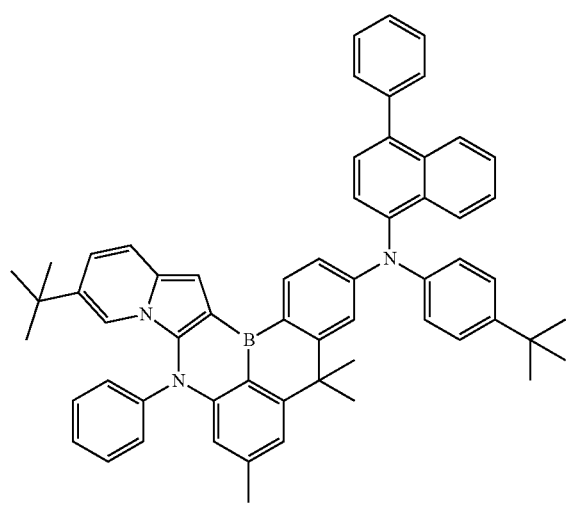
<Compound 122>
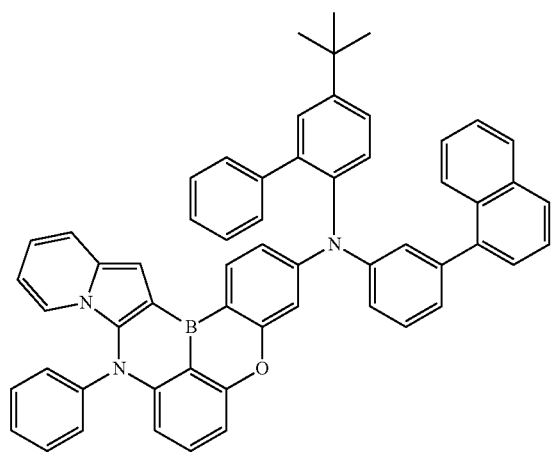
-continued
<Compound 123>
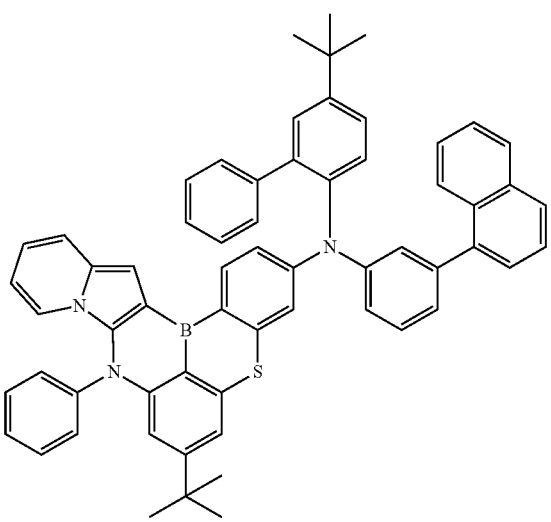
<Compound 124>
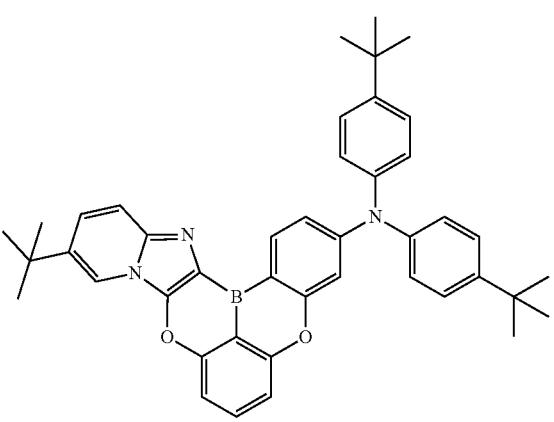
<Compound 125>
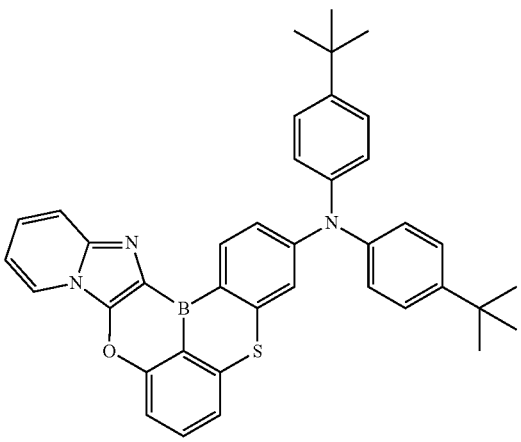

<Compound 126>
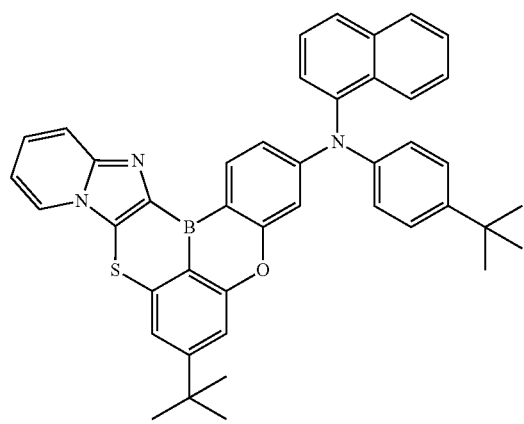

<Compound 127>
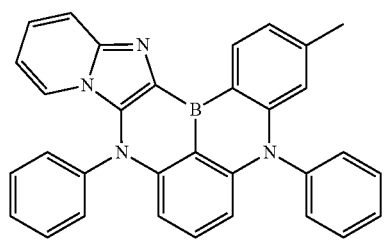

<Compound 128>
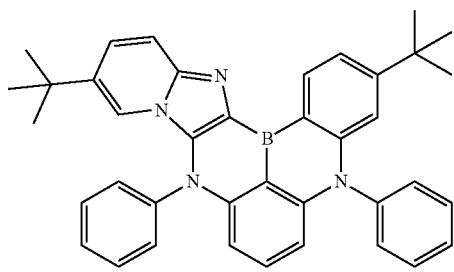

<Compound 129>
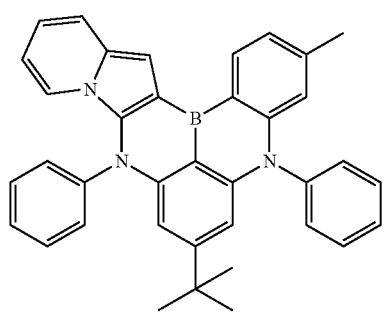

<Compound 130>
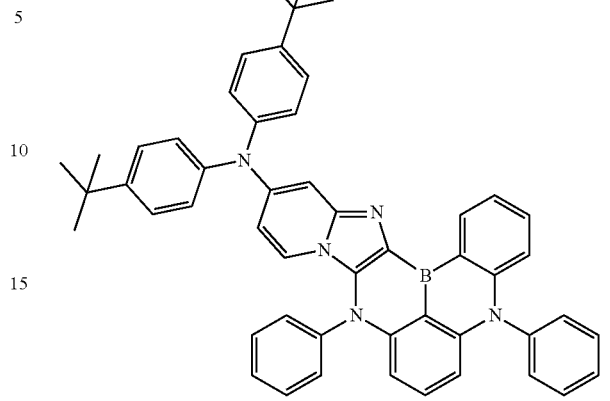

<Compound 131>
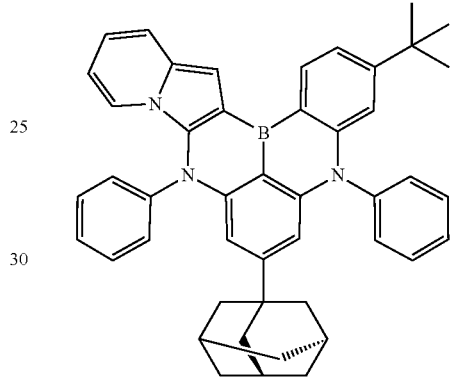

<Compound 132>
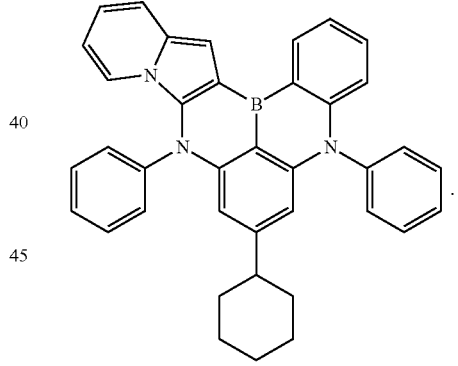

In particular some embodiments thereof, the present disclosure provides an organic light-emitting diode including: a first electrode; a second electrode facing the second electrode; and an organic layer interposed between the first electrode and the second electrode, wherein the organic layer includes a boron compound represented by Chemical Formula A.

Throughout the description of the present disclosure, the phrase "(an organic layer) includes at least one organic compound" may be construed to mean that "(an organic layer) may include a single organic compound species or two or more difference species of organic compounds falling within the scope of the present disclosure".

In this regard, the organic light-emitting diode according to the present disclosure may include at least one of a hole injection layer, a hole transport layer, a functional layer capable of both hole injection and hole transport, an electron blocking layer, an electron transport layer, an electron injection layer, and a capping layer in addition to a light-emitting layer.

In more particular embodiments of the present disclosure, the organic layer disposed between the first electrode and the second electrode includes a light-emitting layer composed of a host and a dopant, wherein the boron compound represented by Chemical Formula A serves as the dopant. In an embodiment, an anthracene derivative represented by the following Chemical Formula D may be used as a host in the organic light-emitting diode according to the present invention:

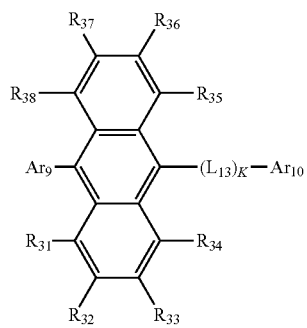

[Chemical Formula D]

wherein $R_{31}$ to $R_{38}$, which are same or different, are each as defined for $R_1$ to $R_{17}$ in the boron compound above;

$Ar_9$ and $Ar_{10}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, and a substituted or unsubstituted arylsilyl of 6 to 30 carbon atoms;

$L_{13}$, which functions as a linker, is a single bond or is selected from a substituted or unsubstituted arylene of 6 to 20 carbon atoms, and a substituted or unsubstituted heteroarylene of 2 to 20 carbon atoms; and k is an integer of 1 to 3, wherein when k is 2 or greater, the corresponding $L_{13}$'s are same or different, wherein the term "substituted" in the expression "substituted or unsubstituted" is as defined above.

In this case, $L_{13}$ may be a single bond or a substituted or unsubstituted arylene of 6 to 20 carbon atoms, and k may be 1 or 2, with the proviso that when k is 2, corresponding $L_{13}$'s may be same or different.

For a more exemplary host, $Ar_9$ in Chemical Formula D may be a substituent represented by the following Chemical Formula D-1:

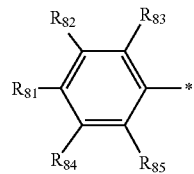

[Chemical Formula D-1]

wherein, $R_{81}$ to $R_{85}$, which may be same or different, are as defined for $R_1$ to $R_{17}$ above; and may each be linked to an adjacent one to form a saturated or unsaturated cyclic ring.

According to one embodiment, the anthracene derivative may be any one selected from the compounds represented by the following [Chemical Formula D1] to [Chemical Formula D51]:

<Chemical Formula D1>

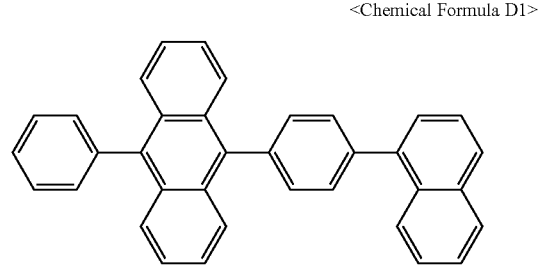

<Chemical Formula D2>

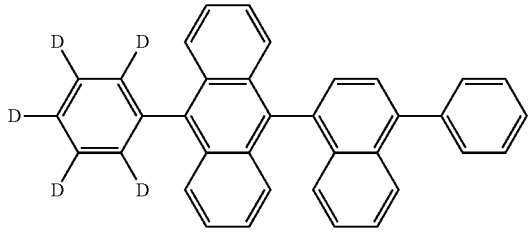

<Chemical Formula D3>

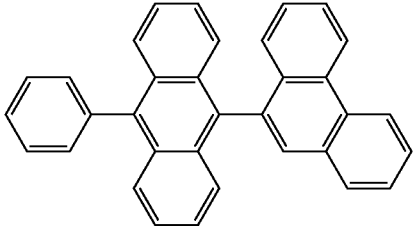

<Chemical Formula D4>

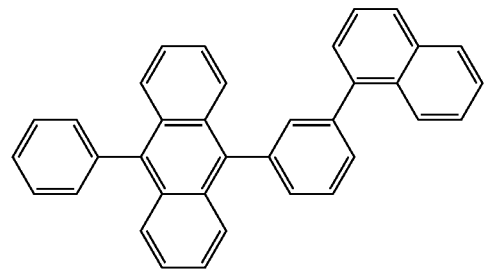

<Chemical Formula D5>
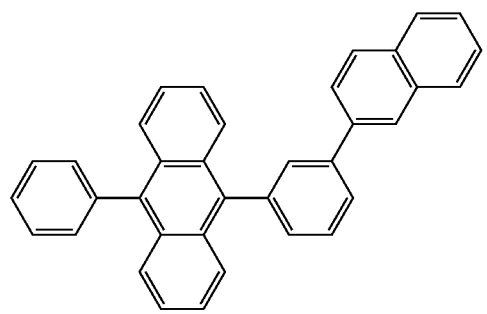
<Chemical Formula D6>
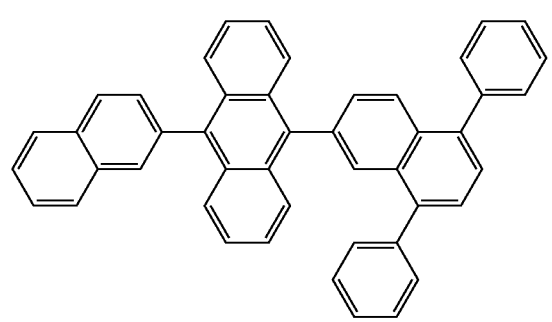
<Chemical Formula D7>
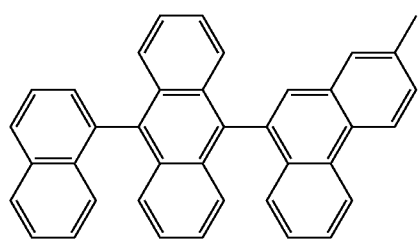
<Chemical Formula D8>
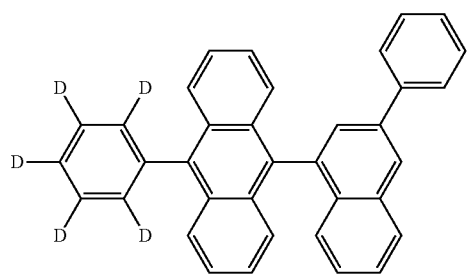
<Chemical Formula D9>
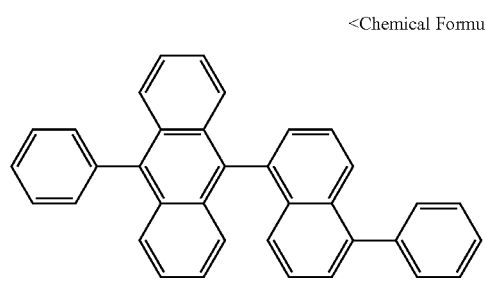
<Chemical Formula D10>
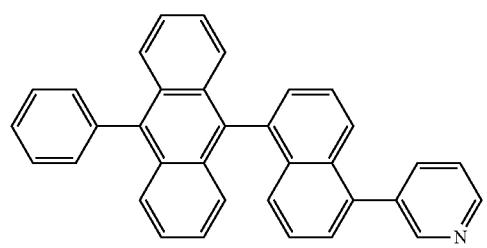
<Chemical Formula D11>
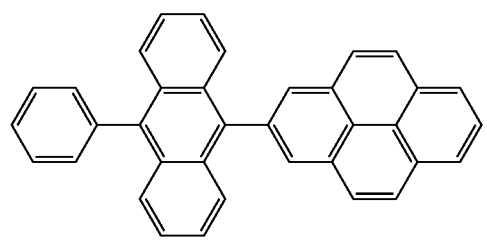
<Chemical Formula D12>
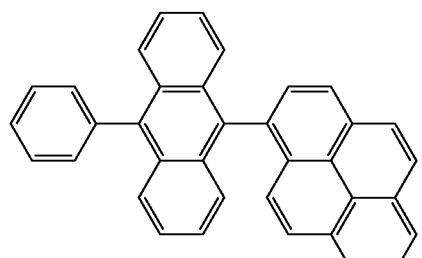
<Chemical Formula D13>
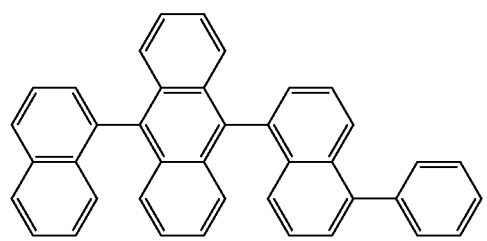
<Chemical Formula D14>
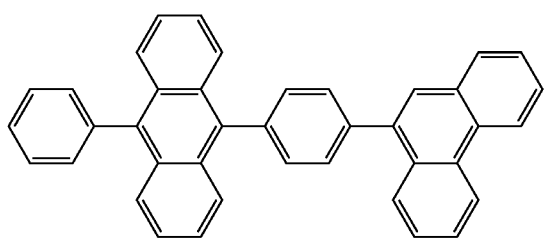

<Chemical Formula D15>
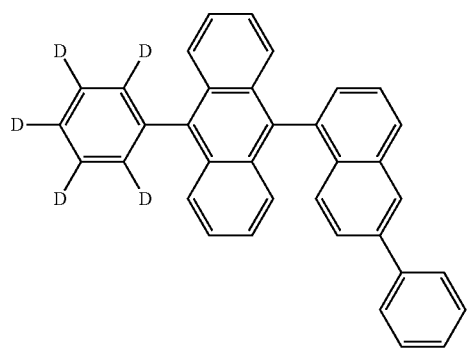
<Chemical Formula D16>
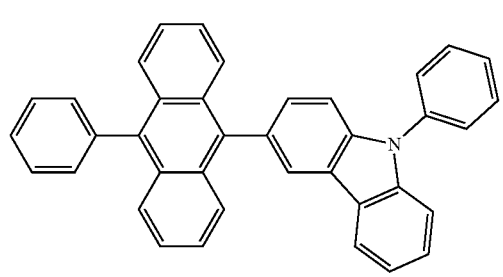
<Chemical Formula D17>
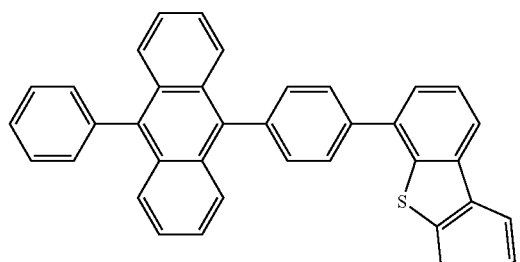
<Chemical Formula D18>
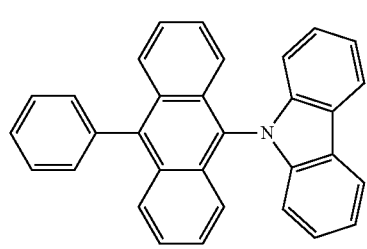
<Chemical Formula D19>
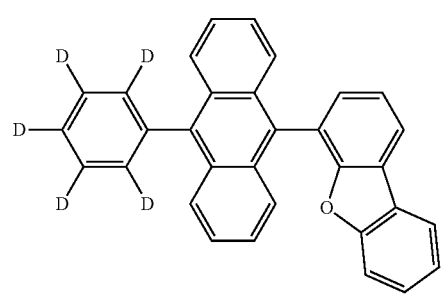
<Chemical Formula D20>
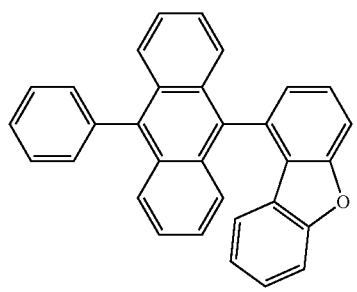
<Chemical Formula D21>
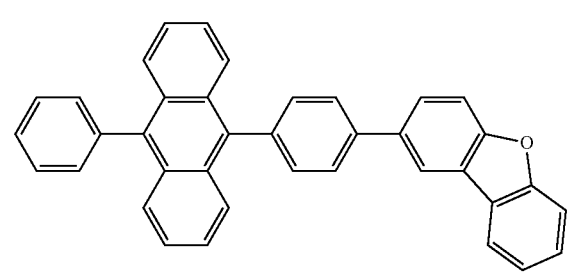
<Chemical Formula D22>
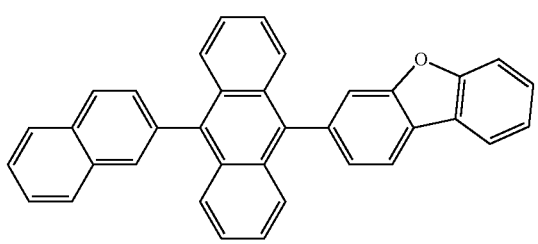
<Chemical Formula D23>
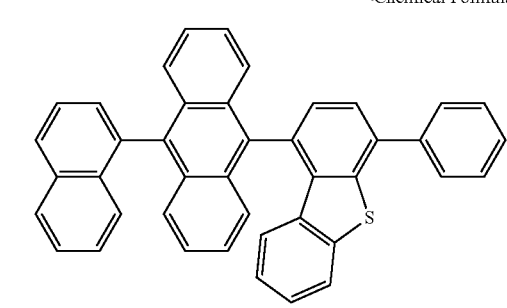
<Chemical Formula D24>
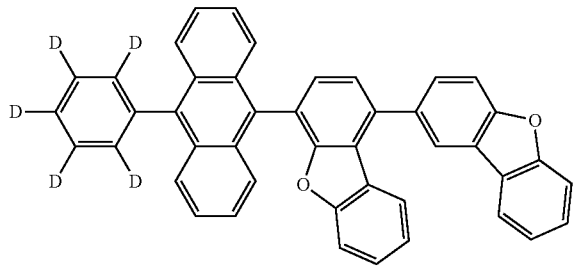

<Chemical Formula D25>
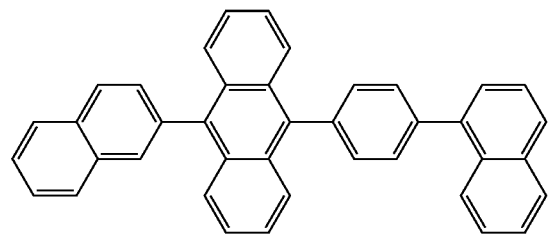
<Chemical Formula D26>
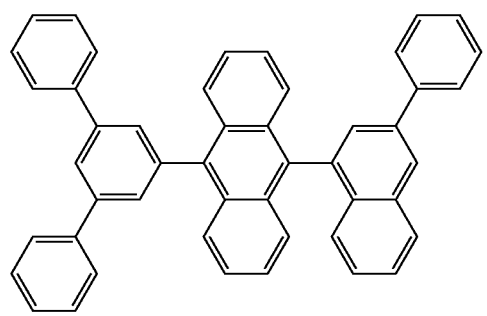
<Chemical Formula D27>
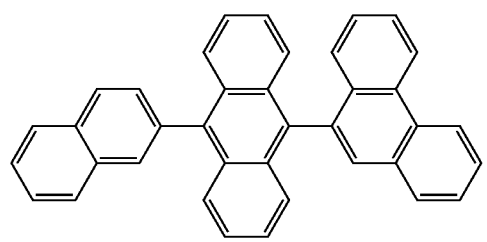
<Chemical Formula D28>
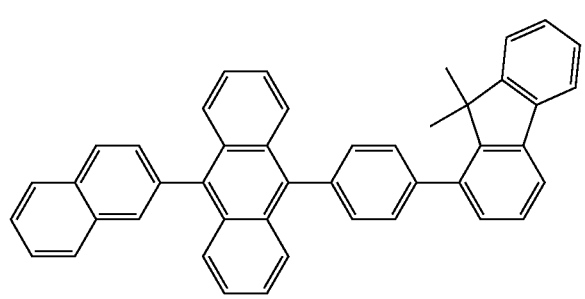
<Chemical Formula D29>
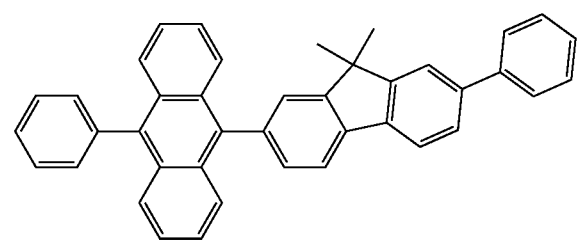
<Chemical Formula D30>
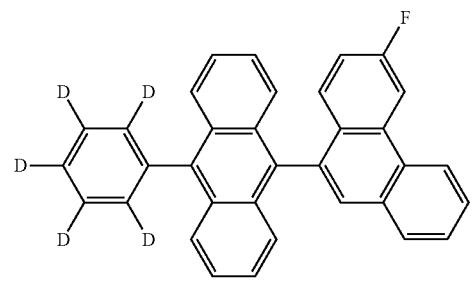
<Chemical Formula D31>
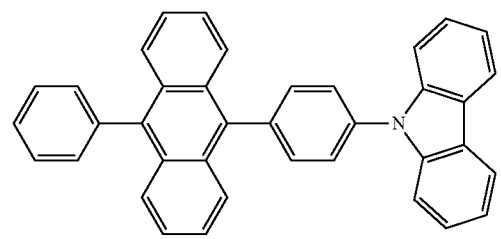
<Chemical Formula D32>
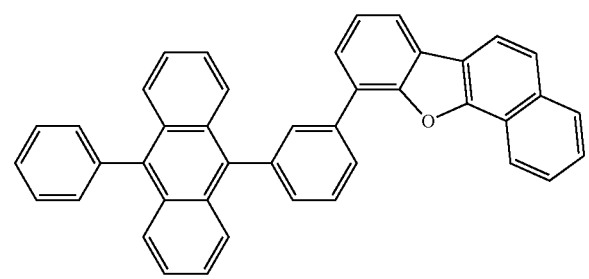
<Chemical Formula D33>
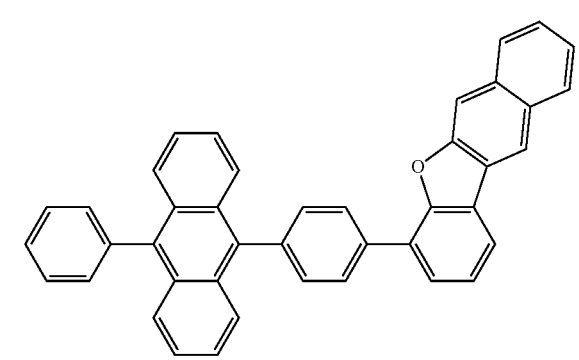
<Chemical Formula 34>
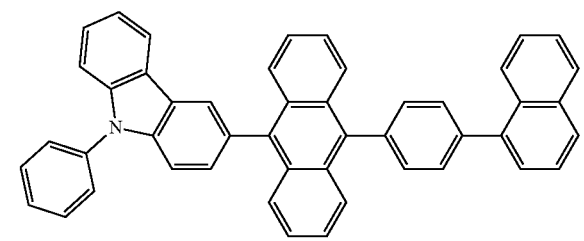

-continued
<Chemical Formula 35>
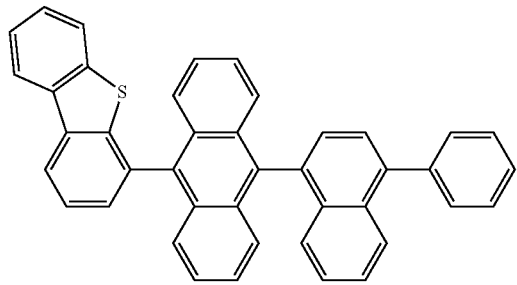
<Chemical Formula 36>
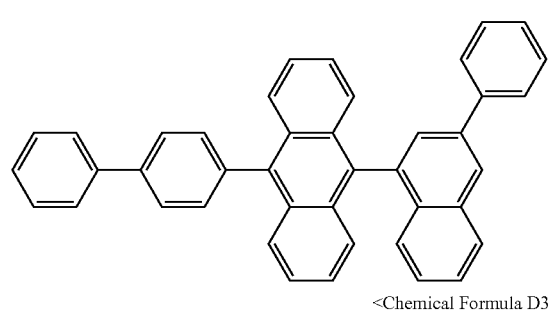
<Chemical Formula D37>
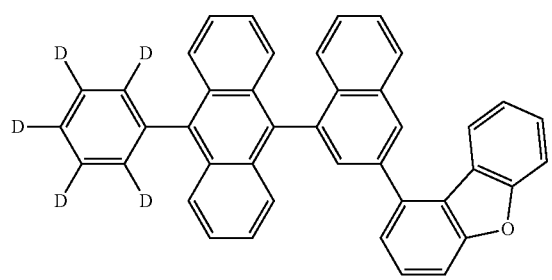
<Chemical Formula D38>
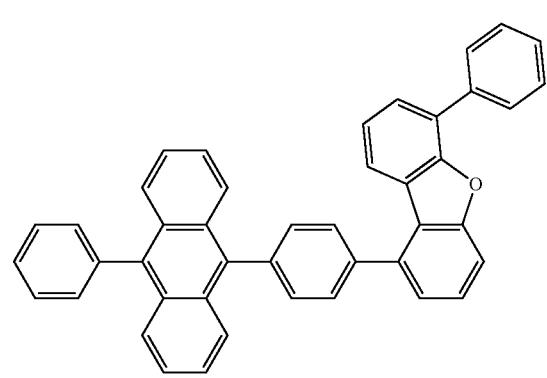
<Chemical Formula D39>
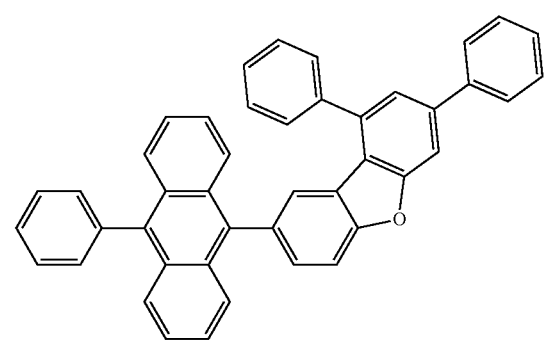
-continued
<Chemical Formula D40>
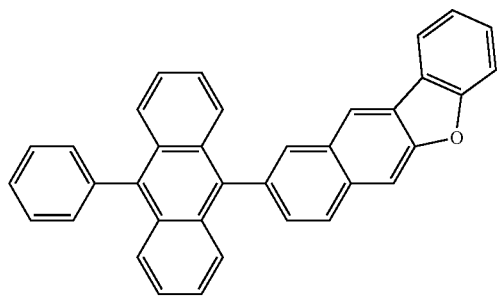
<Chemical Formula D41>
<Chemical Formula D42>
<Chemical Formula D43>

<Chemical Formula D44>
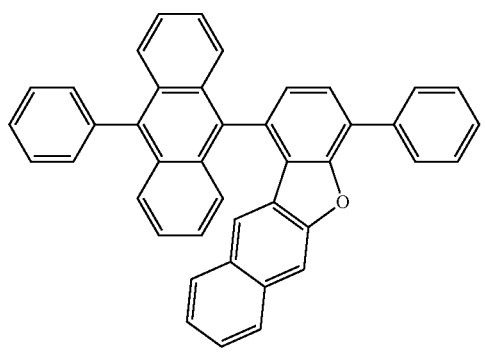

<Chemical Formula D45>
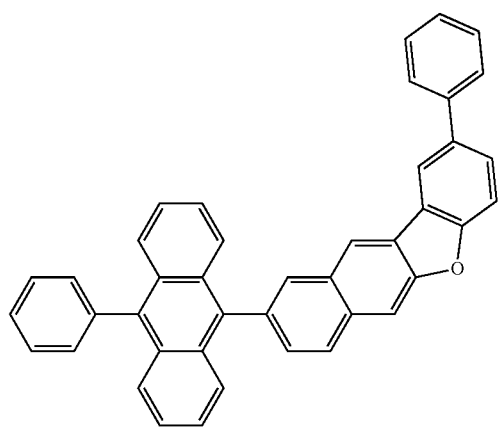

<Chemical Formula D46>
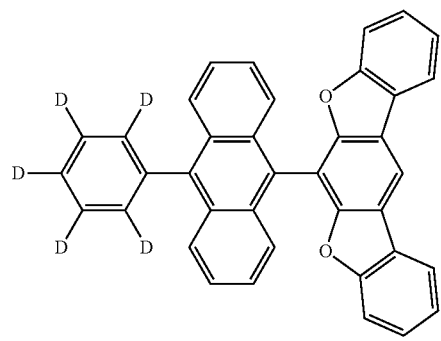

<Chemical Formula D47>
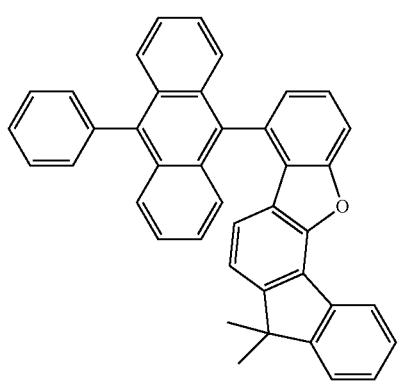

<Chemical Formula D48>
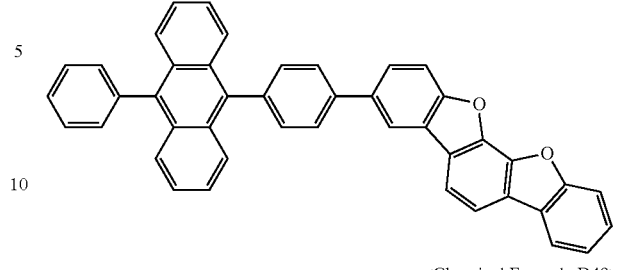

<Chemical Formula D49>
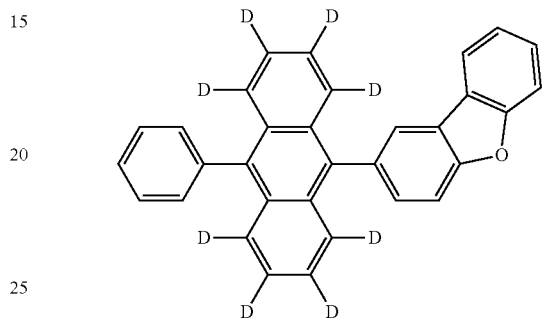

<Chemical Formula D50>
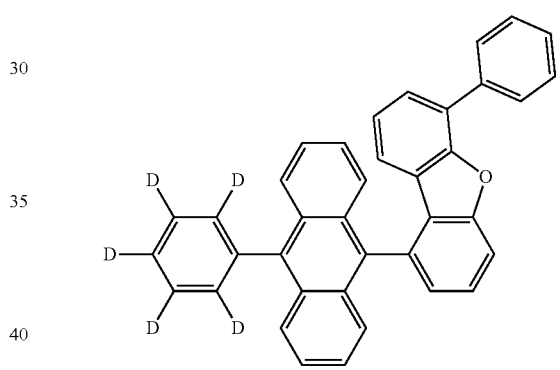

<Chemical Formula D51>
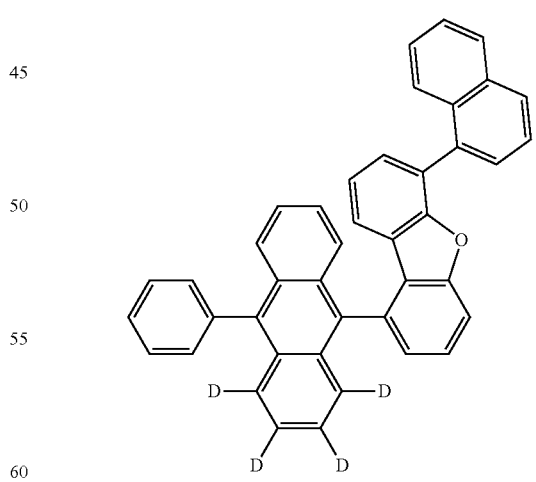

In a particular embodiment thereof, the present invention provides an organic light-emitting diode includes: an anode as a first electrode; a cathode as a second electrode facing the first electrode; and an organic layer interposed between the anode and the cathode, wherein the organic layer includes at least one of the boron compounds represented by Chemical Formula A as a dopant and at least one of the compounds represented by Chemical Formula D. Having such structural characteristics, the organic light-emitting diode according to the present disclosure can be driven at a low voltage with high luminous efficiency.

The content of the dopant in the light-emitting layer may range from about 0.01 to 20 parts by weight, based on 100 parts by weight of the host, but is not limited thereto.

In addition to the above-mentioned dopants and hosts, the light-emitting layer may further include various hosts and dopant materials.

Below, the organic light-emitting diode of the present disclosure is explained with reference to the drawing.

The Figure is a schematic cross-sectional view of the structure of an organic light- emitting diode according to an embodiment of the present disclosure.

As shown in the Figure, the organic light-emitting diode according to an embodiment of the present disclosure comprises an anode 20, a hole transport layer 40, an organic light-emitting layer 50 containing a host and a dopant, an electron transport layer 60, and a cathode 80, wherein the anode and the cathode serve as a first electrode and a second electrode, respectively, with the interposition of the hole transport layer between the anode and the light-emitting layer, and the electron transport layer between the light-emitting layer and the cathode.

Furthermore, the organic light-emitting diode according to an embodiment of the present disclosure may include a hole injection layer 30 between the anode 20 and the hole transport layer 40, and an electron injection layer 70 between the electron transport layer 60 and the cathode 80.

Reference is made to the Figure with regard to the organic light emitting diode of the present disclosure and the fabrication thereof.

First, a substrate 10 is coated with an anode electrode material to form an anode 20. So long as it is used in a typical organic electroluminescence device, any substrate may be used as the substrate 10. Preferable is an organic substrate or transparent plastic substrate that exhibits excellent transparency, surface smoothness, ease of handling, and waterproofness. As the anode electrode material, indium tin oxide (ITO), indium zinc oxide (IZO), tin oxide (SnO 2), or zinc oxide (ZnO), which are transparent and superior in terms of conductivity, may be used.

A hole injection layer material is applied on the anode 20 by thermal deposition in a vacuum or by spin coating to form a hole injection layer 30. Subsequently, thermal deposition in a vacuum or by spin coating may also be conducted to form a hole transport layer 40 with a hole transport layer material on the hole injection layer 30.

So long as it is typically used in the art, any material may be selected for the hole injection layer without particular limitations thereto. Examples include, but are not limited to, 2-TNATA [4,4',4''-tris(2-naphthylphenyl-phenylamino)-triphenylamine], NPD [N,N'-di(1-naphthyl)—N,N'-diphenylbenzidine)], TPD [N,N'-diphenyl-N,N'-bis(3-methylphenyl)-1,1'-biphenyl-4,4'-diamine], DNTPD [N,N'-diphenyl-N,N'-bis-[4-(phenyl-m-tolyl-amino)-phenyl]-biphenyl-4,4'-diamine], and HAT-CN (2,3,6,7,10,11-hexacyanohexaazatriphenylene).

any material that is typically used in the art may be selected for the hole transport layer without particular limitations thereto. Examples include, but are not limited to, N,N'-bis(3-methylphenyl)-N,N'-diphenyl-[1,1-biphenyl]-4,4'-diamine (TPD) and N,N'-di(naphthalen-1-yl)—N,N'-diphenylbenzidine (a-NPD).

In an embodiment of the present disclosure, an electron blocking layer may be additionally disposed on the hole transport layer. Functioning to prevent the electrons injected from the electron injection layer from entering the hole transport layer from the light-emitting layer, the electron blocking layer is adapted to increase the life span and luminous efficiency of the diode. The electron blocking layer may be formed of a well-known material or a combination of well-known materials, as necessary, at a suitable position between the light emitting layer and the hole injection layer. Particularly, the electron blocking layer may be formed between the light-emitting layer and the hole transport layer.

Next, the light-emitting layer 50 may be deposited on the hole transport layer 40 or the electron blocking layer by deposition in a vacuum or by spin coating.

Herein, the light-emitting layer may contain a host and a dopant and the materials are as described above.

In some embodiments of the present disclosure, the light-emitting layer particularly ranges in thickness from 50 to 2,000 Å.

Meanwhile, the electron transport layer 60 is applied on the light-emitting layer by deposition in a vacuum and spin coating.

A material for use in the electron transport layer functions to stably carry the electrons injected from the electron injection electrode (cathode), and may be an electron transport material known in the art. Examples of the electron transport material known in the art include quinoline derivatives, particularly, tris(8-quinolinolate)aluminum (Alq$_3$), Liq, TAZ, BAlq, beryllium bis(benzoquinolin-10-olate) (Bebq$_2$), Compound 201, Compound 202, BCP, and oxadiazole derivatives such as PBD, BMD, and BND, but are not limited thereto:

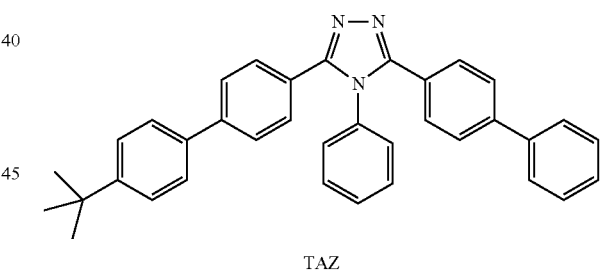

TAZ

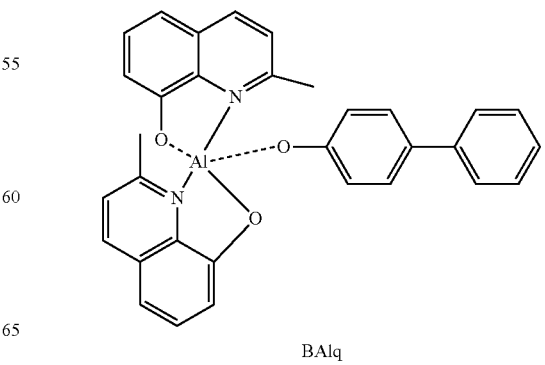

BAlq

<Compound 201>

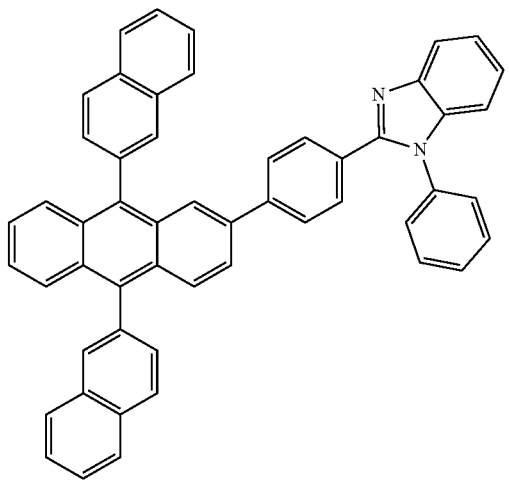

<Compound 202>

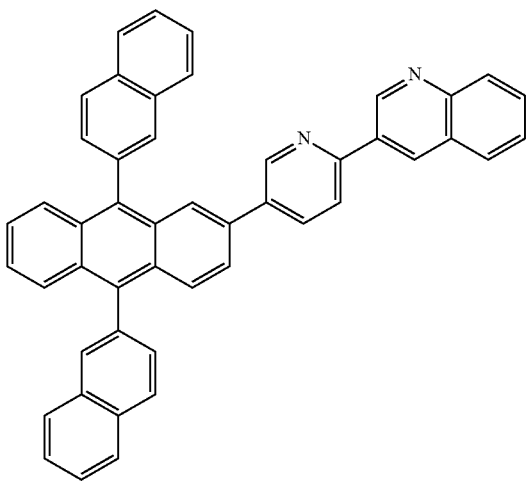

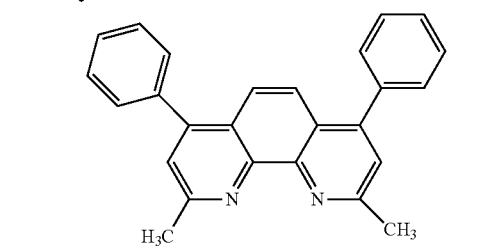

BCP

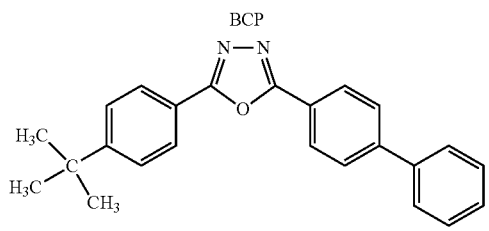

PBD

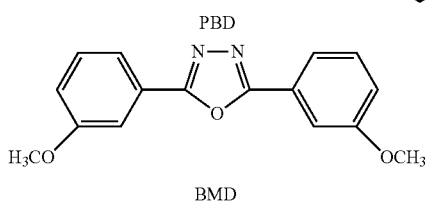

BMD

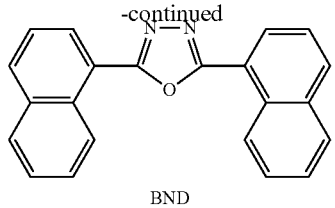

BND

In the organic light emitting diode of the present disclosure, an electron injection layer (EIL) that functions to facilitate electron injection from the cathode may be deposited on the electron transport layer. The material for the EIL is not particularly limited.

Any material that is conventionally used in the art can be available for the electron injection layer without particular limitations. Examples include CsF, NaF, LiF, $Li_2O$, and BaO. Deposition conditions for the electron injection layer may vary, depending on compounds used, but may be generally selected from condition scopes that are almost the same as for the formation of hole injection layers.

The electron injection layer may range in thickness from about 1 Å to about 100 Å, and particularly from about 3 Å to about 90 Å. Given the thickness range for the electron injection layer, the diode can exhibit satisfactory electron injection properties without actually elevating a driving voltage.

In order to facilitate electron injection, the cathode may be made of a material having a small work function, such as metal or metal alloy such as lithium (Li), magnesium (Mg), calcium (Ca), an alloy aluminum (Al) thereof, aluminum-lithium (Al—Li), magnesium-indium (Mg—In), and magnesium-silver (Mg—Ag). Alternatively, ITO or IZO may be employed to form a transparent cathode for an organic light-emitting diode.

Moreover, the organic light-emitting diode of the present disclosure may further comprise a light-emitting layer containing a blue, green, or red luminescent material that emits radiations in the wavelength range of 380 nm to 800 nm. That is, the light-emitting layer in the present disclosure has a multi-layer structure wherein the blue, green, or red luminescent material may be a fluorescent material or a phosphorescent material.

Furthermore, at least one selected from among the layers may be deposited using a single-molecule deposition process or a solution process.

Here, the deposition process is a process by which a material is vaporized in a vacuum or at a low pressure and deposited to form a layer, and the solution process is a method in which a material is dissolved in a solvent and applied for the formation of a thin film by means of inkjet printing, roll-to-roll coating, screen printing, spray coating, dip coating, spin coating, etc.

Also, the organic light-emitting diode of the present disclosure may be applied to a device selected from among flat display devices, flexible display devices, monochrome or grayscale flat illumination devices, and monochrome or grayscale flexible illumination devices.

A better understanding of the present disclosure may be obtained through the following examples which are set forth to illustrate, but are not to be construed as limiting the present invention.

EXAMPLES

Synthesis Example 1. Synthesis of Compound 1

Synthesis Example 1-(1): Synthesis of Intermediate 1-a

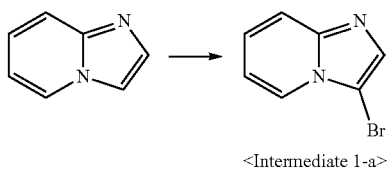 [SMILES: c1ccn2ccnc2c1 ; Brc1cnc2ccccn12]
<Intermediate 1-a>

In a round-bottom flask, imidazopyridine (50 g, 423 mmol), N-bromosuccinimide (75.3 g, 423 mmol), and dimethylformamide (500 ml) were stirred together at room temperature for 12 hours under a nitrogen atmosphere. After completion of the reaction, the reaction mixture was subjected to layer separation. The organic layer thus formed was concentrated in a vacuum, followed by purification through column chromatography to afford <Intermediate 1-a> (67 g, yield 81%)

Synthesis Example 1-(2): Synthesis of Intermediate 1-b

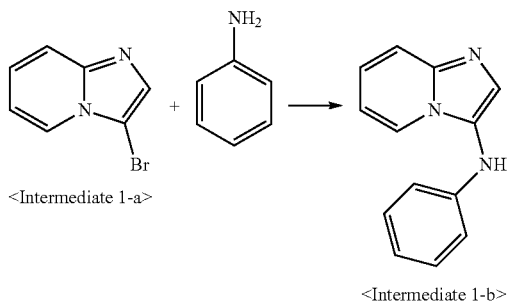
<Intermediate 1-a>
<Intermediate 1-b>

In a round-bottom flask <Intermediate 1-a> (67 g, 340 mmol), aniline 41.2 g (442 mmol), tris(dibenzylideneacetone)dipalladium 6.2 g (6.8 mmol), sodium tert-butoxide (65.3 g, 680 mmol), 2,2'-bis(diphenylphosphino)-1,1'-binaphthyl (8.5 g, 13.6 mmol), and toluene (700 ml) were refluxed together for 12 hours. After completion of the reaction, the reaction mixture was subjected to layer separation. The organic layer thus formed was concentrated in a vacuum, followed by purification through column chromatography to afford <Intermediate 1-b> (52.6 g, yield 74%)

Synthesis Example 1-(3): Synthesis of Intermediate 1-c

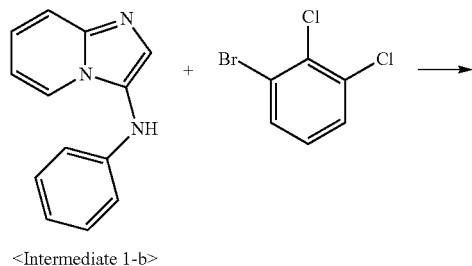
<Intermediate 1-b>

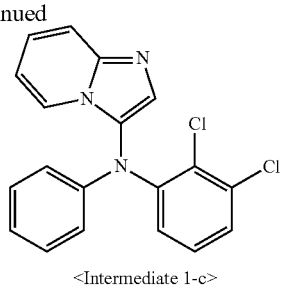
<Intermediate 1-c>

In a round-bottom flask <Intermediate 1-b> (52.6 g, 251 mmol), 1-bromo-2,3-dichlorobenzene (56.8 g, 251 mmol), tris(dibenzylideneacetone)dipalladium (4.6 g, 5.0 mmol), sodium tert-butoxide (48.3 g, 502 mmol), tri-tert-butyl phosphine (4.9 g, 10.0 mmol), and toluene (500 ml) were refluxed together for 12 hours. After completion of the reaction, the reaction mixture was subjected to layer separation. The organic layer thus formed was concentrated in a vacuum, followed by purification through column chromatography to afford <Intermediate 1-c> (61.3 g, yield 48%).

Synthesis Example 1-(4): Synthesis of Intermediate 1-d

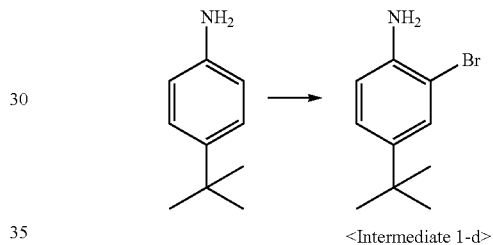
<Intermediate 1-d>

The same procedure as in Synthesis Example 1-(1) was carried out, with the exception of using 4-tert-butylaniline instead of imidazopyridine, to afford <Intermediate 1-d>. (yield 75%)

Synthesis Example 1-(5): Synthesis of Intermediate 1-e

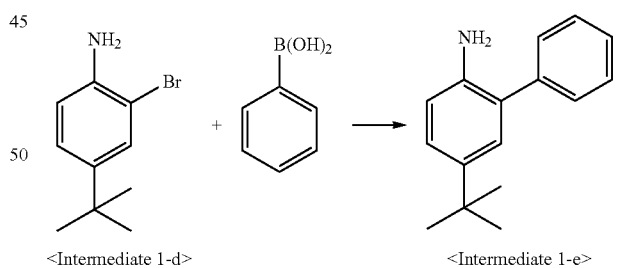
<Intermediate 1-d>
<Intermediate 1-e>

In a round-bottom flask, <Intermediate 1-d> (30 g, 131 mmol), phenyl boronic acid (19.2 g, 157 mmol), tetrakis (triphenylphosphine)palladium (3.0 g, 2.6 mmol), potassium carbonate (27.2 g, 197 mmol), toluene (150 ml), 1,4-dioxane (150 ml), and water (90 ml) were refluxed together for 12 hours under a nitrogen atmosphere. After completion of the reaction, the reaction mixture was subjected to layer separation. The organic layer thus formed was concentrated in a vacuum, followed by purification through column chromatography to afford <Intermediate 1-e> (23.1 q, yield 78%).

Synthesis Example 1-(6): Synthesis of Intermediate 1-f

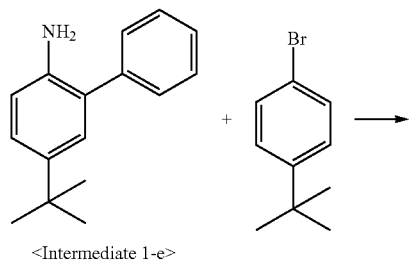

<Intermediate 1-e>

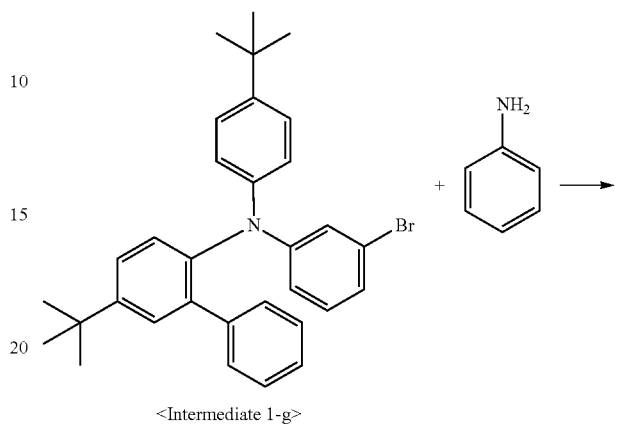

<Intermediate 1-f>

The same procedure as in Synthesis Example 1-(2) was carried out, with the exception of using 1-bromo-4-tert-butylbenzene and <Intermediate 1-e> instead of <Intermediate 1-a> and aniline, respectively, to afford <Intermediate 1-f>. (yield 75%)

Synthesis Example 1-(7): Synthesis of Intermediate 1-g

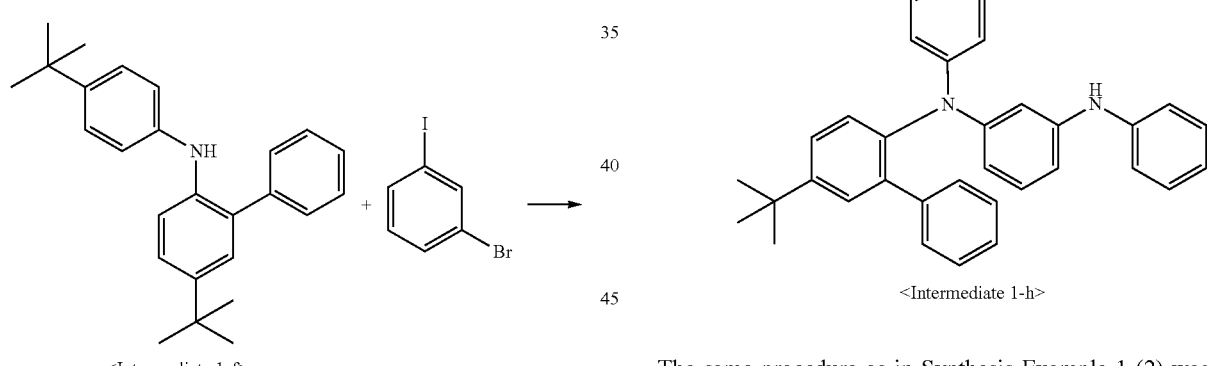

<Intermediate 1-g>

The same procedure as in Synthesis Example 1-(2) was carried out, with the exception of using 1-iodo-3-bromobenzene and <Intermediate 1-f> instead of <Intermediate 1-a> and aniline, respectively, to afford <Intermediate 1-g>. (yield 65%)

Synthesis Example 1-(8): Synthesis of Intermediate 1-h

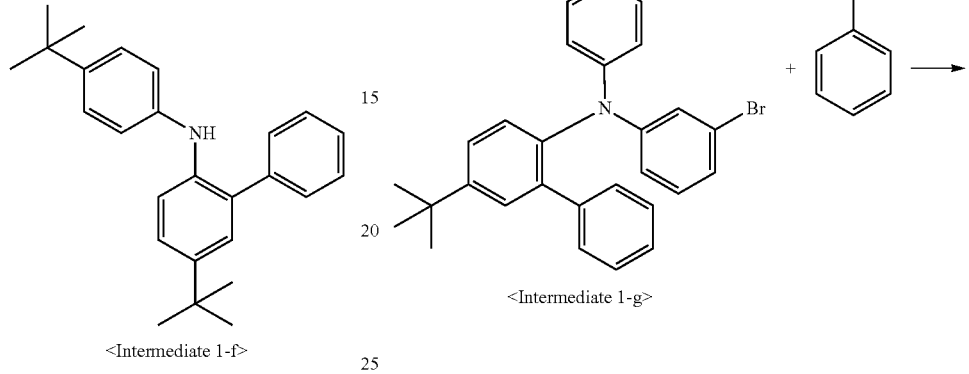

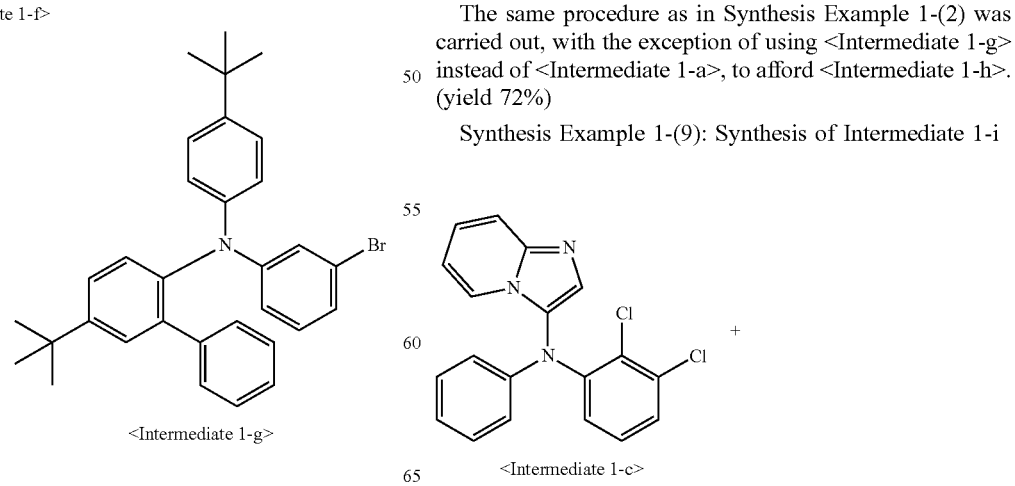

<Intermediate 1-h>

The same procedure as in Synthesis Example 1-(2) was carried out, with the exception of using <Intermediate 1-g> instead of <Intermediate 1-a>, to afford <Intermediate 1-h>. (yield 72%)

Synthesis Example 1-(9): Synthesis of Intermediate 1-i

<Intermediate 1-c>

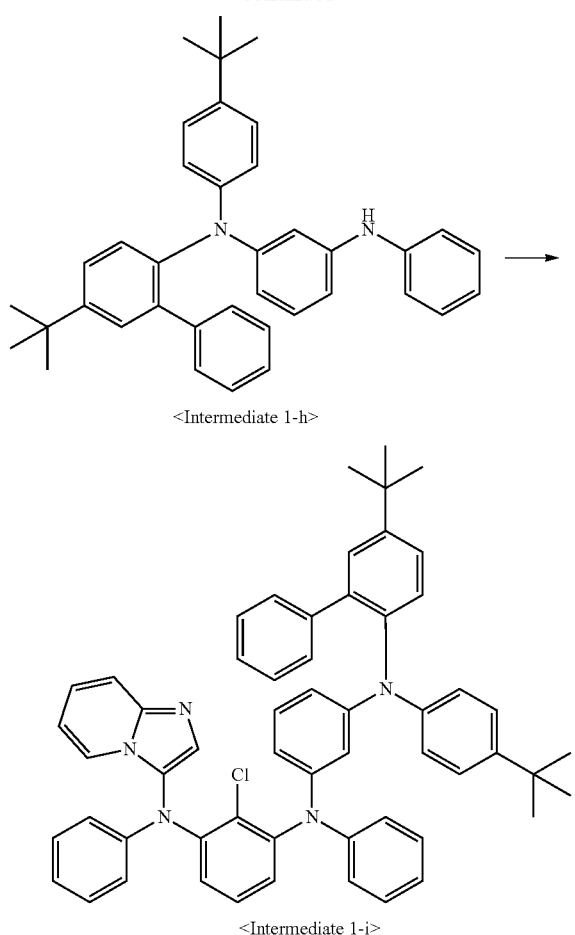

<Intermediate 1-h>

<Intermediate 1-i>

The same procedure as in Synthesis Example 1-(3) was carried out, with the exception of using <Intermediate 1-h> and <Intermediate 1-c> instead of <Intermediate 1-b> and 1-bromo-2,3-dichlorobenzene, respectively, to afford <Intermediate 1-i>. (yield 66%)

Synthesis Example 1-(10): Synthesis of Compound 1

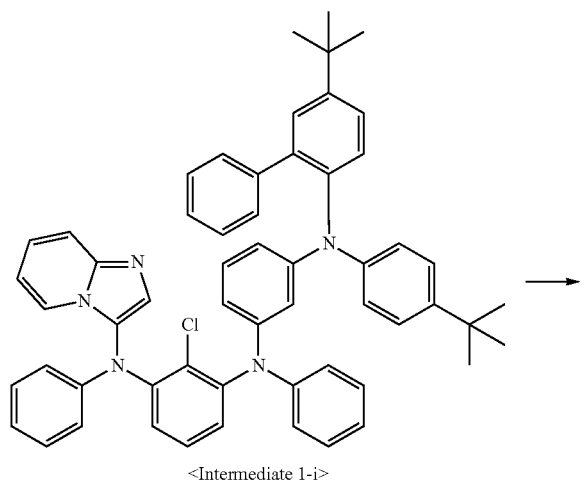

<Intermediate 1-i>

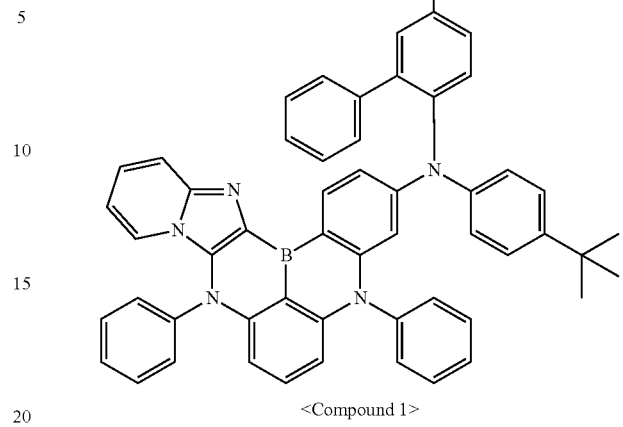

<Compound 1>

In a round-bottom flask, <Intermediate 1-i> (30 g, 35.6 mmol) and tert-butyl benzene (300 ml) were stirred together under a nitrogen atmosphere. After the temperature was lowered to 0° C., 1.7 M tert-butyl lithium (46 ml, 78.3 mmol) was dropwise added and stirred at 60° C. for 3 hours. Then, the temperature was decreased to −30° C., boron tribromide (17.8 g, 71.2 mmol) was added and stirred at room temperature for 1 hour. Subsequently, diisopropyl ethylamine (9.2 g, 71.2 mmol) was added and stirred at 120° C. for 3 hours. After completion of the reaction, the reaction mixture was subjected to layer separation. The organic layer thus formed was concentrated in a vacuum, followed by purification through column chromatography to afford <Compound 1> (2.3 g, yield 18%)

MS (MALDI-TOF): m/z 815.42 [M⁺]

Synthesis Example 2. Synthesis of Compound 8

Synthesis Example 2-(1): Synthesis of Intermediate 2-a

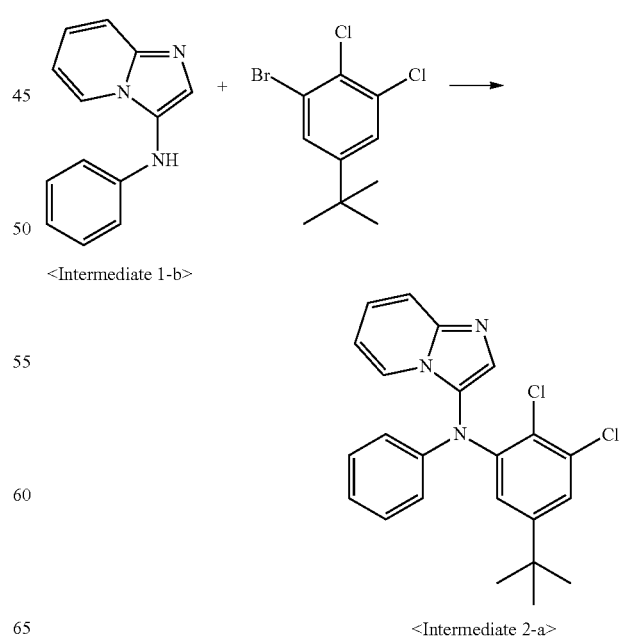

<Intermediate 1-b>

<Intermediate 2-a>

The same procedure as in Synthesis Example 1-(3) was carried out, with the exception of using 1-bromo-2,3-dichloro-5-tert-butyl benzene instead of 1-bromo-2,3-dichlorobenzene, to afford <Intermediate 2-a>. (yield 62%)

Synthesis Example 2-(2): Synthesis of Intermediate 2-b

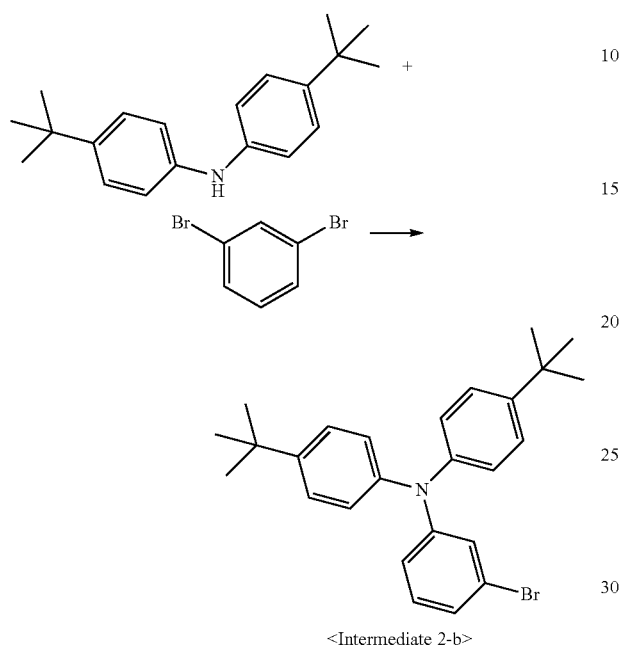

<Intermediate 2-b>

The same procedure as in Synthesis Example 1-(3) was carried out, with the exception of using bis(4-(tert-butyl)phenyl)amine and 1,3-dibromobenzene instead of <Intermediate 1-b> and 1-bromo-2,3-dichlorobenzene, respectively, to afford <Intermediate 2-b>. (yield 68%)

Synthesis Example 2-(3): Synthesis of Intermediate 2-c

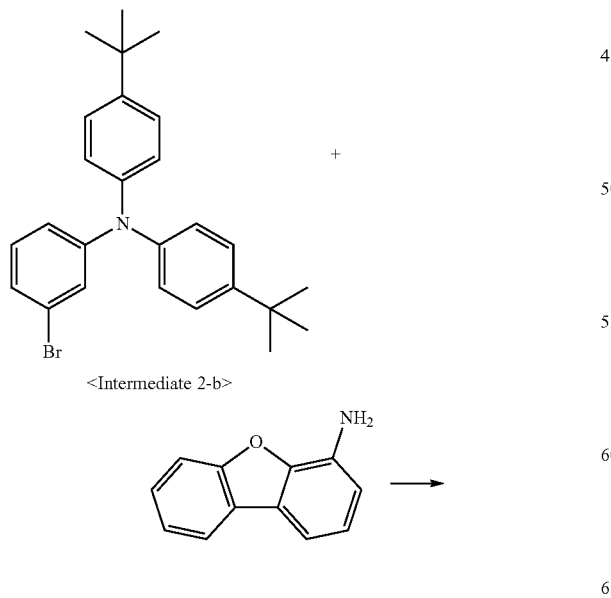

-continued

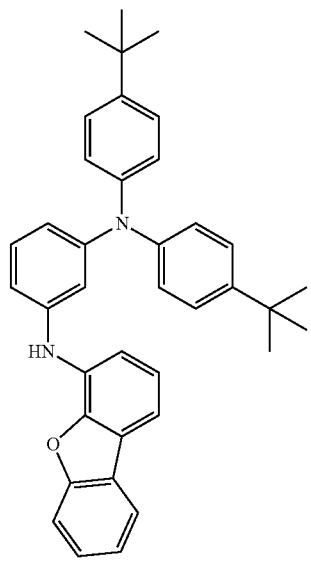

<Intermediate 2-c>

The same procedure as in Synthesis Example 1-(2) was carried out, with the exception of using <Intermediate 2-b> and 4-aminodibenzofuran instead of <Intermediate 1-a> and aniline, respectively, to afford <Intermediate 2-c>. (yield 60%)

Synthesis Example 2-(4): Synthesis of Intermediate 2-d

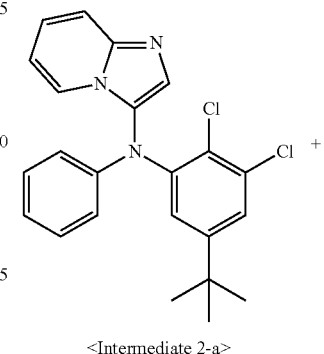

<Intermediate 2-a>

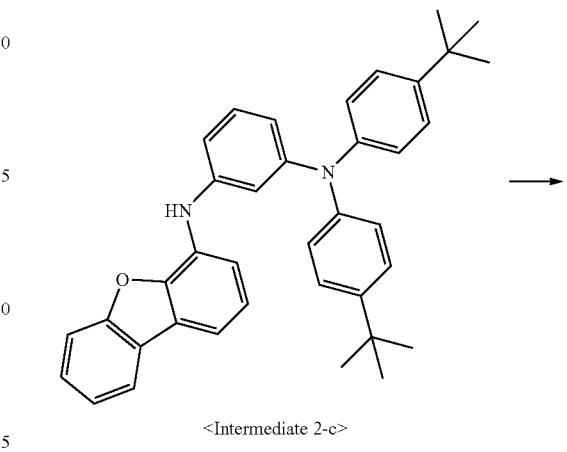

<Intermediate 2-c>

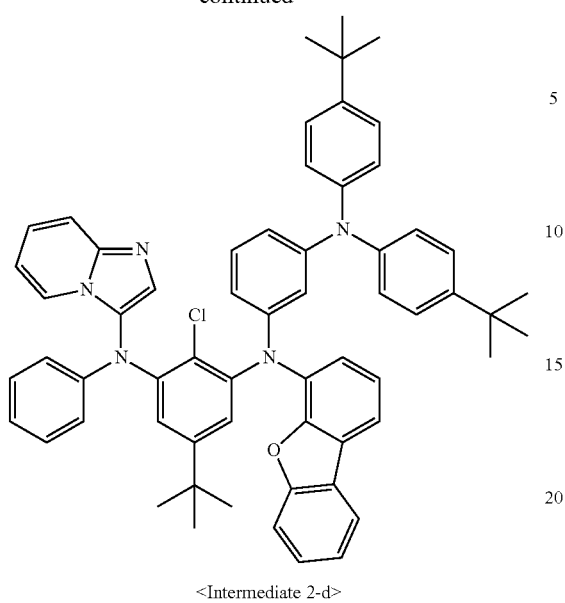

<Intermediate 2-d>

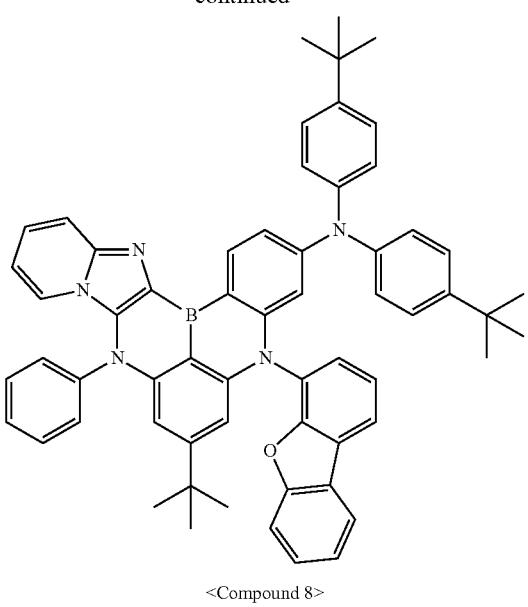

<Compound 8>

The same procedure as in Synthesis Example 1-(10) was carried out, with the exception of using <Intermediate 2-d> instead of <Intermediate 1-i>, to afford <Compound 8>. (yield 20%)

MS (MALDI-TOF): m/z 885.46 [M$^+$]

The same procedure as in Synthesis Example 1-(3) was carried out, with the exception of using <Intermediate 2-c> and <Intermediate 2-a> instead of <Intermediate 1-b> and 1-bromo-2,3-dichlorobenzene, respectively, to afford <Intermediate 2-d>. (yield 60%)

Synthesis Example 2-(5): Synthesis of Compound 8

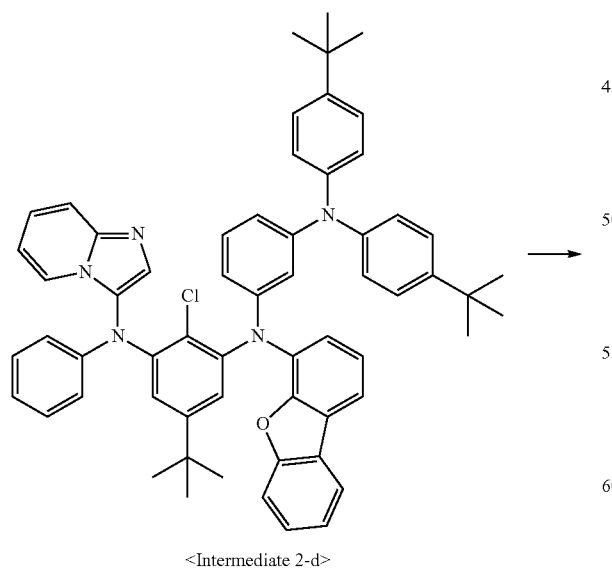

<Intermediate 2-d>

Synthesis Example 3. Synthesis of Compound 12

Synthesis Example 3-(1): Synthesis of Intermediate 3-a

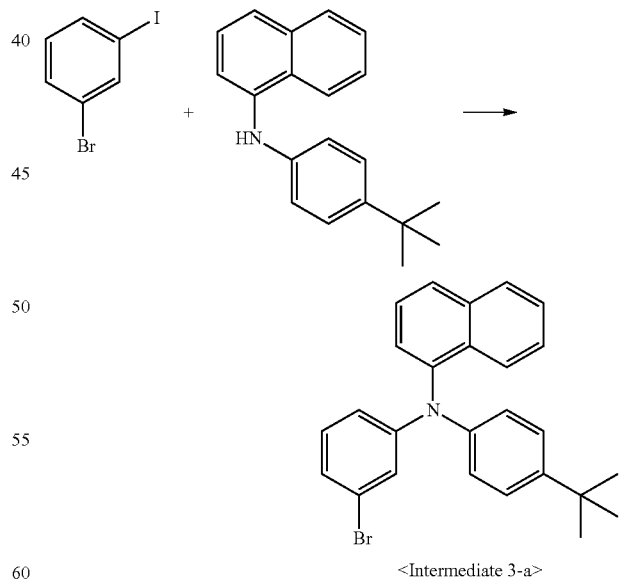

<Intermediate 3-a>

The same procedure as in Synthesis Example 1-(2) was carried out, with the exception of using 1-iodo-3-bromobenzene and N-(4-tert-butylphenyl)naphthalene-1-amine instead of <Intermediate 1-a> and aniline, respectively, to afford <Intermediate 3-a>. (yield 65%)

Synthesis Example 3-(2): Synthesis of Intermediate 3-b

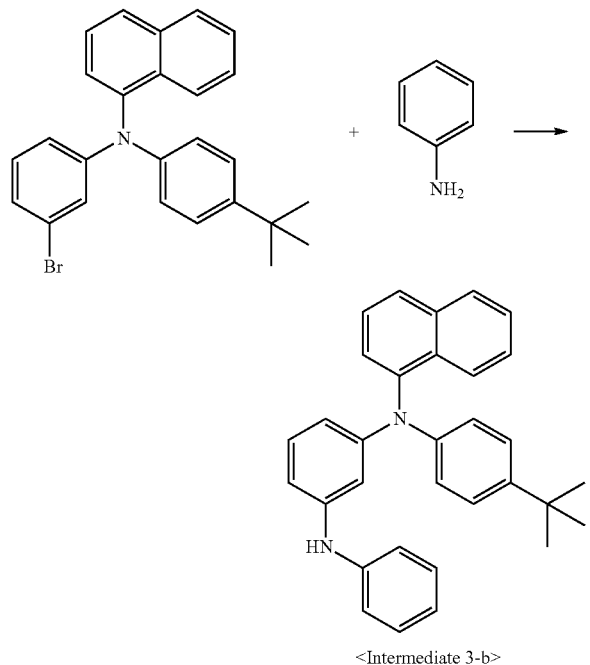

<Intermediate 3-b>

The same procedure as in Synthesis Example 1-(2) was carried out, with the exception of using <Intermediate 3-a> instead of <Intermediate 1-a>, to afford <Intermediate 3-b>. (yield 72%)

Synthesis Example 3-(3): Synthesis of Intermediate 3-c

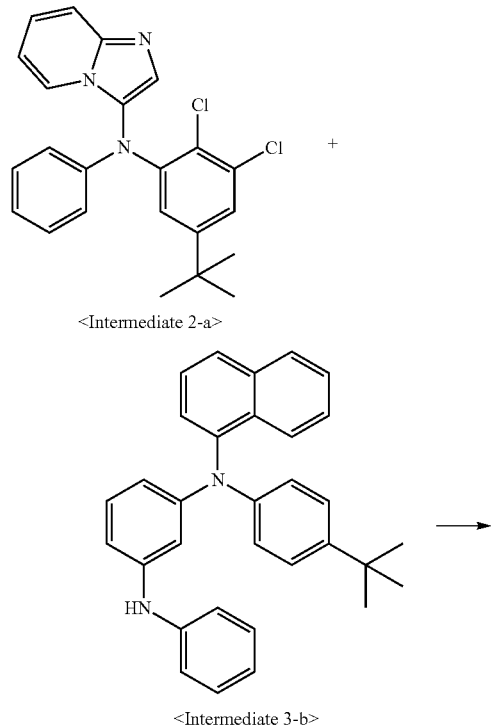

<Intermediate 3-c>

The same procedure as in Synthesis Example 1-(9) was carried out, with the exception of using <Intermediate 2-a> and <Intermediate 3-b> instead of <Intermediate 1-c> and <Intermediate 1-h>, respectively, to afford <Intermediate 3-c>. (yield 62%)

Synthesis Example 3-(4): Synthesis of Compound 12

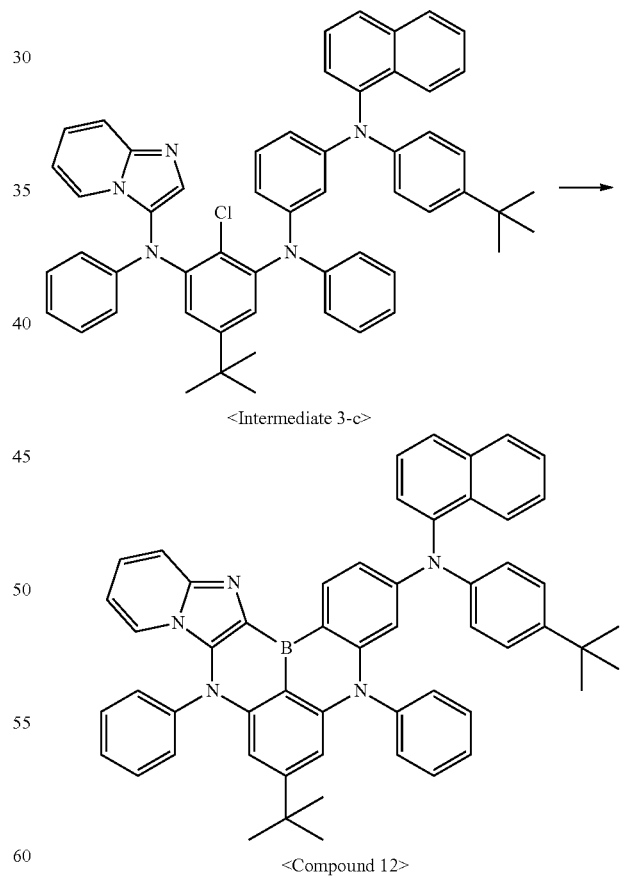

<Compound 12>

The same procedure as in Synthesis Example 1-(10) was carried out, with the exception of using <Intermediate 3-c> instead of <Intermediate 1-i>, to afford <Compound 12>. (yield 18%)

MS (MALDI-TOF): m/z 789.40 [M$^+$]

Synthesis Example 4. Synthesis of Compound 13

Synthesis Example 4-(1): Synthesis of Intermediate 4-a

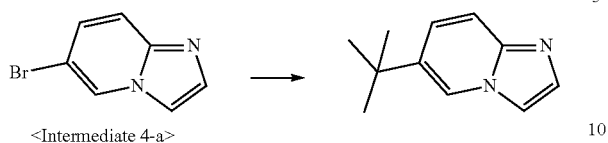

<Intermediate 4-a>

In a round-bottom flask, 6-bromoimidazopyridine 50 g (253 mmol), ditriphenylphosphine nickel dichloride (8.3 g, 12.6 mmol), and tetrahydrofuran (500 ml) were stirred together under a nitrogen atmosphere. At 0° C., tert-butyl magnesium bromide (49.2 g, 304 mmol) was dropwise added and then refluxed for 12 hours. After completion of the reaction, the reaction mixture was subjected to layer separation. The organic layer thus formed was concentrated in a vacuum, followed by purification through column chromatography to afford <Intermediate 4-a> (28.7 g, yield 65%).

Synthesis Example 4-(2): Synthesis of Compound 13

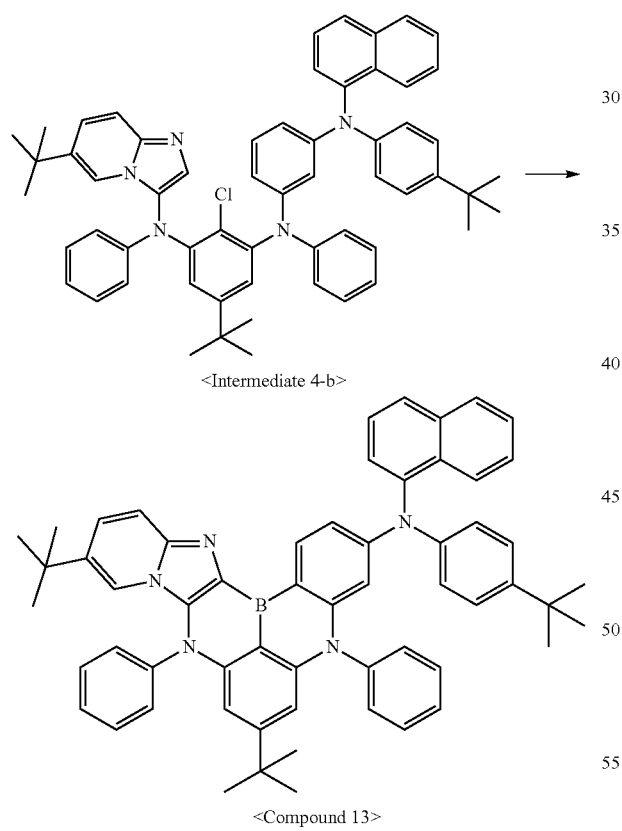

<Intermediate 4-b>

<Compound 13>

<Intermediate 4-b> was synthesized in the same manner as in Synthesis Example 1-(1) except for using <Intermediate 4-a> instead of imidazopyridine, as in Synthesis Example 1-(3) except for using 1-bromo-2,3-dichloro-5-tert-butyl benzene instead of 1-bromo-2,3-dichlorobenzene, and as in Synthesis Example 1-(9) except for <Intermediate 3-b> and <Intermediate 1-h>, and the same procedure as in Synthesis Example 1-(10) was carried out, with the exception of using <Intermediate 4-b> instead of <Intermediate 1-i>, to afford <Compound 13>.

MS (MALDI-TOF): m/z 845.46 [M$^+$]

Synthesis Example 5. Synthesis of Compound 58

Synthesis Example 5-(1): Synthesis of Intermediate 5-a

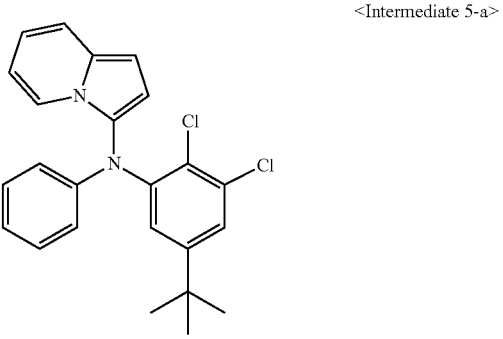 [SMILES: CC(C)(C)c1cc(Cl)c(Cl)c(N(c2ccccc2)c2ccc3ccccn23)c1]

<Intermediate 5-a>

<Intermediate 5-a> was synthesized in the same manner as in Synthesis Example 1-(1) to Synthesis Example 1-(3), with the exception of using 3-bromoindolizine instead of imidazopyridine in Synthesis Example 1-(1) and 1-bromo-2,3-dichloro-5-tert-butyl benzene instead of 1-bromo-2,3-dichlorobenzene in Synthesis Example 1-(3). (yield 52%)

Synthesis Example 5-(2): Synthesis of Intermediate 5-b

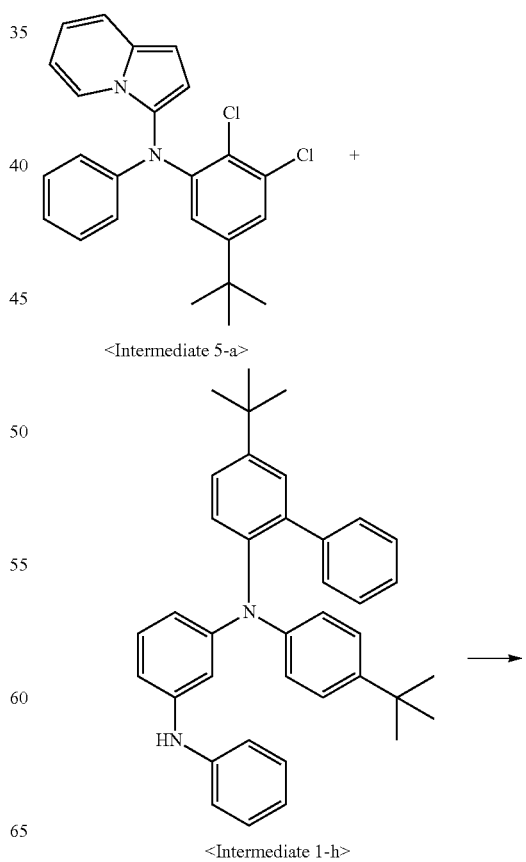

<Intermediate 5-a>

+

<Intermediate 1-h>

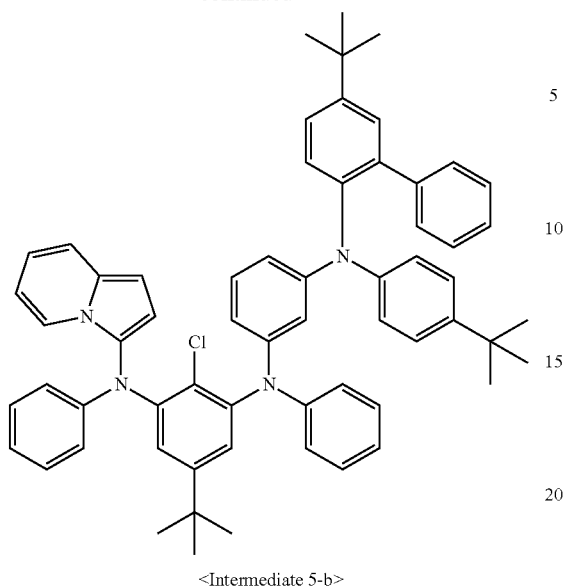

<Intermediate 5-b>

The same procedure as in Synthesis Example 1-(3) was carried out, with the exception of using <Intermediate 1-h> and <Intermediate 5-a> instead of <Intermediate 1-b> and 1-bromo-2,3-dichlorobenzene, respectively, to afford <Intermediate 5-b>. (yield 63%)

Synthesis Example 5-(3): Synthesis of Compound 58

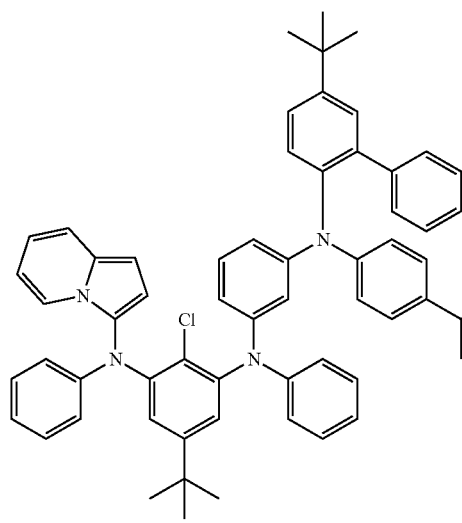

<Intermediate 5-b>

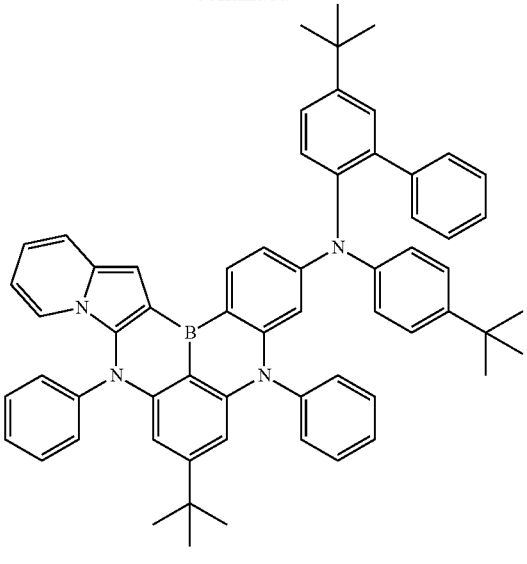

<Compound 58>

The same procedure as in Synthesis Example 1-(10) was carried out, with the exception of using <Intermediate 5-b> instead of <Intermediate 1-i>, to afford <Compound 58>. (yield 19%)

MS (MALDI-TOF): m/z 870.48 [M$^+$]

Synthesis Example 6. Synthesis of Compound 68

Synthesis Example 6-(1): Synthesis of Intermediate 6-a

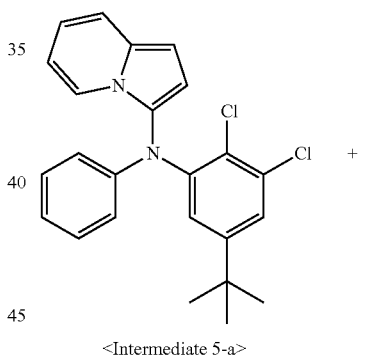

<Intermediate 5-a>

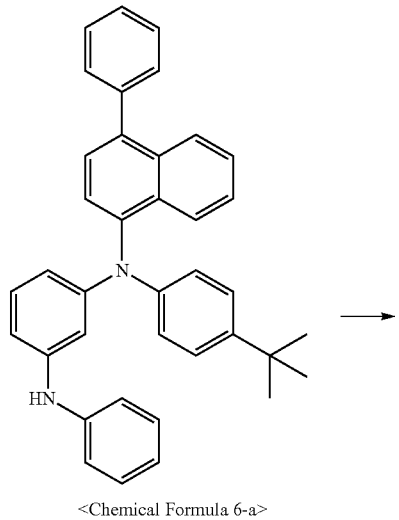

<Chemical Formula 6-a>

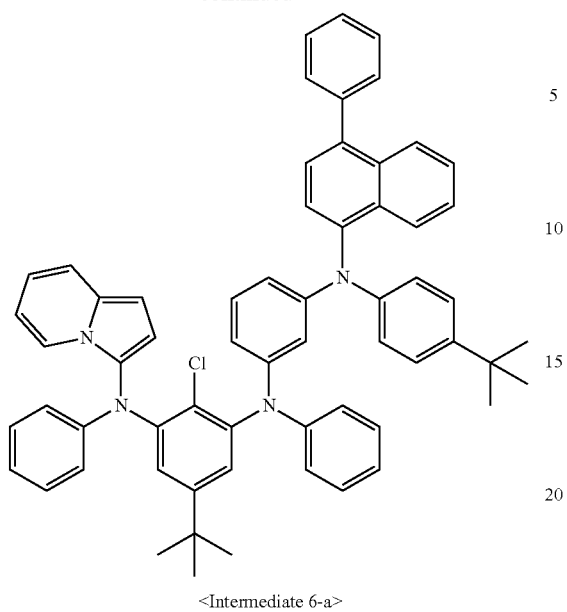

<Intermediate 6-a>

The same procedure as in Synthesis Example 1-(9) was carried out, with the exception of using <Intermediate 5-a> and <Chemical Formula 6-a> instead of <Intermediate 1-c> and <Intermediate 1-h>, respectively, to afford <Intermediate 6-a>. (yield 65%)

Synthesis Example 6-(2): Synthesis of Compound 68

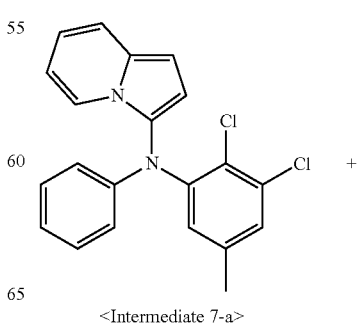

<Intermediate 6-a>

→

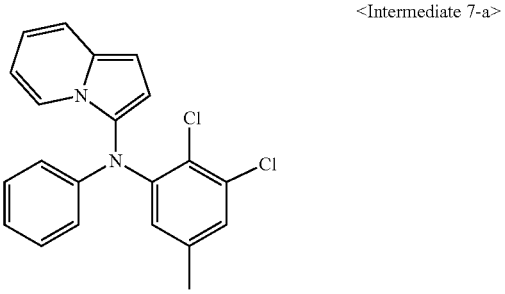 [SMILES: Cc1cc(Cl)c(Cl)c(N(c2ccccc2)c2ccc3ccccn23)c1]

<Compound 68>

The same procedure as in Synthesis Example 1-(10) was carried out, with the exception of using <Intermediate 6-a> instead of <Intermediate 1-i>, to afford <Compound 68>. (yield 20%)

MS (MALDI-TOF): m/z 808.37 [M$^+$]

Synthesis Example 7. Synthesis of Compound 89

Synthesis Example 7-(1): Synthesis of Intermediate 7-a

<Intermediate 7-a>

<Intermediate 7-a> was synthesized in the same manner as in Synthesis Example 1-(2) to Synthesis Example 1-(3) with the exception of using 3-bromoindolizine instead of using <Intermediate 1-a> in Synthesis Example 1-(2) and 1-bromo-2,3-dichloro-5-methylbenzene instead of 1-bromo-2,3-dichlorobenzene in Synthesis Example 1-(3). (yield 50%)

Synthesis Example 7-(2): Synthesis of Intermediate 7-b

<Intermediate 7-a> +

89
-continued

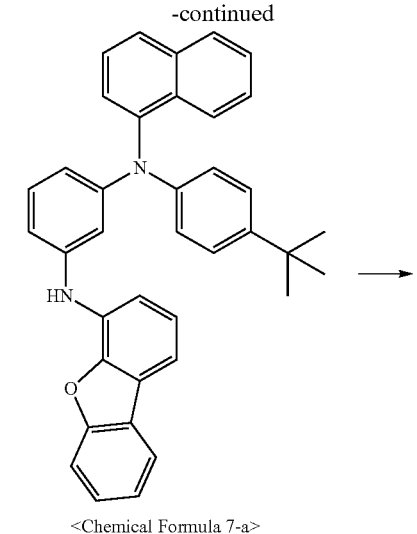

<Chemical Formula 7-a>

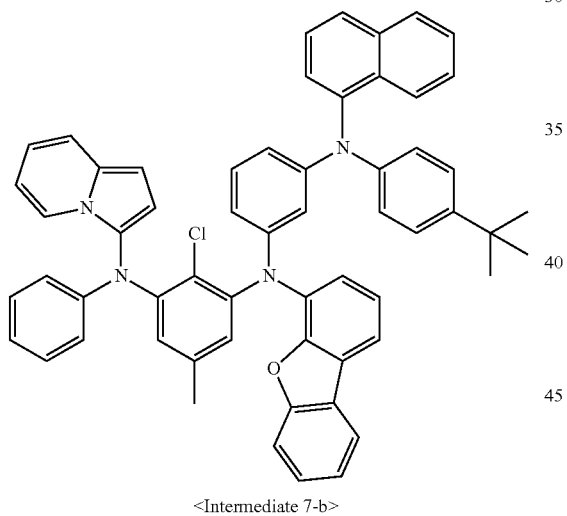

<Intermediate 7-b>

The same procedure as in Synthesis Example 1-(9) was carried out, with the exception of using <Intermediate 7-a> and <Chemical Formula 7-a> instead of <Intermediate 1-c> and <Intermediate 1-h>, respectively, to afford <Intermediate 7-b>. (yield 66%)

Synthesis Example 7-(3): Synthesis of Compound 89

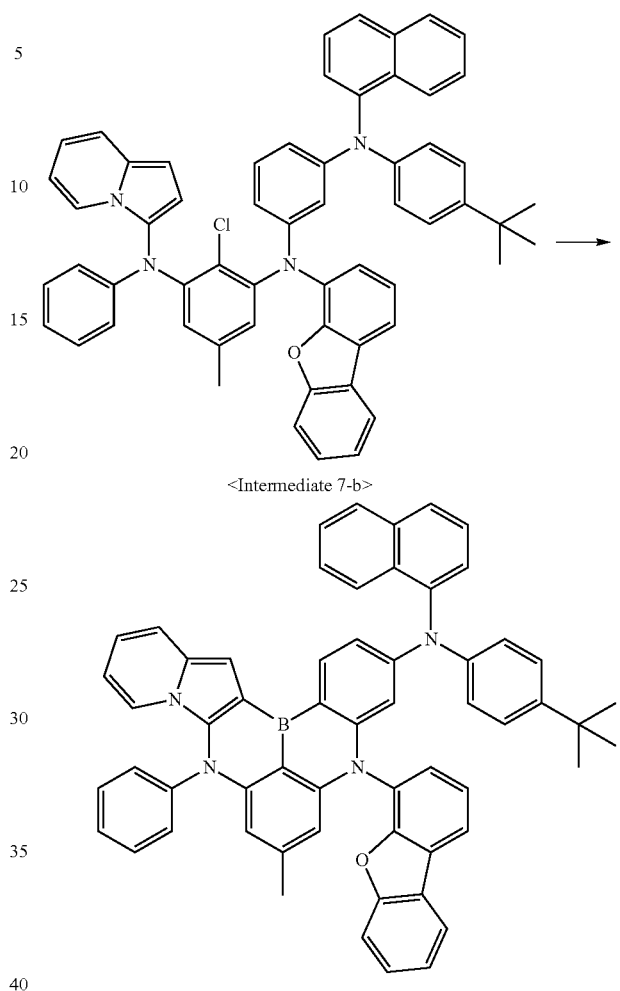

<Intermediate 7-b>

<Compound 89>

The same procedure as in Synthesis Example 1-(10) was carried out, with the exception of using <Intermediate 7-b> instead of <Intermediate 1-i>, to afford <Compound 89>. (yield 19%)

MS (MALDI-TOF): m/z 836.37 [M$^+$]

Synthesis Example 8. Synthesis of Compound 98

Synthesis Example 8-(1): Synthesis of Intermediate 8-a

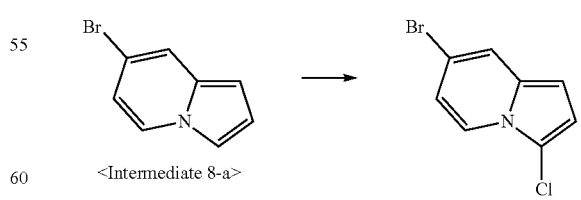

<Intermediate 8-a>

The same procedure as in Synthesis Example 1-(1) was carried out, with the exception of using 7-bromoindolizine and N-chlorosuccinimide instead of imidazopyridine and N-bromosuccinimide, respectively, to afford <Intermediate 8-a>. (yield 68%)

Synthesis Example 8-(2): Synthesis of Intermediate 8-b

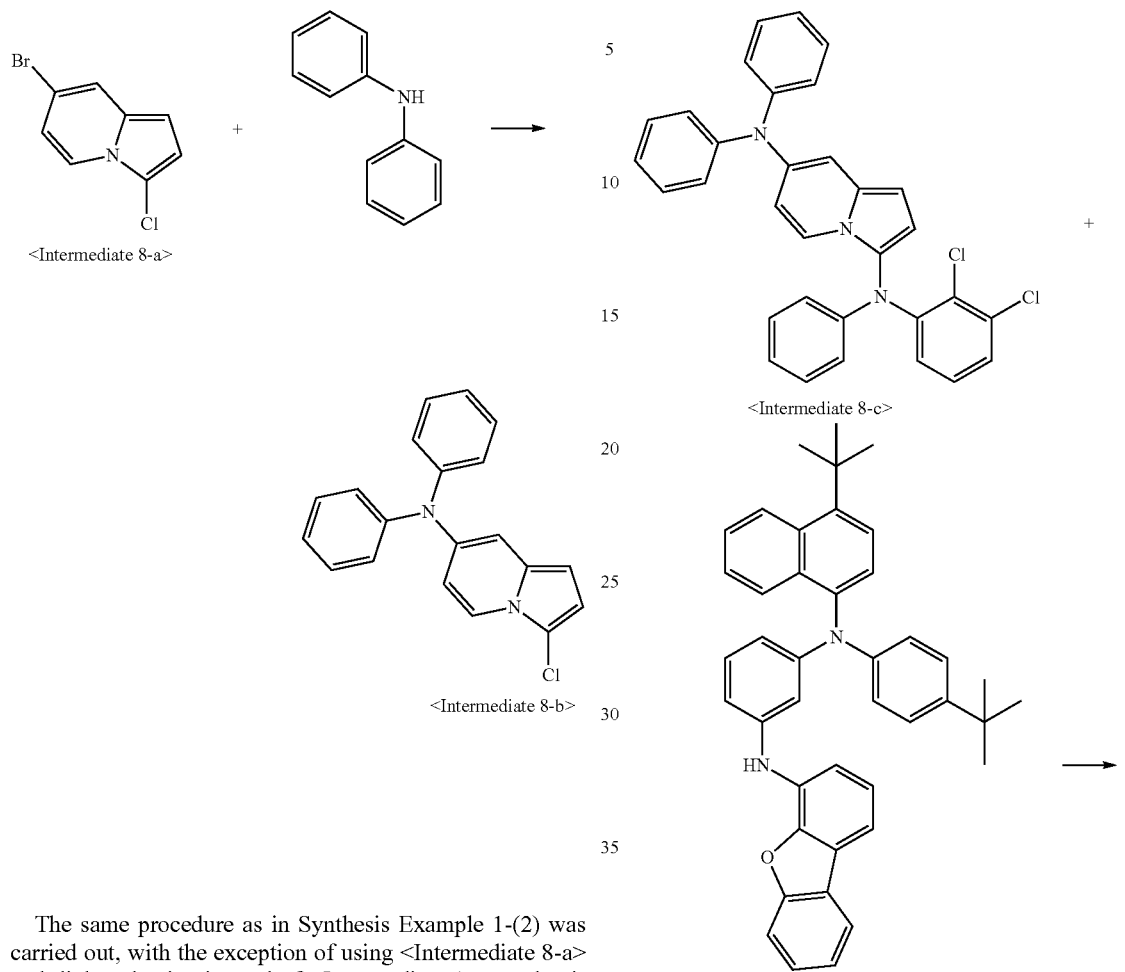

The same procedure as in Synthesis Example 1-(2) was carried out, with the exception of using <Intermediate 8-a> and diphenylamine instead of <Intermediate 1-a> and aniline, respectively, to afford <Intermediate 8-b>. (yield 77%)

Synthesis Example 8-(3): Synthesis of Intermediate 8-c

The same procedure as in Synthesis Example 1-(2) to Synthesis Example 1-(3) was carried out, with the exception of using <Intermediate 8-b> instead of <Intermediate 1-a> in Synthesis Example 1-(2), to afford <Intermediate 8-c>. (yield 55%)

Synthesis Example 8-(4): Synthesis of Intermediate 8-d

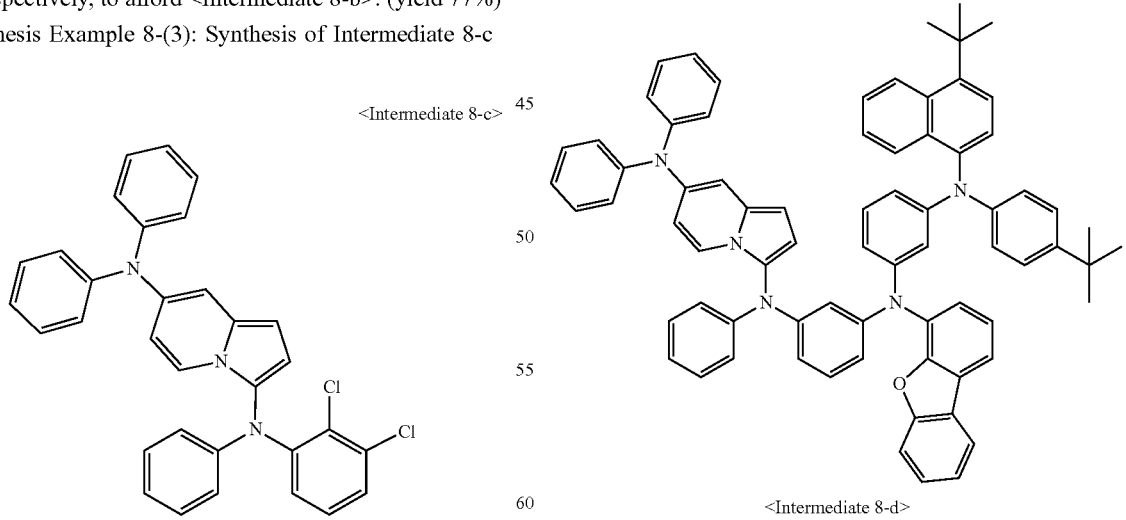

The same procedure as in Synthesis Example 1-(9) was carried out, with the exception of using <Intermediate 8-c> and <Chemical Formula 8-a> instead of <Intermediate 1-c> and <Intermediate 1-h>, respectively, to afford <Intermediate 8-d>. (yield 65%)

Synthesis Example 8-(5): Synthesis of Compound 98

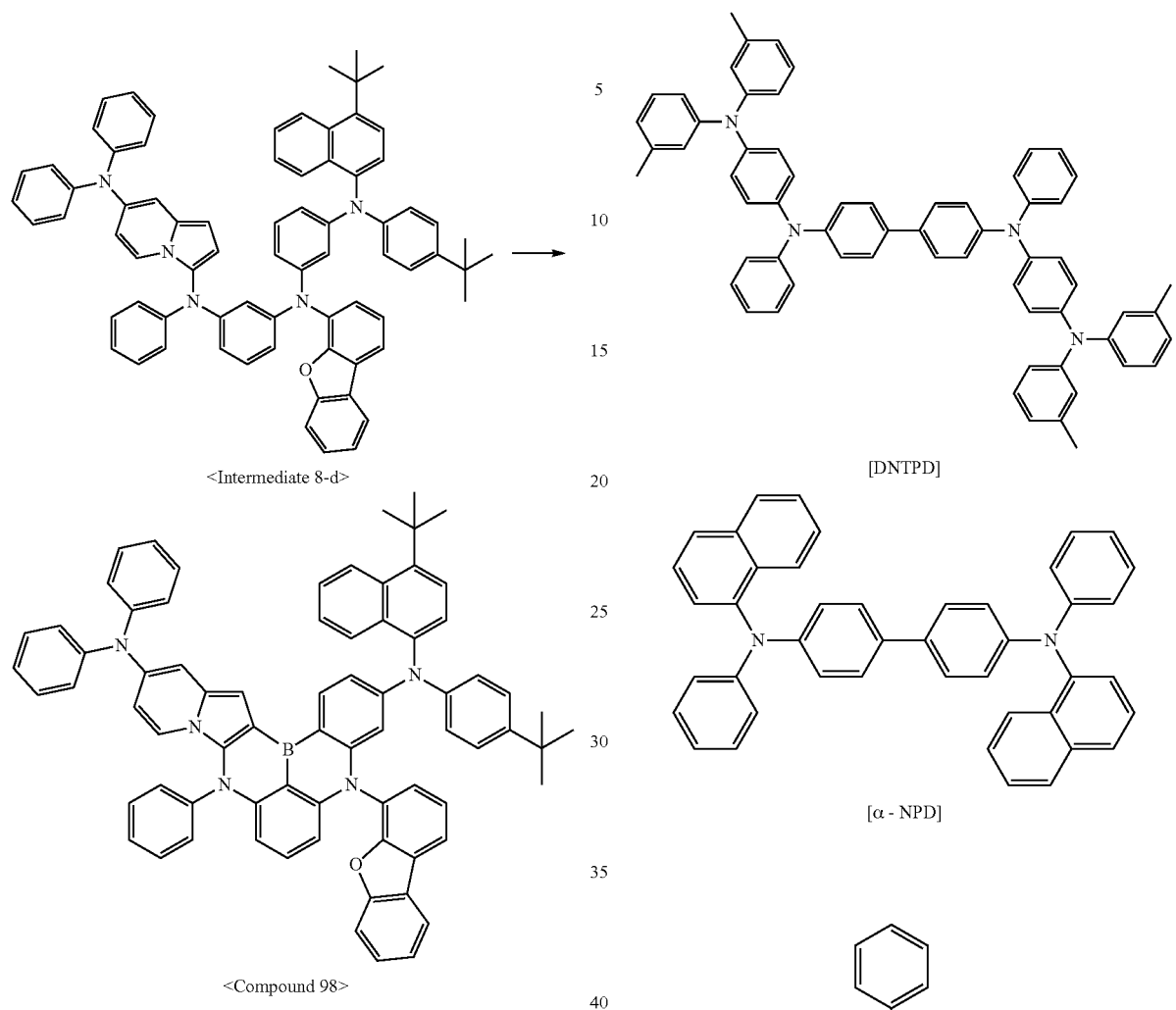

<Intermediate 8-d>

<Compound 98>

The same procedure as in Synthesis Example 1-(10) was carried out, with the exception of using <Intermediate 8-d> instead of <Intermediate 1-i>, to afford <Compound 98>. (yield 20%)

MS (MALDI-TOF): m/z 1045.49 [M$^+$]

Examples 1- 8: Fabrication of Organic Light-Emitting Diodes

An ITO glass substrate was patterned to have a translucent area of 2 mm×2 mm and cleansed. The ITO glass was mounted in a vacuum chamber that was then set to have a base pressure of $1\times10^{-7}$ torr. On the ITO glass substrate, films were sequentially formed of DNTPD (700 Å) and α-NPD (300 Å). Subsequently, a light-emitting layer (250 Å) was formed of a combination of [BH] as a host and the boron compound (3 wt %) of the present disclosure as a dopant. Then, [Chemical Formula E-1] and [Chemical Formula E-2] were deposited at a weight ratio of 1:1 to form an electron transport layer (300 Å) on which an electron injection layer of [Chemical Formula E-1] (5 Å) was formed and then covered with an Al layer (1000 Å) to fabricate an organic light-emitting diode. The organic light-emitting diodes thus obtained were measured at 0.4 mA for luminescence properties:

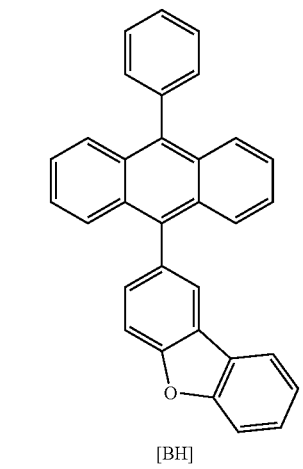

[DNTPD]

[α - NPD]

[BH]

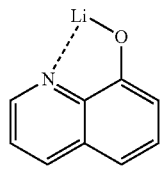

[Chemical Formula E-1]

[Chemical Formula E-2]

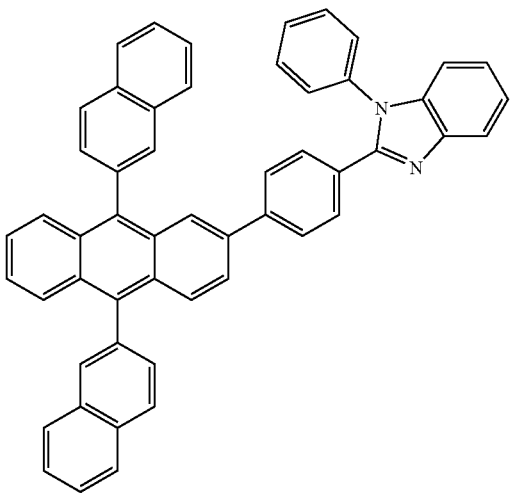

[BD2]

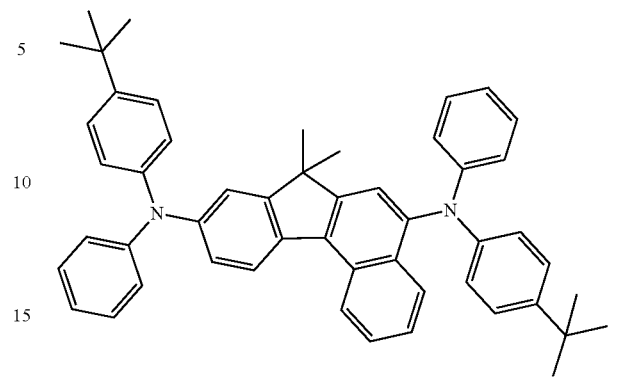

[BD 3]

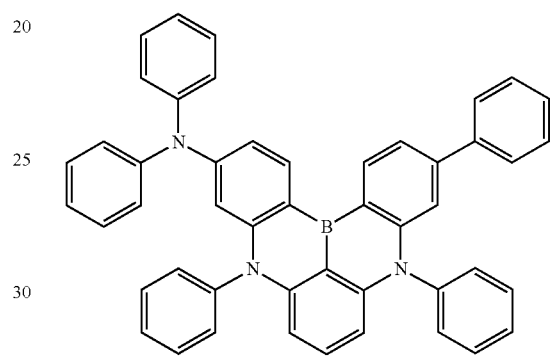

Comparative Examples 1 to 3

Organic light emitting diodes were fabricated in the same manner as in the Examples 1-8, with the exception of using [BD1] to [BD3] as dopants instead of the compounds according to the present disclosure. The luminescence of the organic light-emitting diodes thus obtained was measured at 0.4 mA. Structures of compounds [BD1] to [BD3] are as follows:

[BD1]

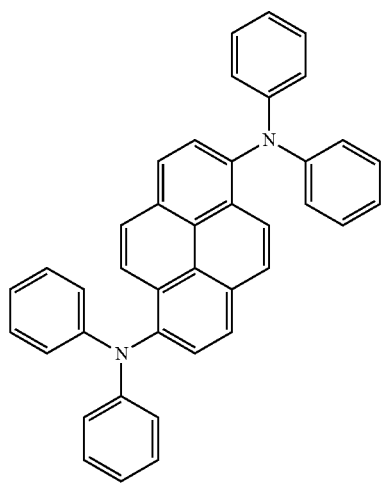

TABLE 1

| Ex. # | Dopant | CIE x | CIE y | Volt. (V) | EQE (%) |
|---|---|---|---|---|---|
| 1 | Chemical Formula 1 | 0.136 | 0.112 | 3.80 | 8.9 |
| 2 | Chemical Formula 8 | 0.136 | 0.112 | 3.82 | 9.1 |
| 3 | Chemical Formula 12 | 0.137 | 0.113 | 3.85 | 8.8 |
| 4 | Chemical Formula 13 | 0.137 | 0.112 | 3.82 | 9.2 |
| 5 | Chemical Formula 58 | 0.136 | 0.112 | 3.78 | 9.3 |
| 6 | Chemical Formula 68 | 0.137 | 0.111 | 3.83 | 8.9 |
| 7 | Chemical Formula 89 | 0.136 | 0.112 | 3.80 | 9 |
| 8 | Chemical Formula 98 | 0.136 | 0.112 | 3.81 | 9.4 |
| C. 1 | BD1 | 0.139 | 0.125 | 4.10 | 7.3 |
| C. 2 | BD2 | 0.137 | 0.118 | 4.07 | 7.2 |
| C. 3 | BD3 | 0.136 | 0.113 | 3.87 | 7.3 |

As is understood from data for Examples 1 to 8, the boron compounds according to the present disclosure allow low-voltage driving and high quantum efficiency compared to Comparative Examples 1 to 3, thus finding high availability for organic light-emitting diodes.

INDUSTRIAL APPLICABILITY

Exhibiting better low-driving voltage and luminous efficiency characteristics compared to conventional compounds, the novel boron compounds according to the present disclosure, when used as a dopant in an organic light-emitting diode, gives a guarantee of improved properties to the organic light-emitting diode and can find advantageous applications in the related industrial fields.

The invention claimed is:

1. A boron compound represented by Chemical Formula A:

[Chemical Formula A]

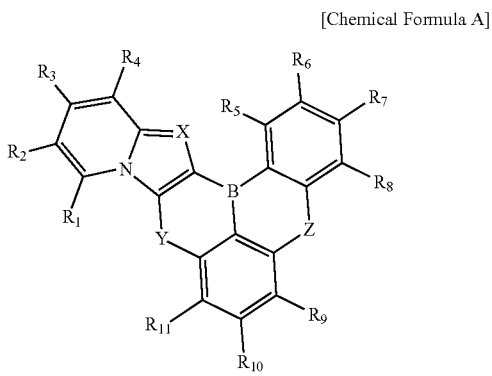

wherein,

Y is any one selected from $CR_{12}R_{13}$, $NR_{14}$, O, and S,

Z is any one selected from $CR_{15}R_{16}$, $NR_{17}$, O, and S,

X is $CR_{18}$ or a nitrogen atom (N), the substituents $R_1$ to $R_{17}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, a substituted or unsubstituted heteroaryl of 2 to 50 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylsilyl of 1 to 30 carbon atoms, a substituted or unsubstituted arylsilyl of 6 to 30 carbon atoms, a nitro, a cyano, a halogen, and $-N(R_{19})(R_{20})$, the substituents $R_{18}$ to $R_{20}$, which are same or different, are each independently selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted cycloalkyl of 3 to 30 carbon atoms, and a substituted or unsubstituted heteroaryl of 2 to 50 carbon atoms, wherein $R_{19}$ and $R_{20}$ may be connected to each other to additionally form an aliphatic or aromatic mono-or polycyclic ring, the substituents $R_{12}$ and $R_{13}$ can be connected to each other to form an additional mono-or polycyclic aliphatic or aromatic ring, the substituents $R_{15}$ and $R_{16}$ can be connected to each other to form an additional mono-or polycyclic aliphatic or aromatic ring, the substituents $R_{12}$ to $R_{14}$ can each be connected to $R_1$ or $R_{11}$ to form an additional mono-or polycyclic aliphatic or aromatic ring, the substituents $R_{15}$ to $R_{17}$ can each be connected to $R_8$ or $R_9$ to form an additional mono-or polycyclic aliphatic or aromatic ring, wherein the term "substituted" in the expression "substituted or unsubstituted" used for compounds of Chemical Formula A means having at least one substituent selected from the group consisting of a deuterium atom, a cyano, a halogen, a hydroxyl, a nitro, an alkyl of 1 to 24 carbon atoms, a halogenated alkyl of 1 to 24 carbon atoms, an alkenyl of 2 to 24 carbon atoms, an alkynyl of 2 to 24 carbon atoms, a heteroalkyl of 1 to 24 carbon atoms, a cycloalkyl of 3 to 24 carbon atoms, an aryl of 6 to 24 carbon atoms, an arylalkyl of 7 to 24 carbon atoms, an alkylaryl of 7 to 24 carbon atoms, a heteroaryl of 2 to 24 carbon atoms, a heteroarylalkyl of 2 to 24 carbon atoms, an alkoxy of 1 to 24 carbon atoms, an alkylamino of 1 to 24 carbon atoms, a diarylamino of 12 to 24 carbon atoms, a diheteroarylamino of 2 to 24 carbon atoms, an aryl (heteroaryl) amino of 7 to 24 carbon atoms, an alkylsilyl of 1 to 24 carbon atoms, an arylsilyl of 6 to 24 carbon atoms, an aryloxy of 6 to 24 carbon atoms, and an arylthionyl of 6 to 24 carbon atoms.

2. The boron compound of claim 1, wherein Y is $NR_{14}$ or Z is $NR_{17}$, $R_{14}$ and $R_{17}$ being as defined in claim 1.

3. The boron compound of claim 2, wherein Y is $NR_{14}$ and Z is $NR_{17}$.

4. The boron compound of claim 1, wherein X is a nitrogen atom (N).

5. The boron compound of claim 1, wherein X is C-H or C-D.

6. The boron compound of claim 2, wherein $R_{14}$ and $R_{17}$ are same or different and each independently a substituted or unsubstituted aryl of 6 to 18 carbon atoms or a substituted or unsubstituted heteroaryl of 2 to 18 carbon atoms.

7. The boron compound of claim 6, wherein $R_{14}$ and $R_{17}$ are same or different and each independently selected from a substituted or unsubstituted phenyl, a substituted or unsubstituted biphenyl, a substituted or unsubstituted naphthyl, a substituted or unsubstituted anthracenyl, a substituted or unsubstituted phenanthrenyl, and a substituted or unsubstituted fluorenyl.

8. The boron compound of claim 1, wherein at least one of the substituents $R_1$ to $R_{11}$ is represented by $-N(R_{19})(R_{20})$.

9. The boron compound of claim 8, wherein one or two of the substituents $R_1$ to $R_{11}$ are represented by $-N(R_{19})(R_{20})$.

10. The boron compound of claim 8, wherein one or two of the substituents $R_1$ to $R_8$ are represented by $-N(R_{19})(R_{20})$.

11. The boron compound of claim 1, wherein the substituent represented by $-N(R_{19})(R_{20})$ has the following Structural Formula A:

[Structural Formula A]

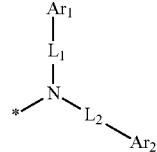

wherein, the linkers $L_1$ and $L_2$, which are same or different, are each independently a single bond or a substituted or unsubstituted arylene of 6 to 18 carbon atoms, and the substituents $Ar_1$ and $Ar_2$, which are same or different, are each independently selected from a substituted or unsubstituted alkyl of 1 to 15 carbon atoms, a substituted or unsubstituted aryl of 6 to 18 carbon atoms, a substituted or unsubstituted cycloalkyl of 3 to 15 carbon atoms, and a substituted or unsubstituted heteroaryl of 2 to 18 carbon atoms and may be bonded to each other to form an additional mono-or polycyclic aliphatic or aromatic ring.

12. The boron compound of claim 1, wherein the compound represented by Chemical Formula A is any one selected from the following <Compound 1> to <Compound 132>:
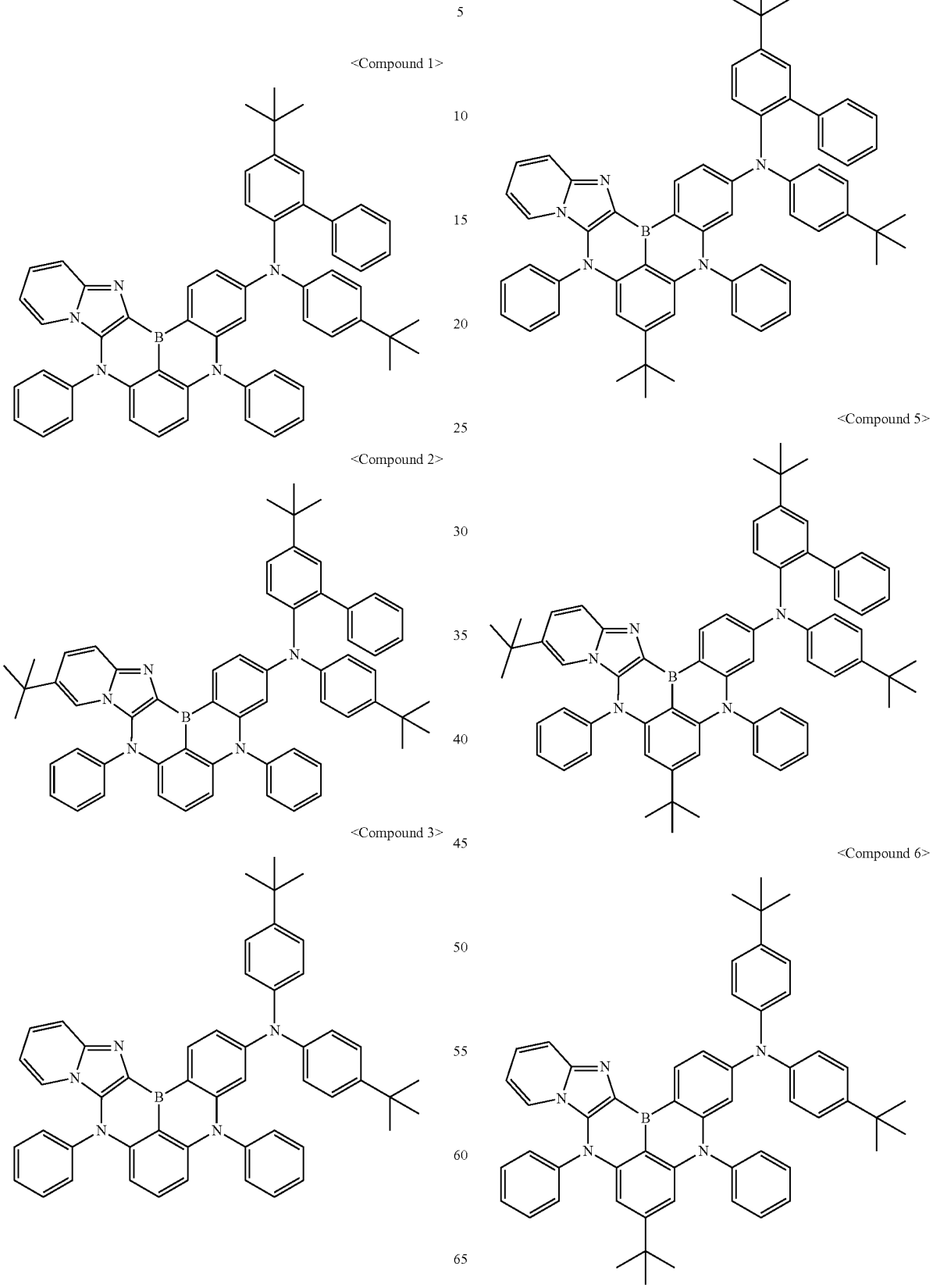

<Compound 7>
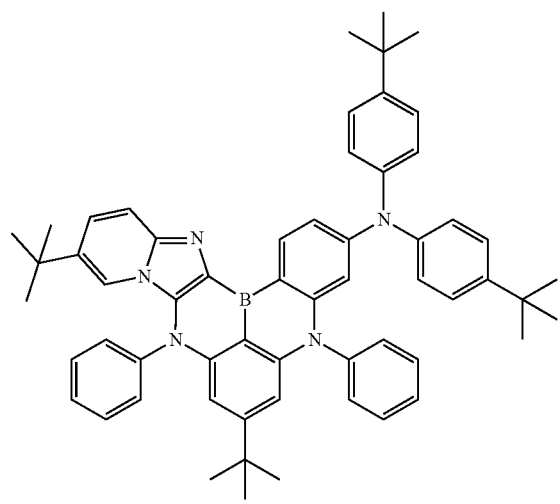
<Compound 8>
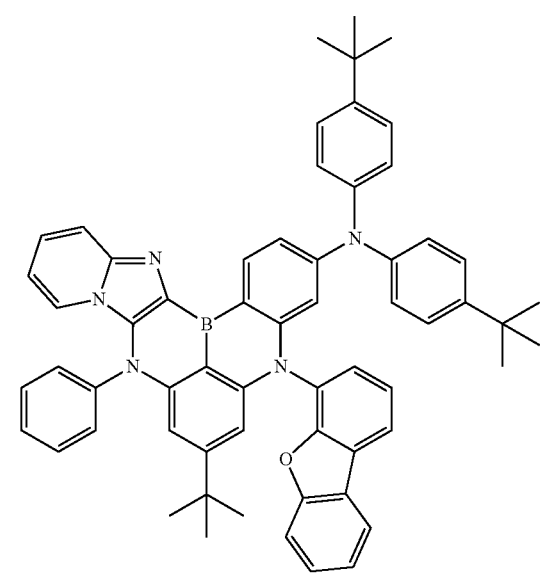
<Compound 9>
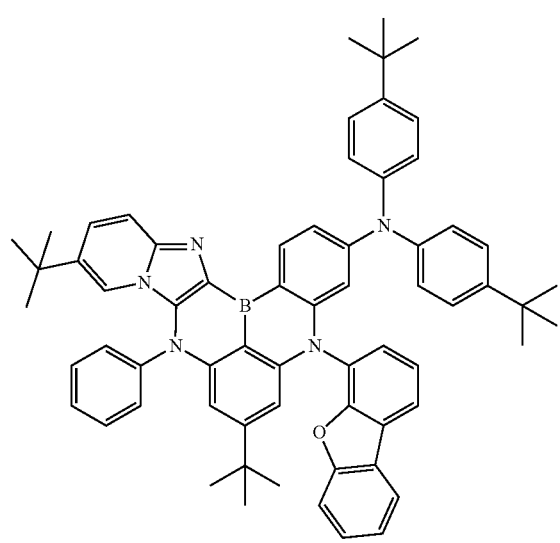
<Compound 10>
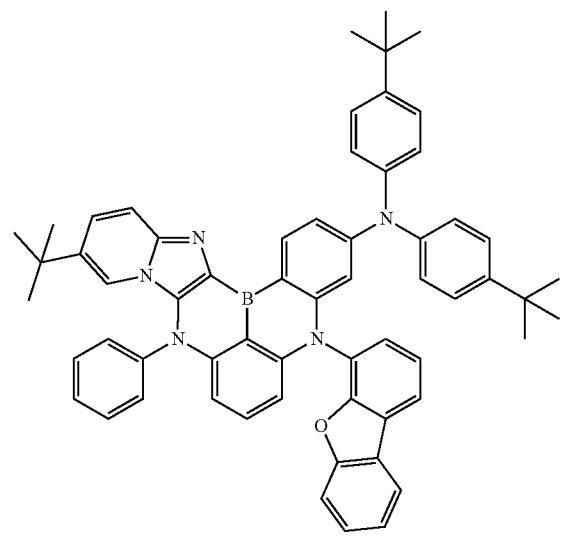
<Compound 11>
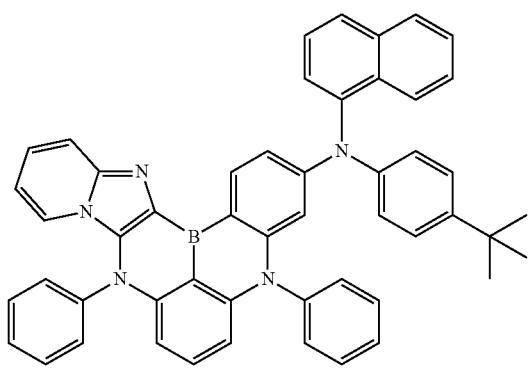
<Compound 12>
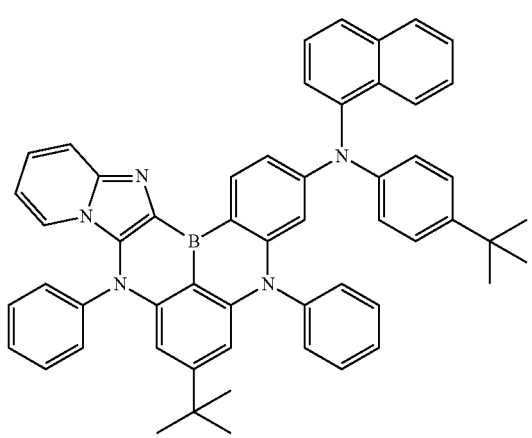

<Compound 13>
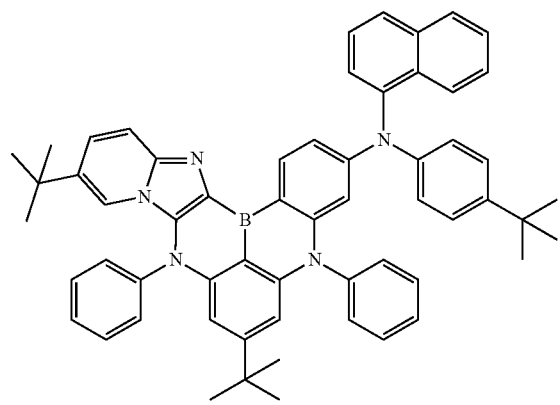
<Compound 14>
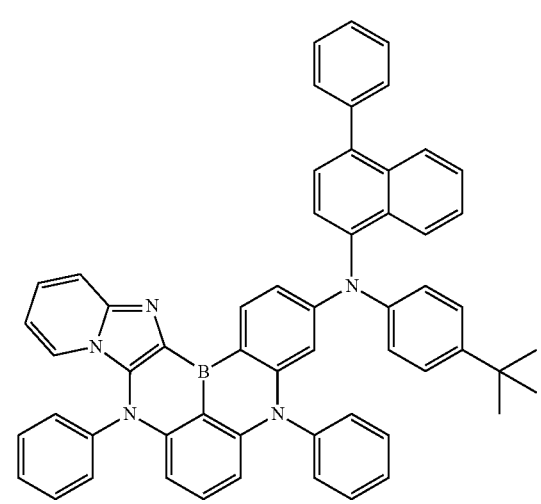
<Compound 15>
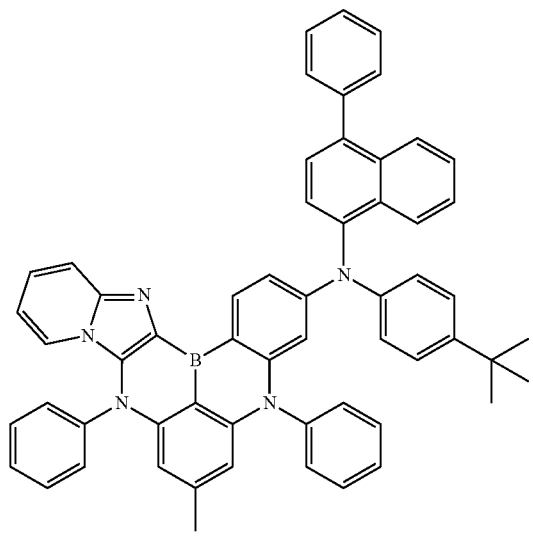
<Compound 16>
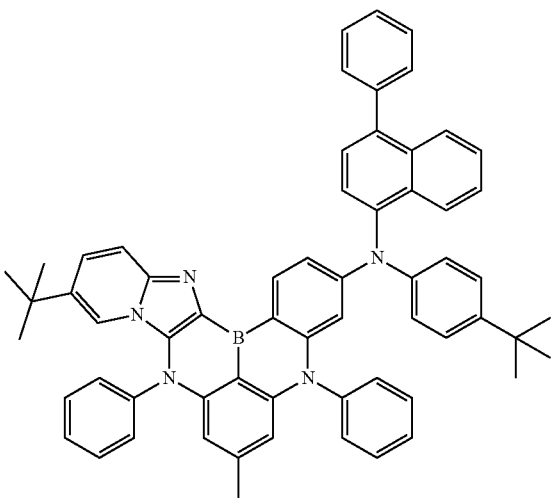
<Compound 17>
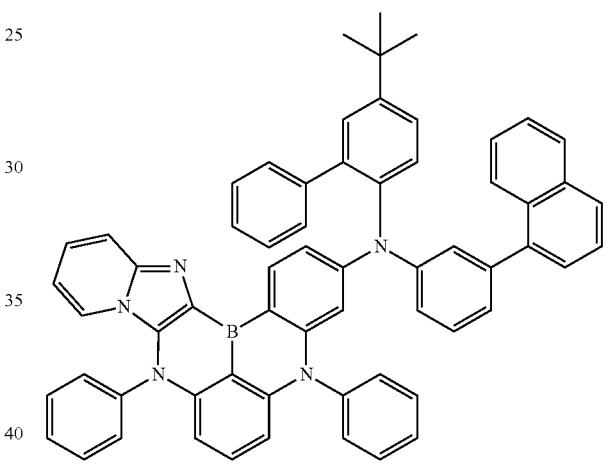
<Compound 18>
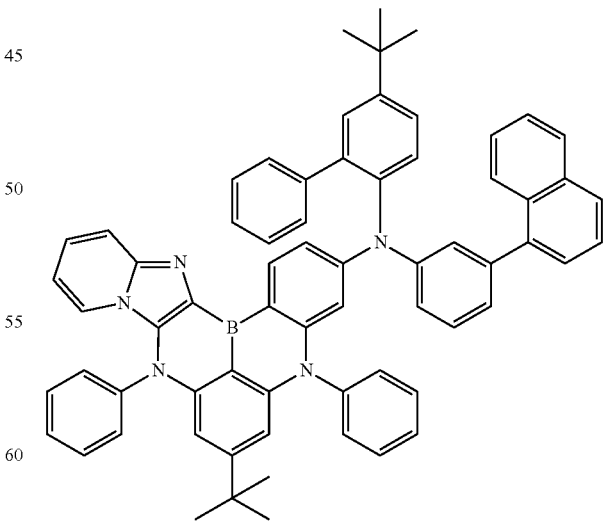

<Compound 19>
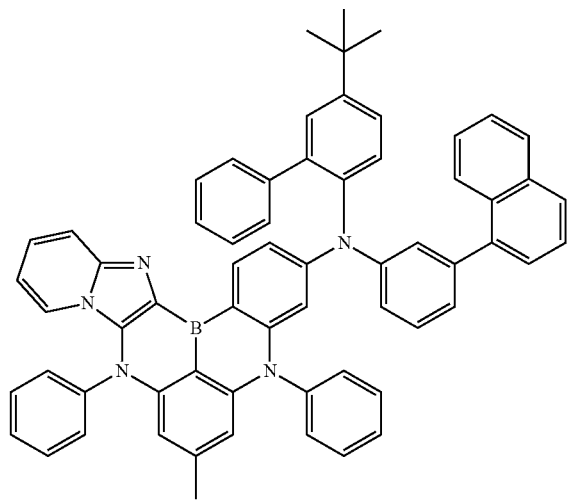
<Compound 20>
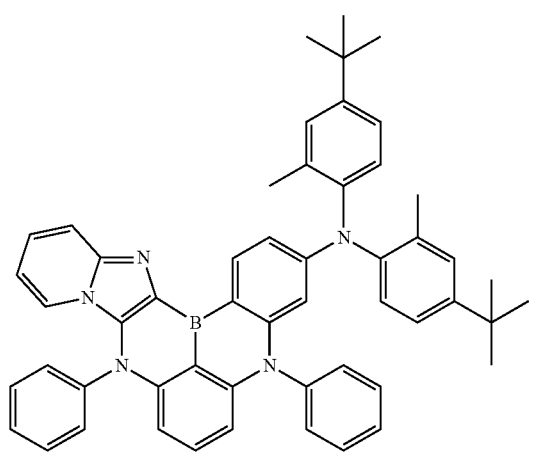
<Compound 21>
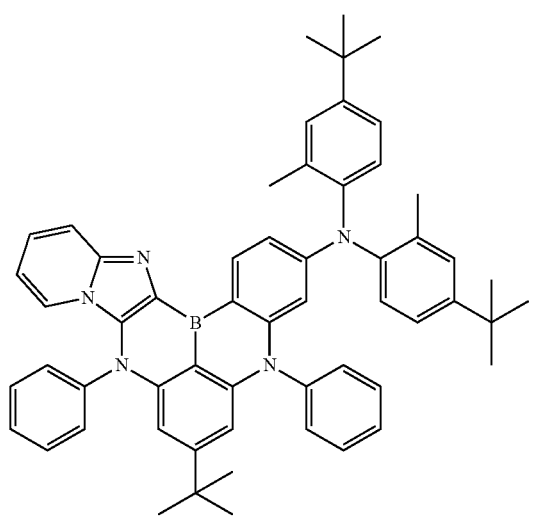
<Compound 22>
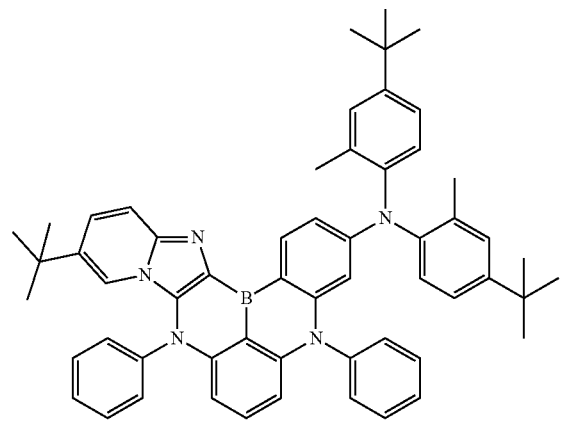
<Compound 23>
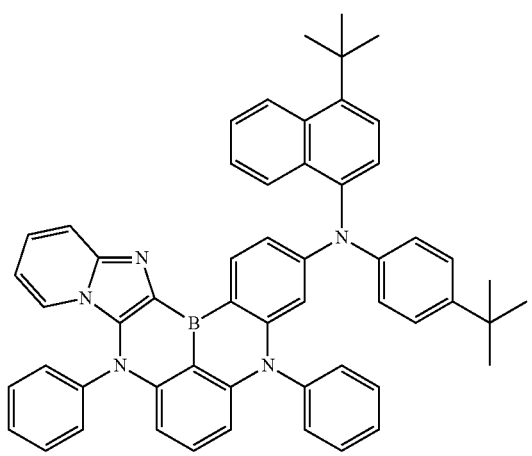
<Compound 24>
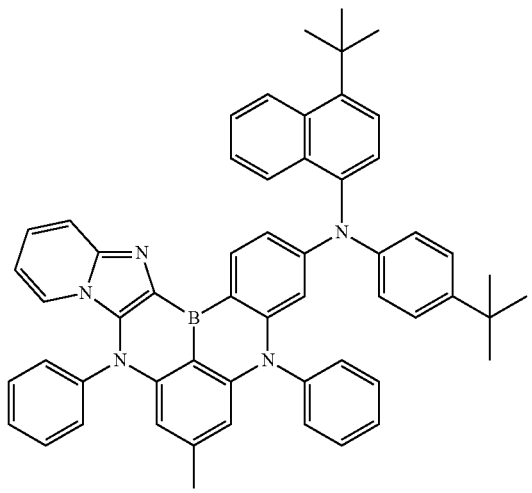

<Compound 25>
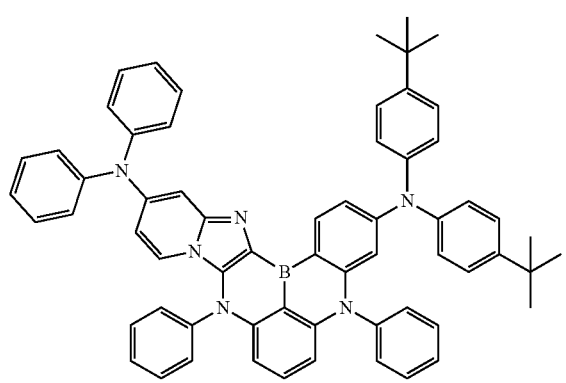
<Compound 26>
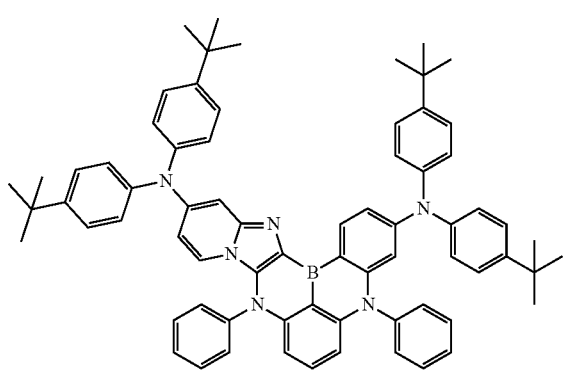
<Compound 27>
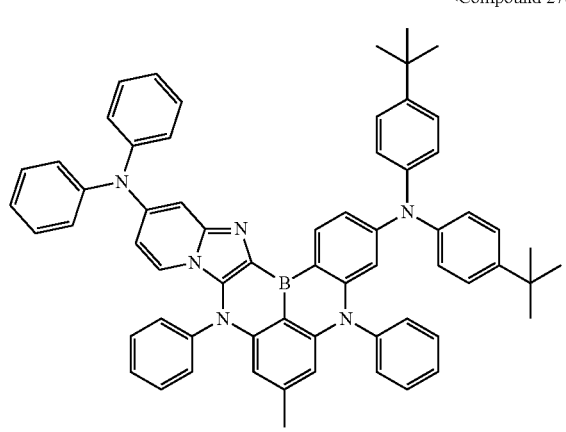
<Compound 28>
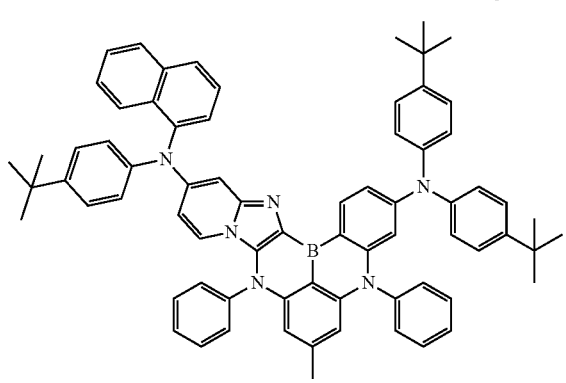
<Compound 29>
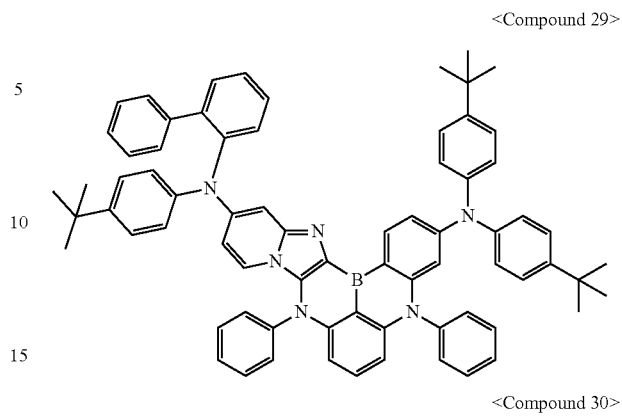
<Compound 30>
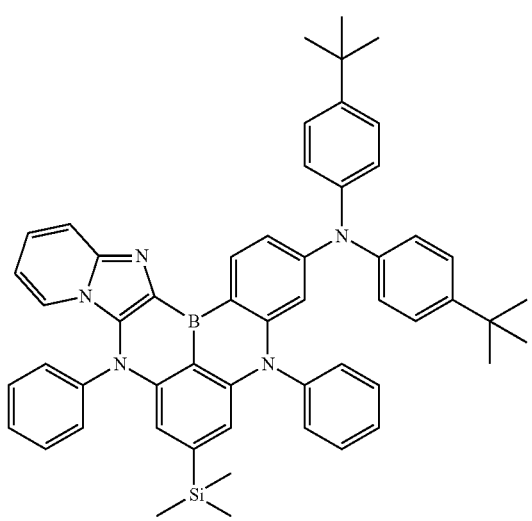
<Compound 31>
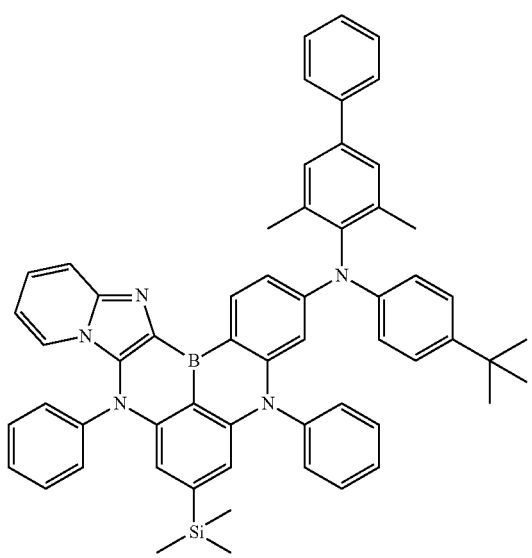

<Compound 32>
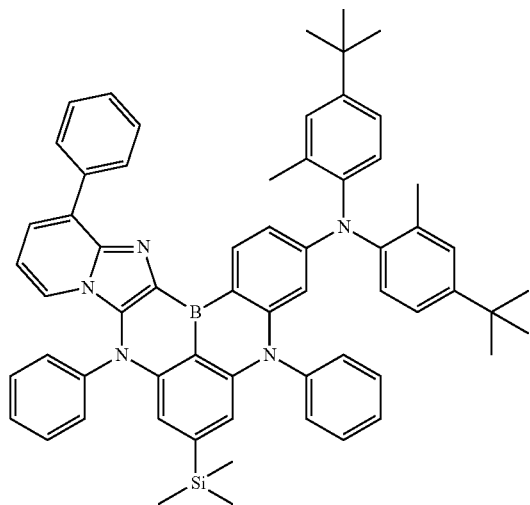
<Compound 33>
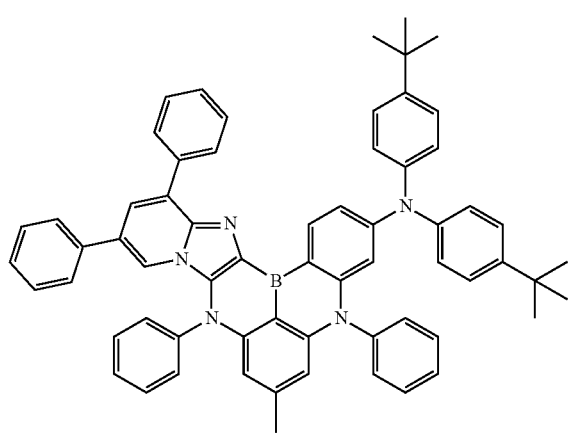
<Compound 34>
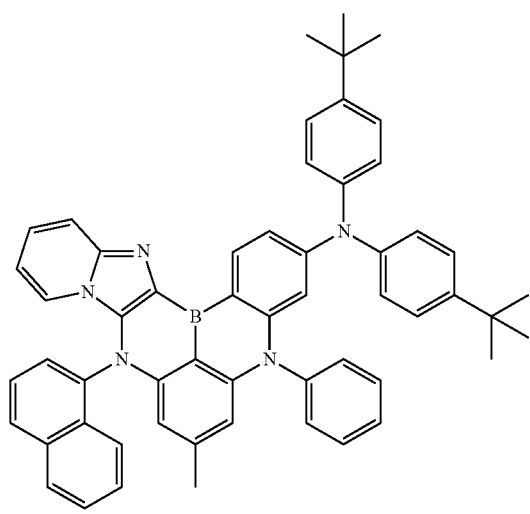
<Compound 35>
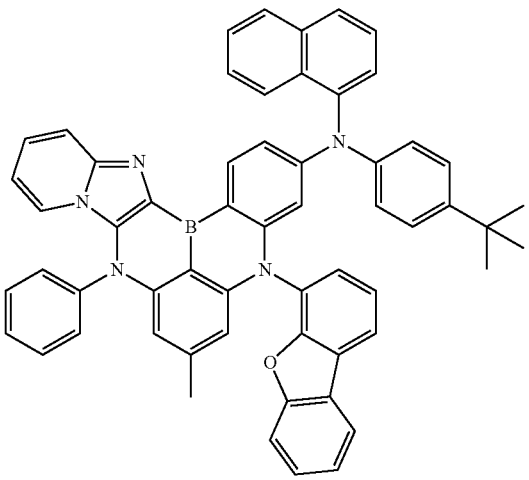
<Compound 36>
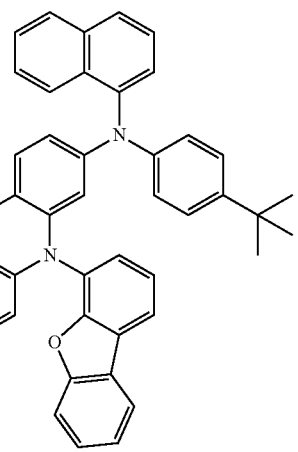
<Compound 37>
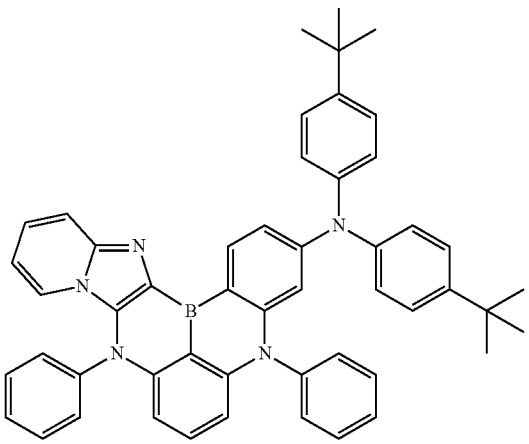

<Compound 38>
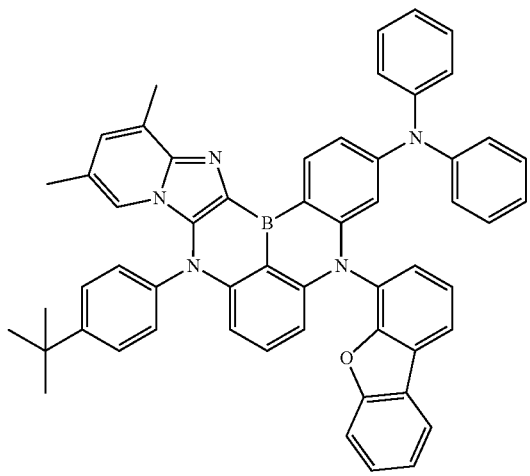
<Compound 39>
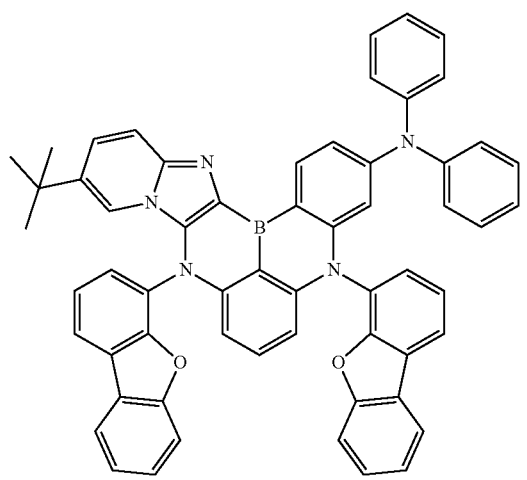
<Compound 40>
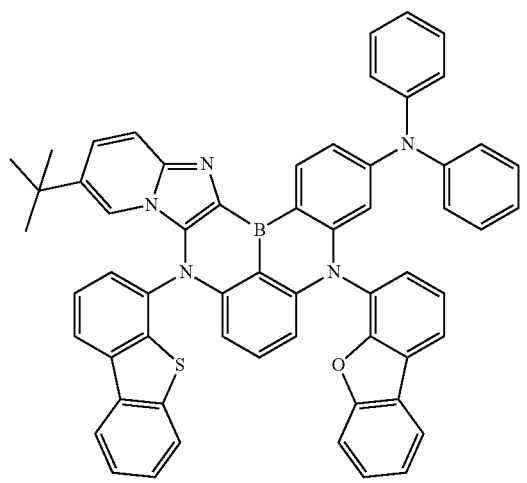
<Compound 41>
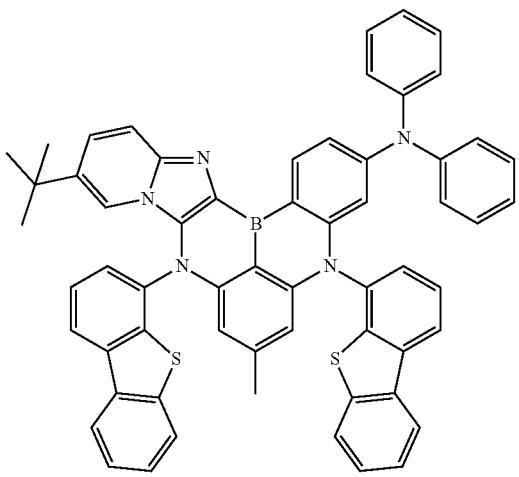
<Compound 42>
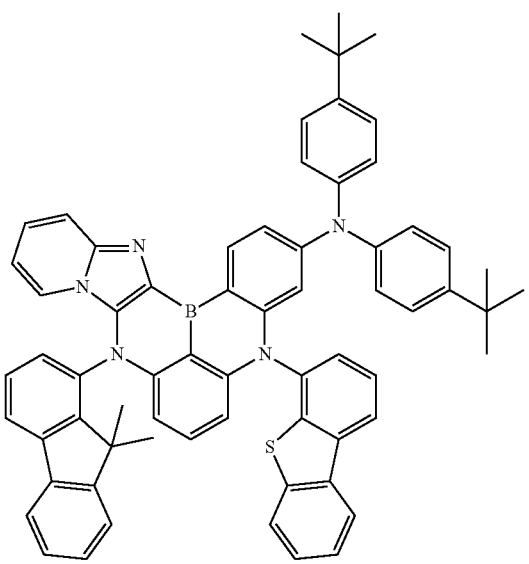
<Compound 43>
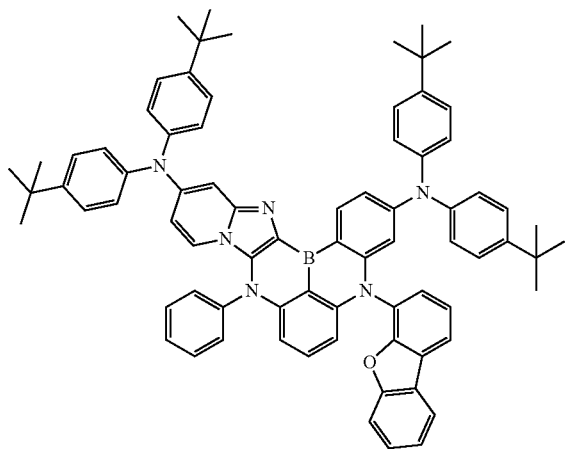

<Compound 44>
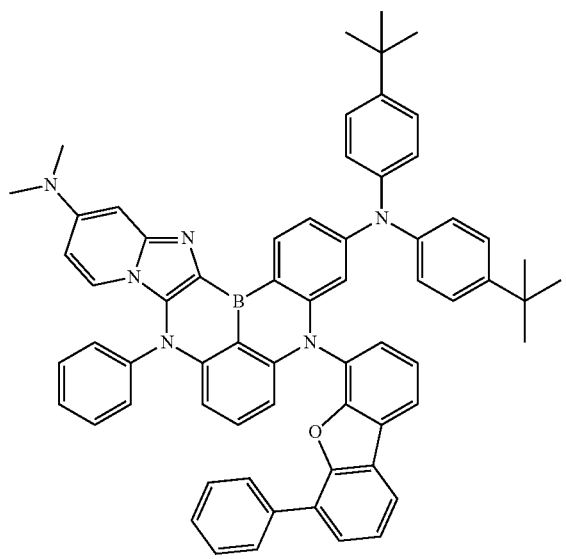
<Compound 45>
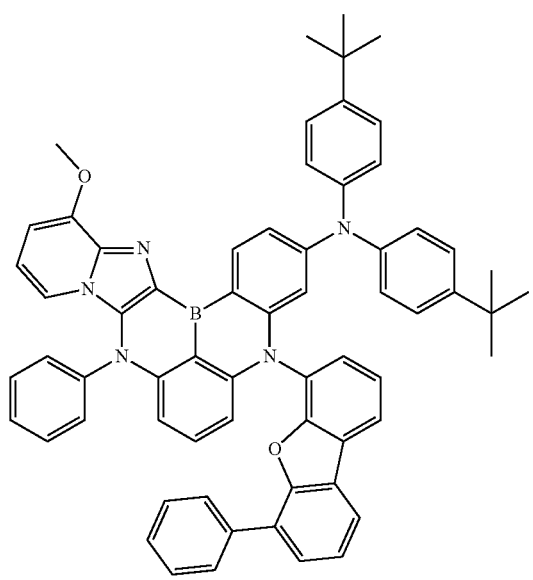
<Compound 46>
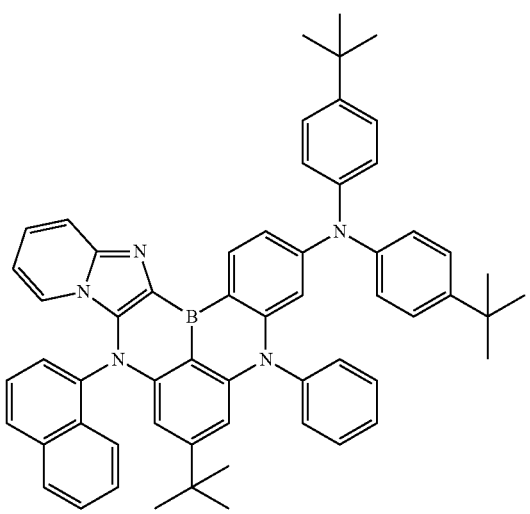
<Compound 47>
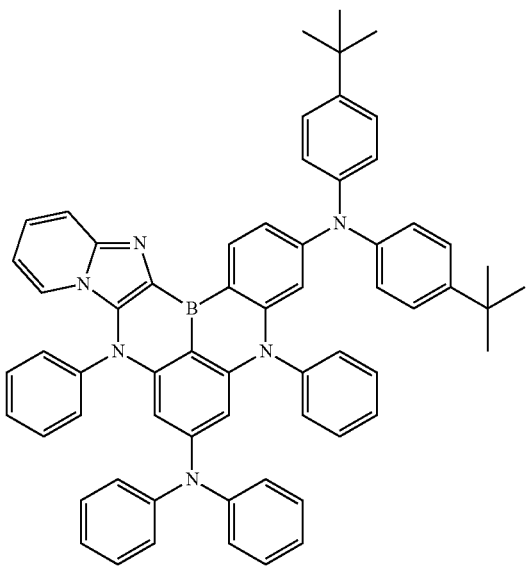

<Compound 48>
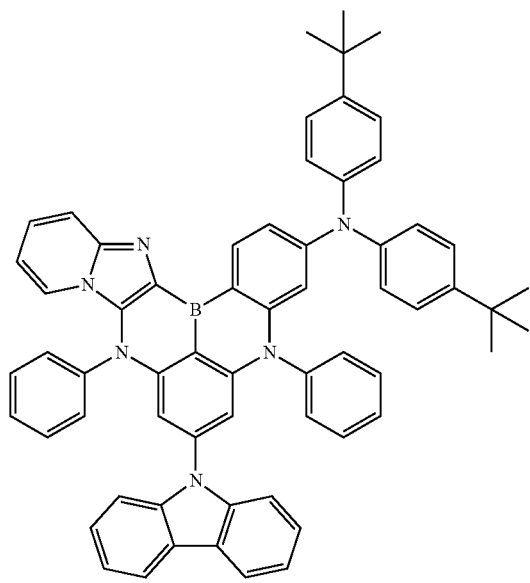
<Compound 49>
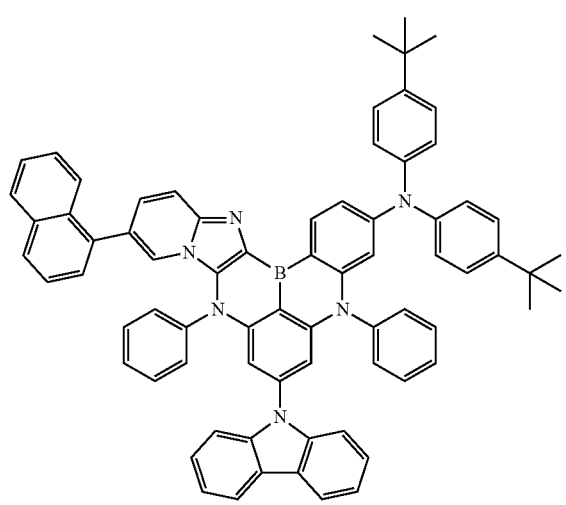
<Compound 50>
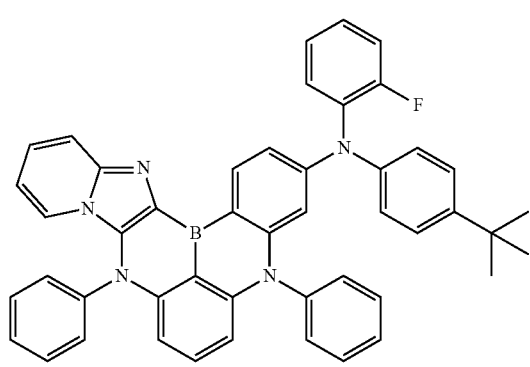
<Compound 51>
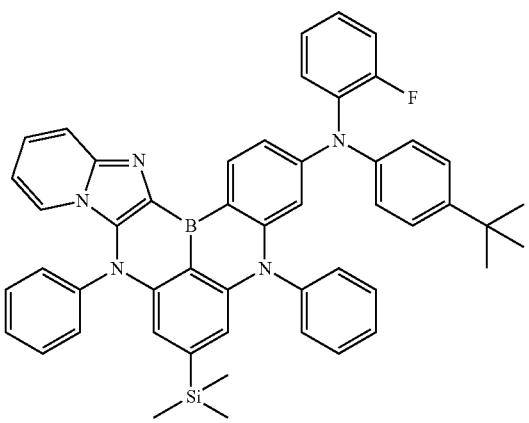
<Compound 52>
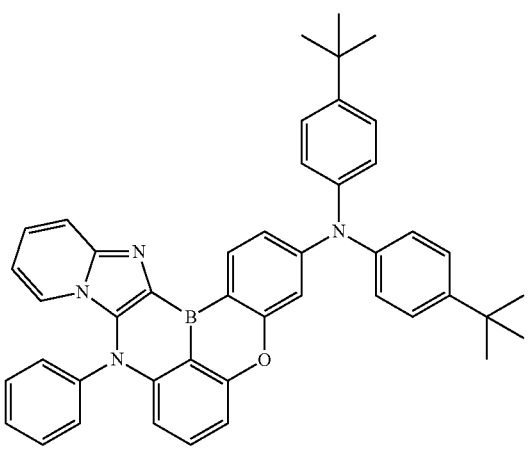
<Compound 53>
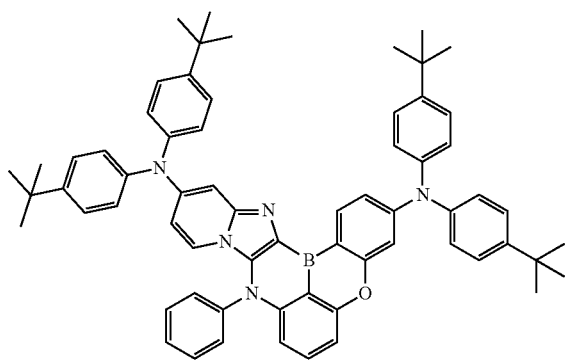

<Compound 54>
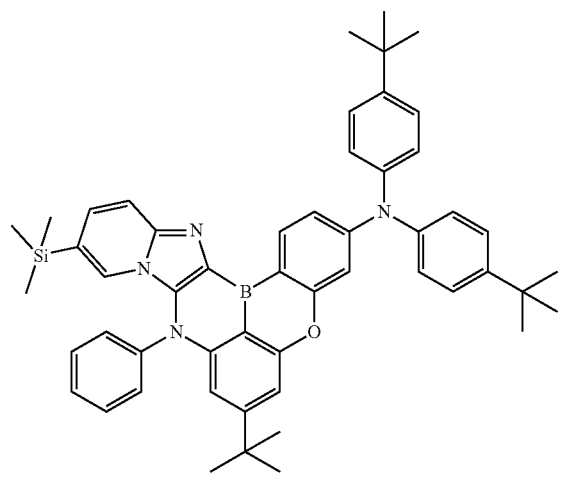
<Compound 55>
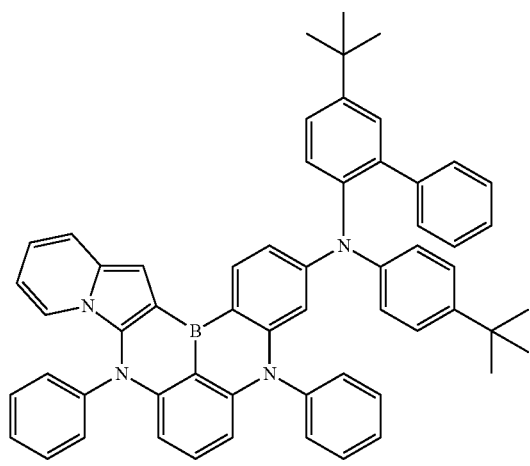
<Compound 56>
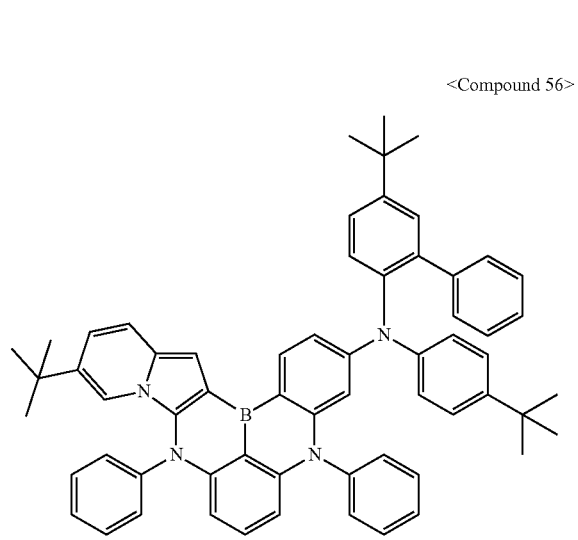
<Compound 57>
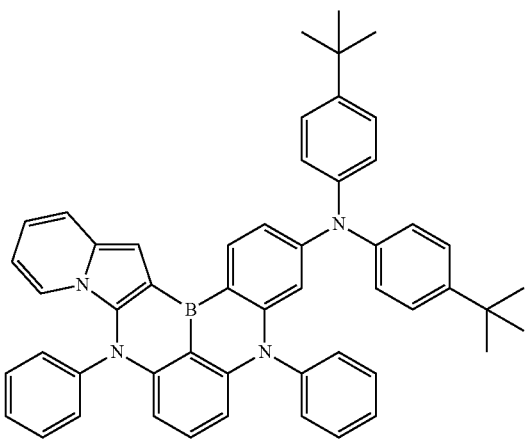
<Compound 58>
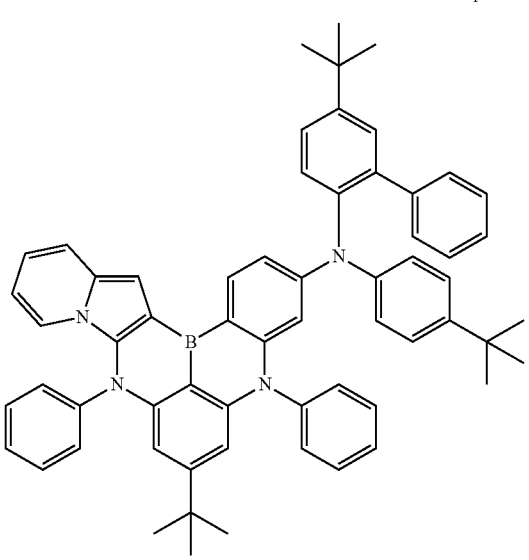
<Compound 59>
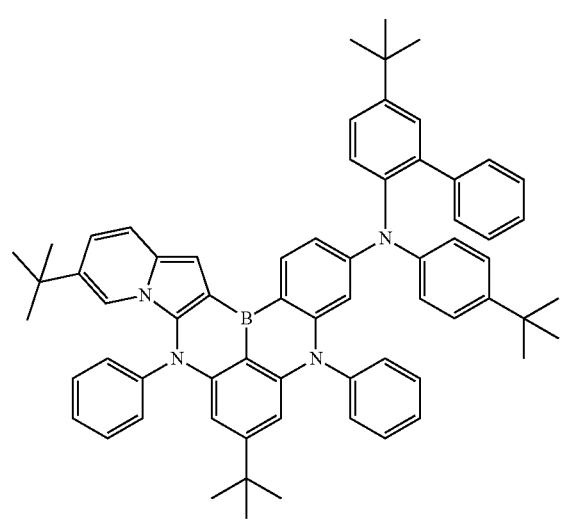

<Compound 60>
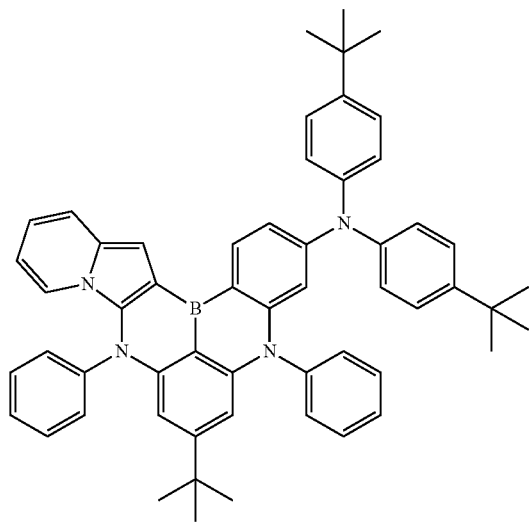
<Compound 61>
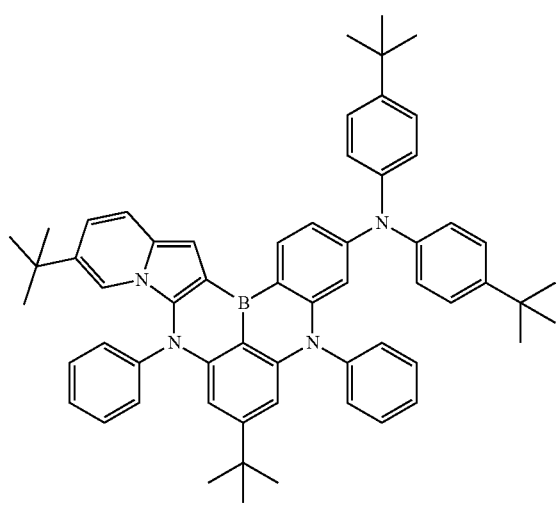
<Compound 62>
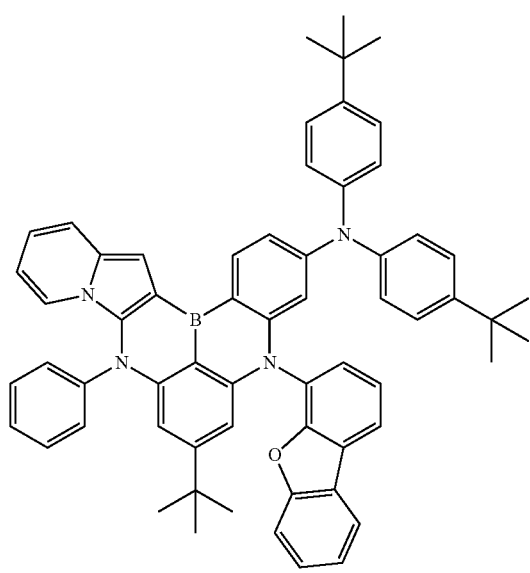
<Compound 63>
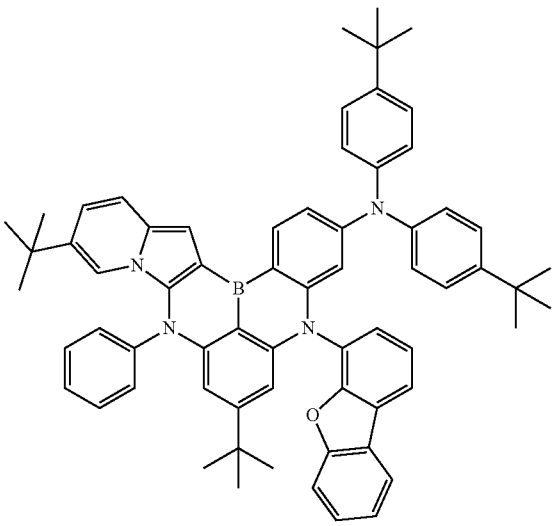
<Compound 64>
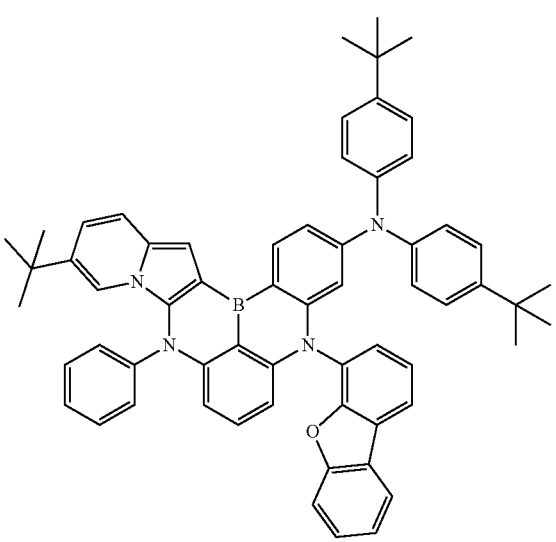
<Compound 65>
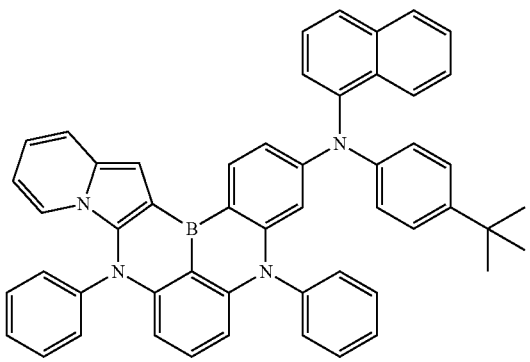

<Compound 66>
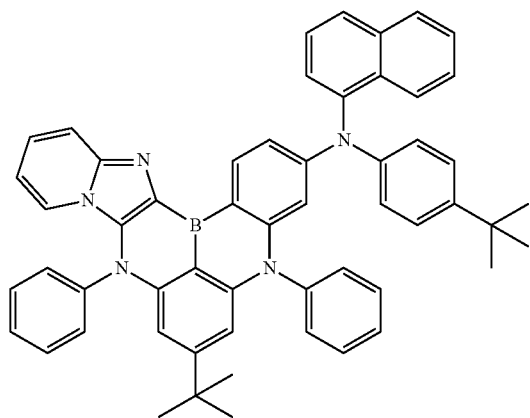
<Compound 67>
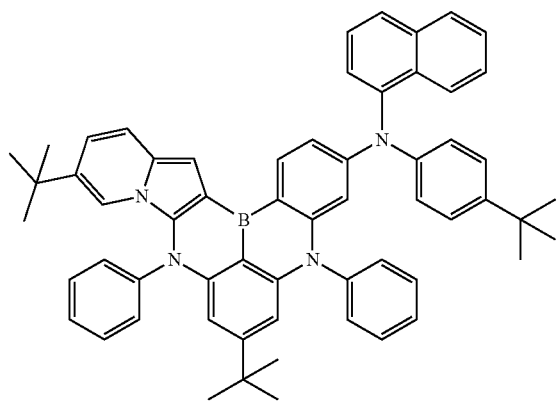
<Compound 68>
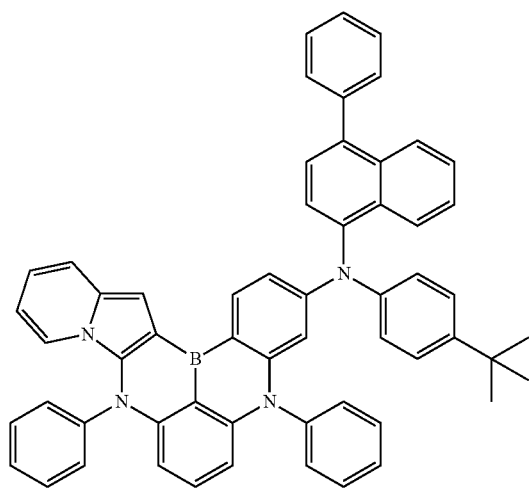
<Compound 69>
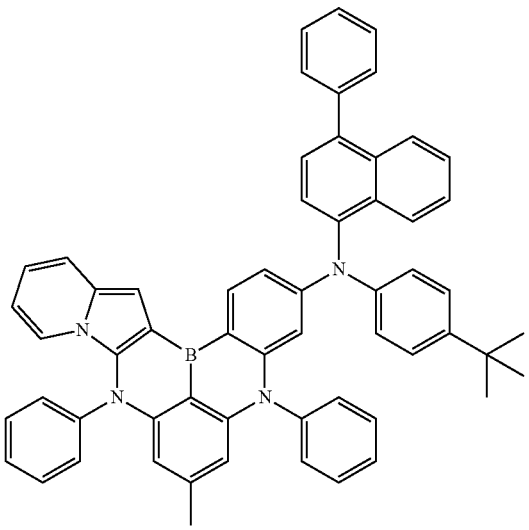
<Compound 70>
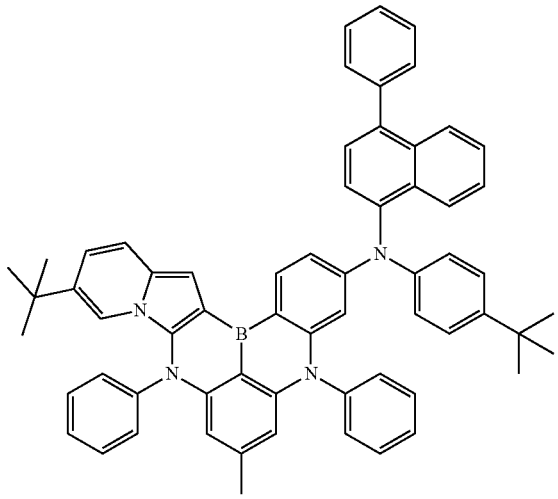
<Compound 71>
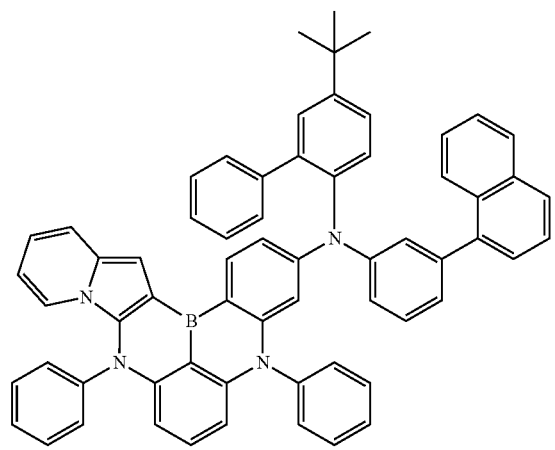

<Compound 72>
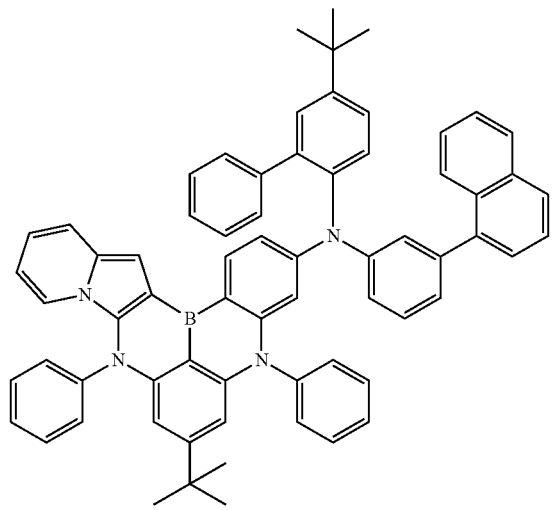
<Compound 75>
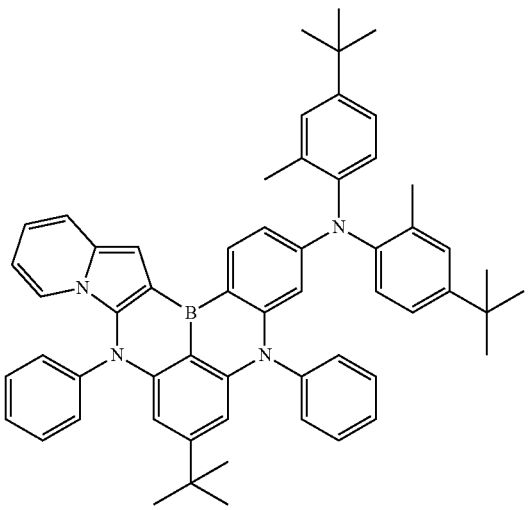
<Compound 73>
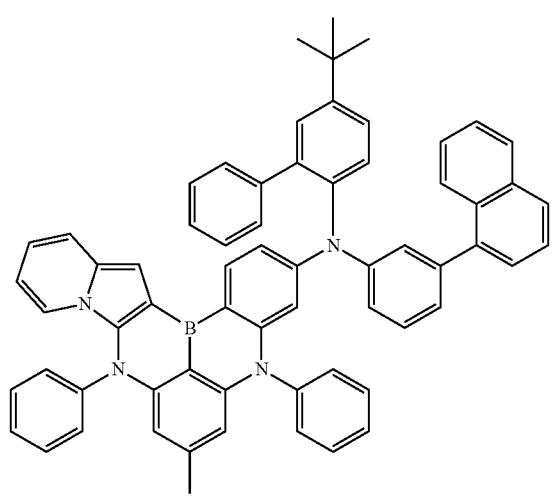
<Compound 76>
<Compound 74>
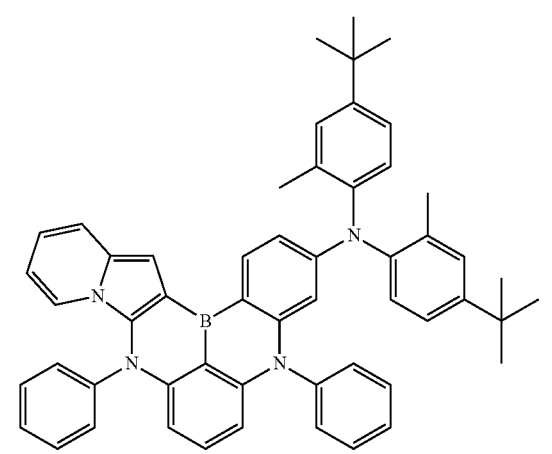
<Compound 77>
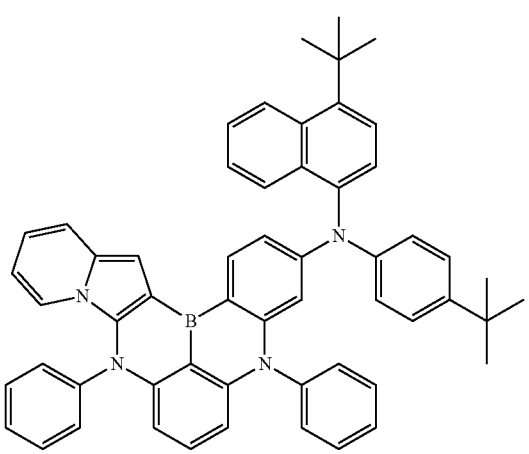

<Compound 78>
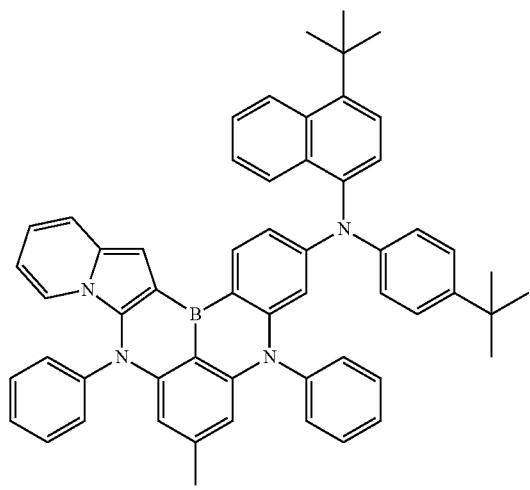
<Compound 79>
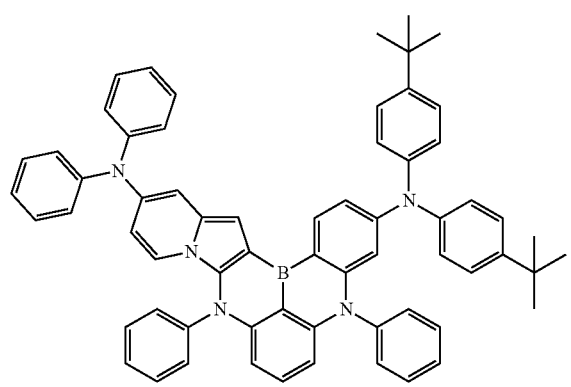
<Compound 80>
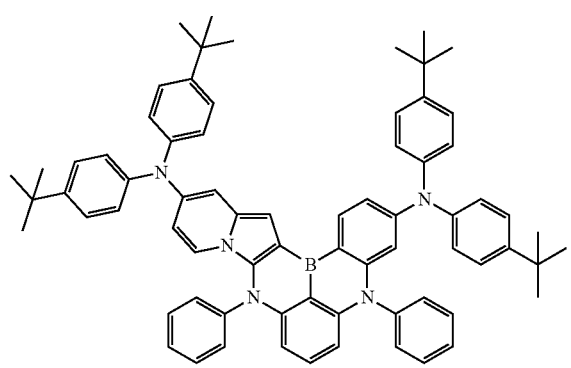
<Compound 81>
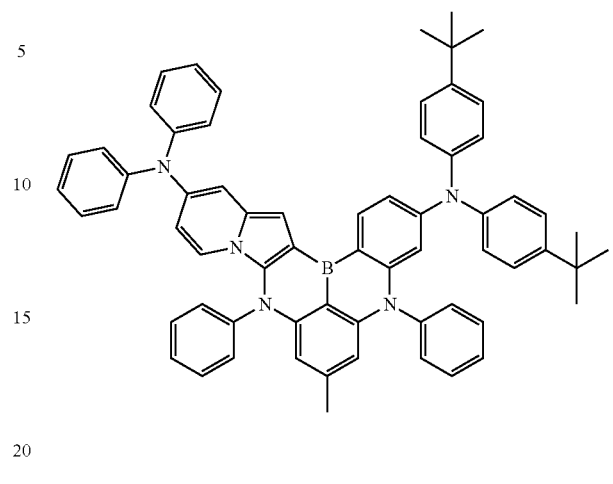
<Compound 82>
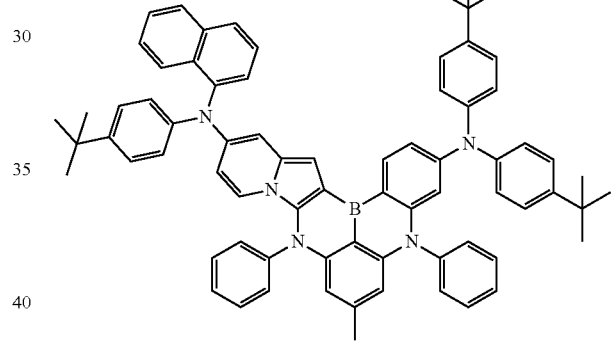
<Compound 83>
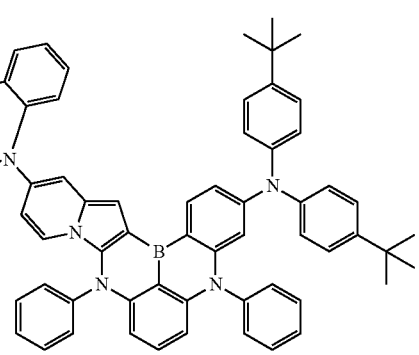

<Compound 84>
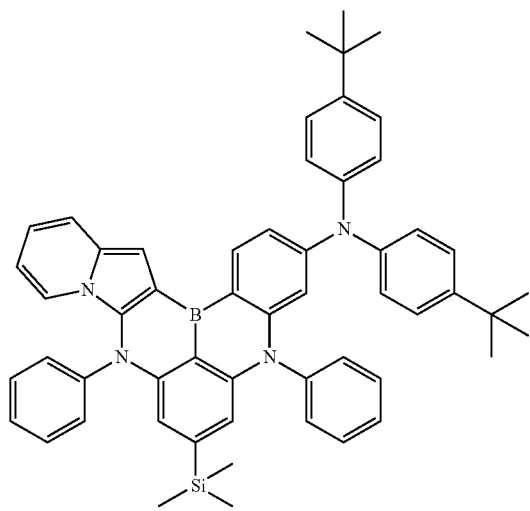
<Compound 85>
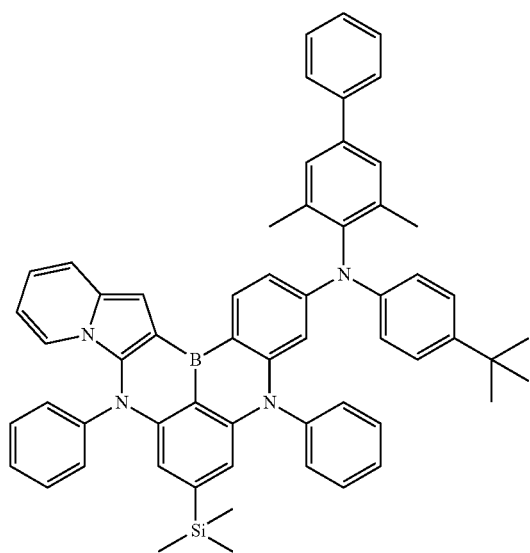
<Compound 86>
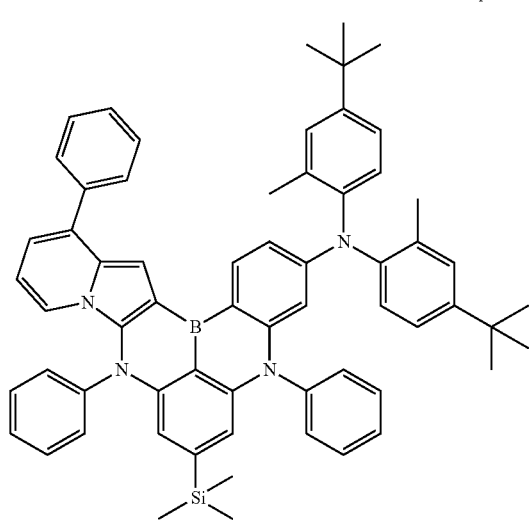
<Compound 87>
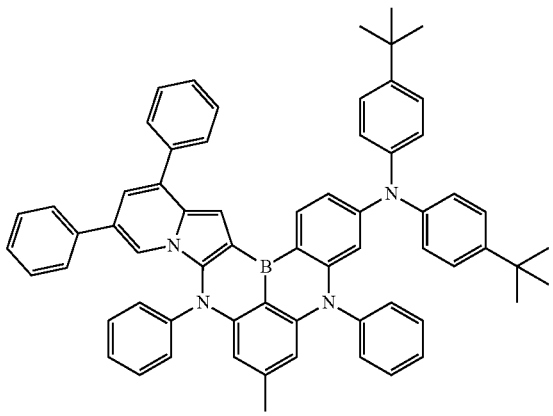
<Compound 88>
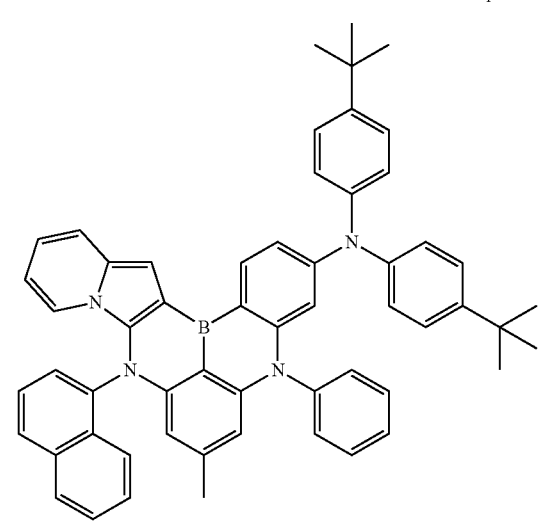
<Compound 89>
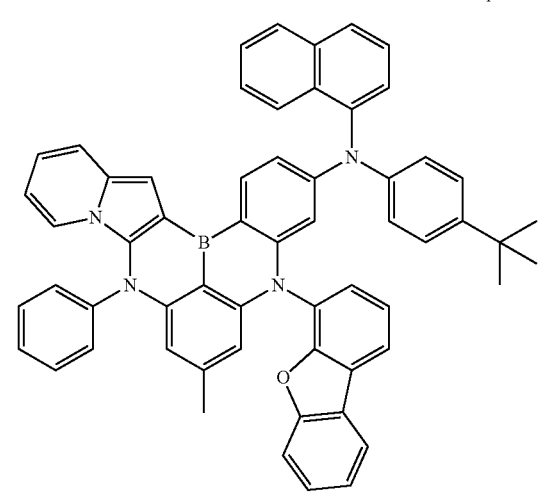

<Compound 90>
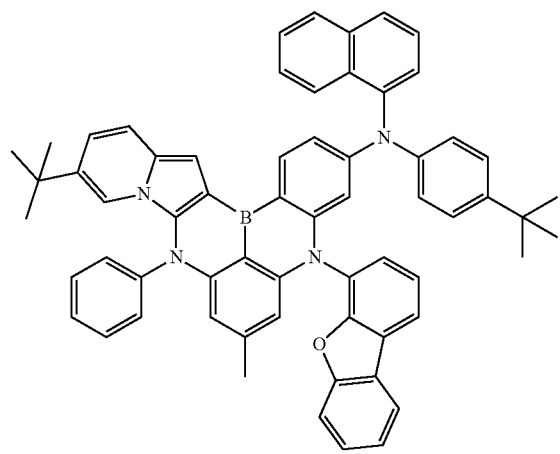
<Compound 91>
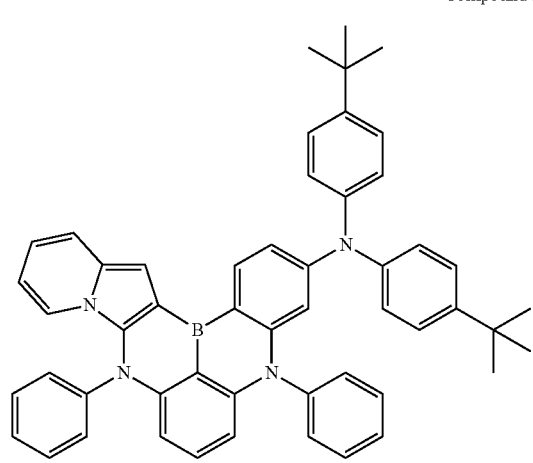
<Compound 92>
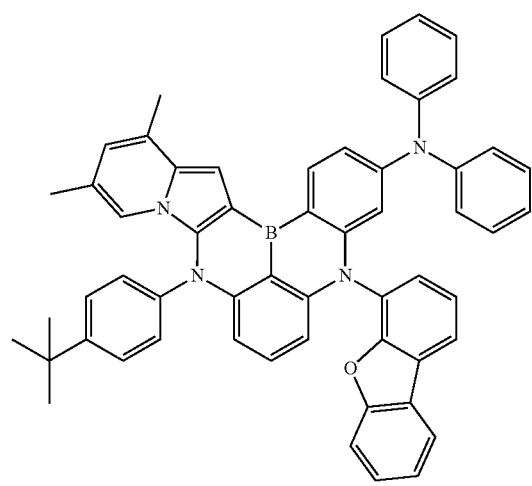
<Compound 93>
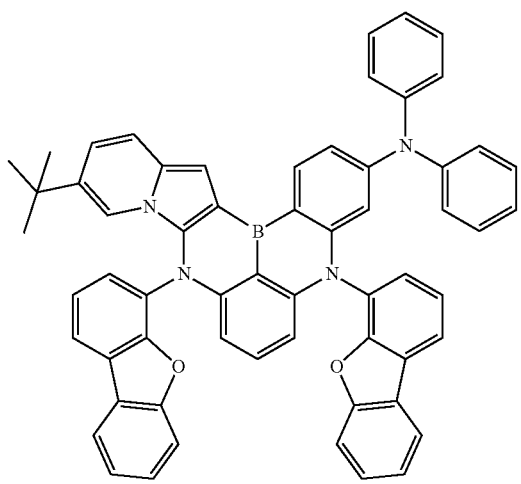
<Compound 94>
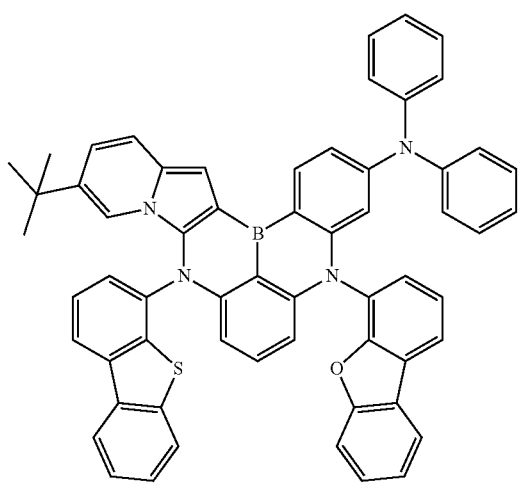
<Compound 95>
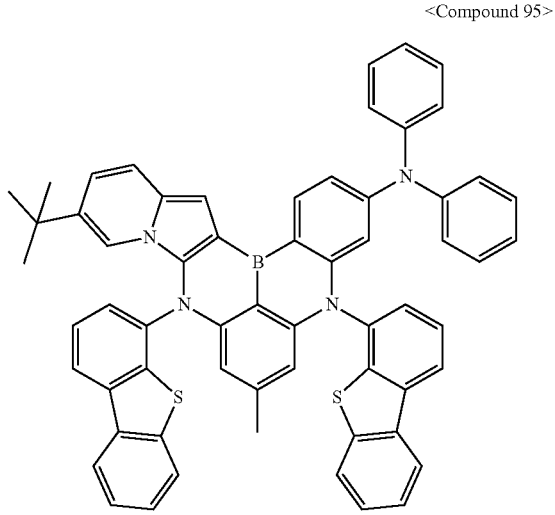

<Compound 96>
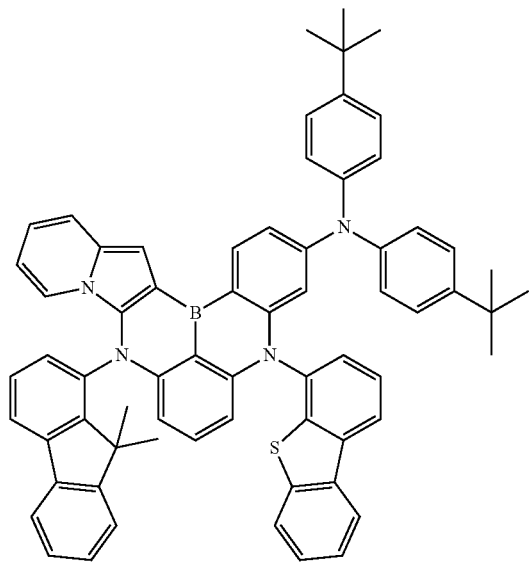
<Compound 97>
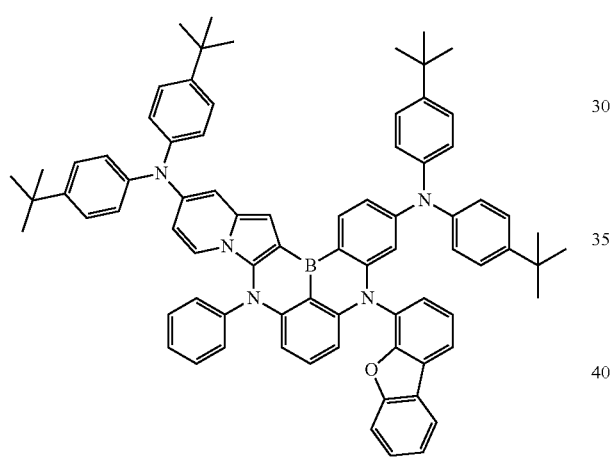
<Compound 98>
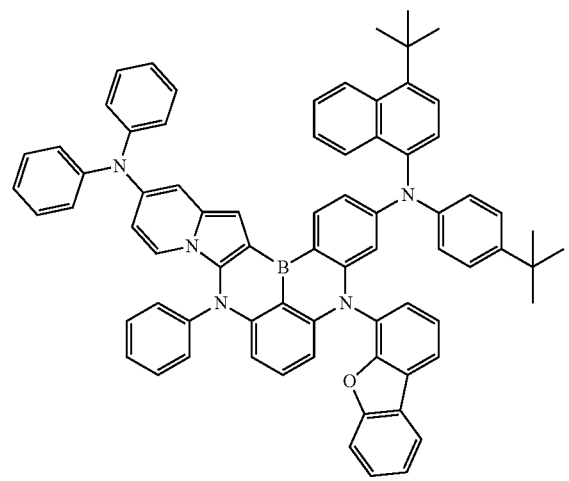
<Compound 99>
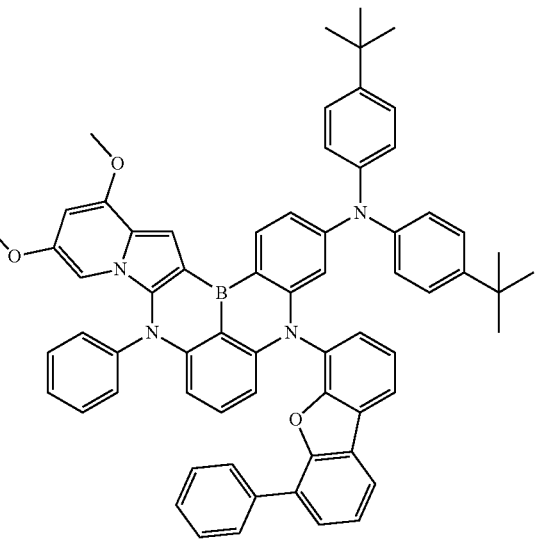
<Compound 100>
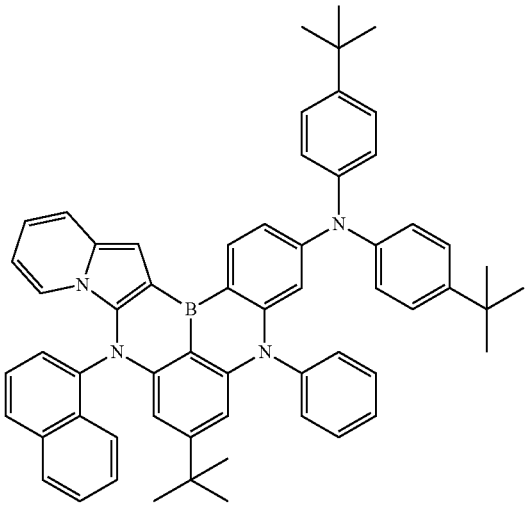

<Compound 101>
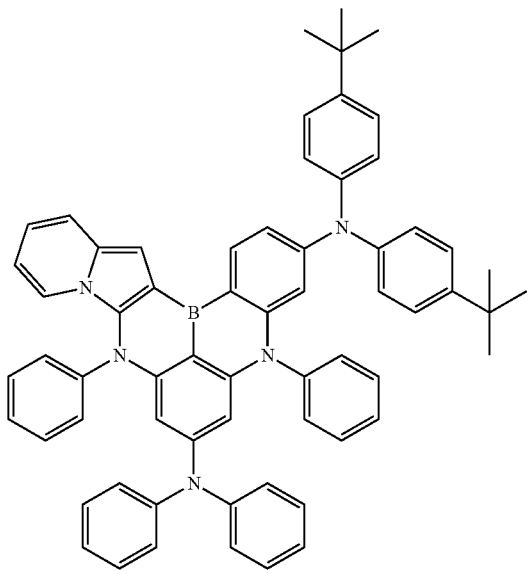
<Compound 102>
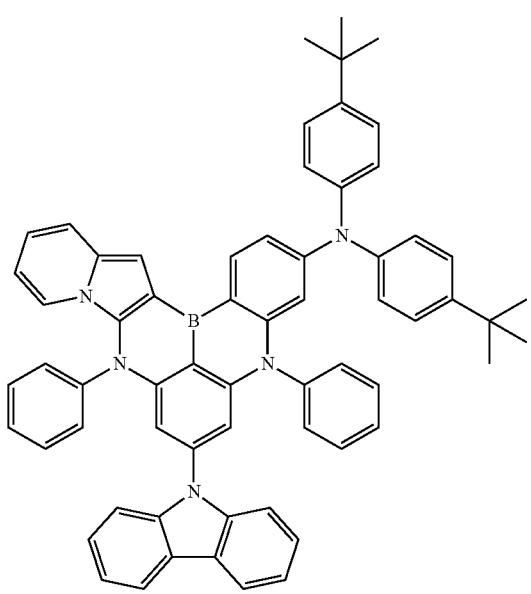
<Compound 103>
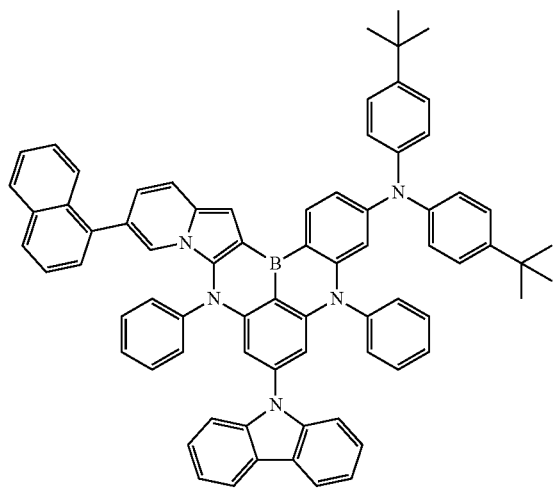
<Compound 104>
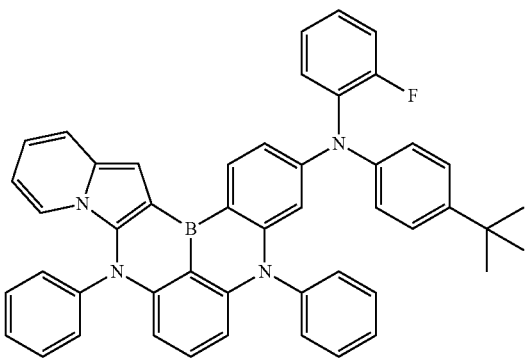
<Compound 105>
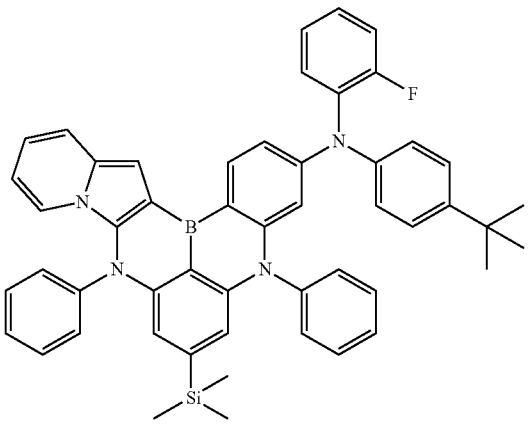

<Compound 106>
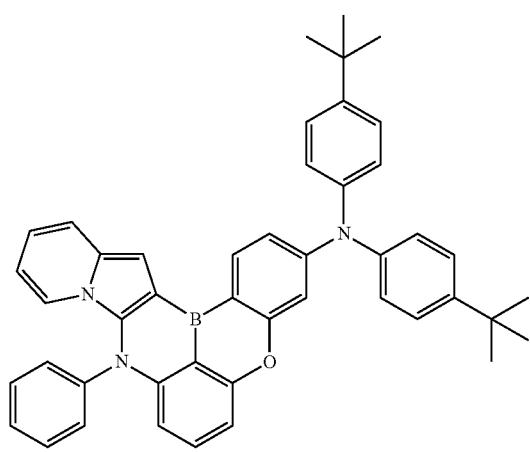
<Compound 107>
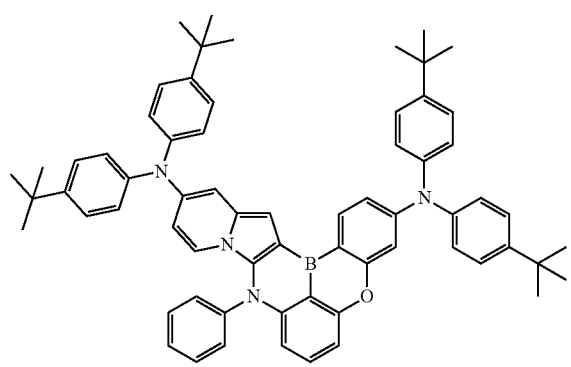
<Compound 108>
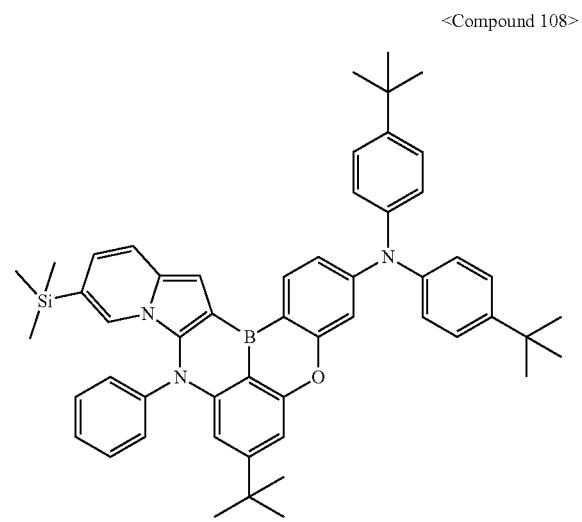
<Compound 109>
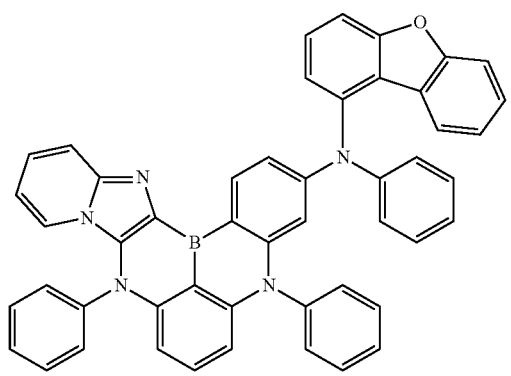
<Compound 110>
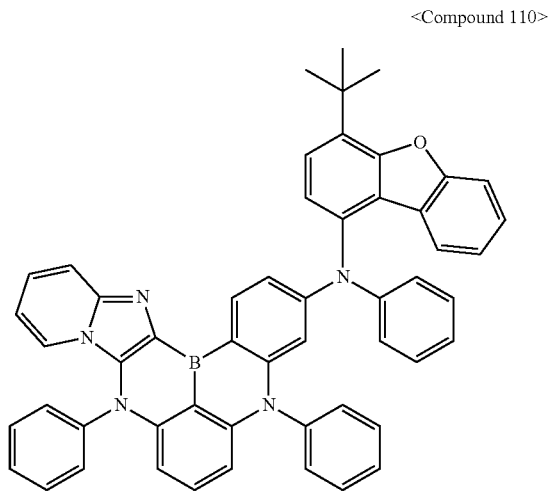
<Compound 111>
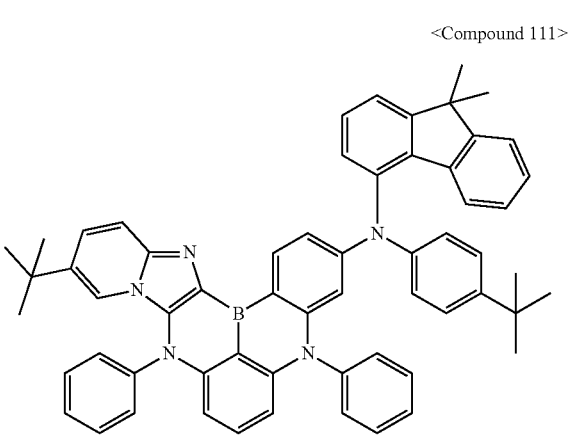

<Compound 112>
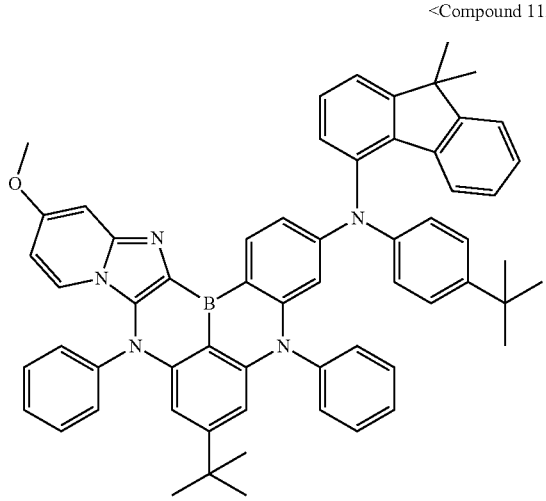
<Compound 113>
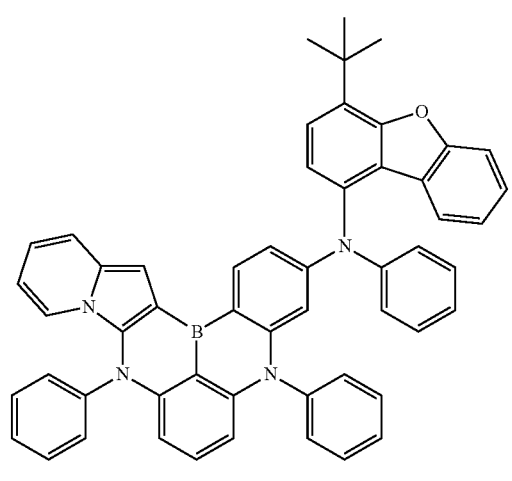
<Compound 114>
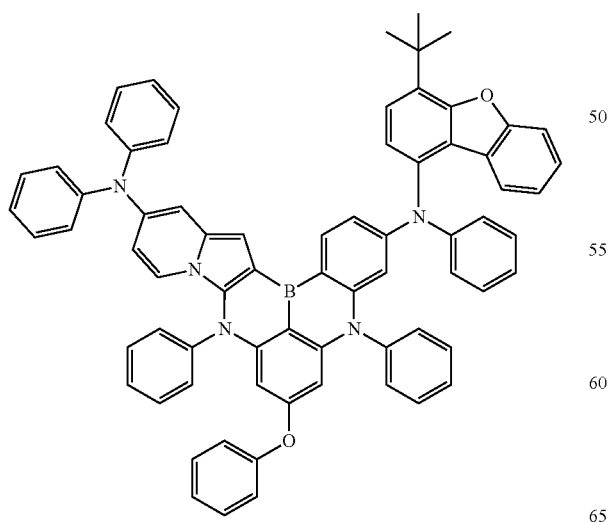
<Compound 115>
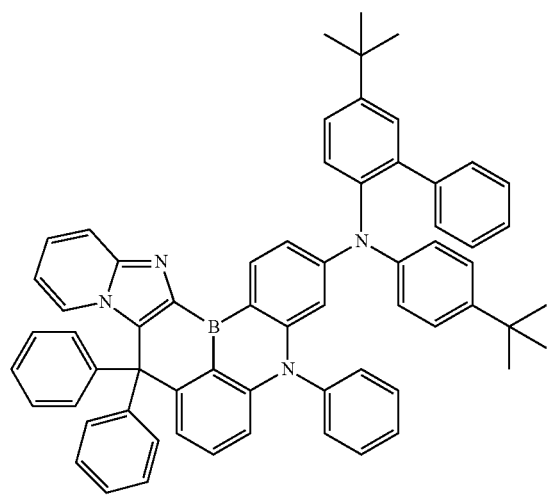
<Compound 116>
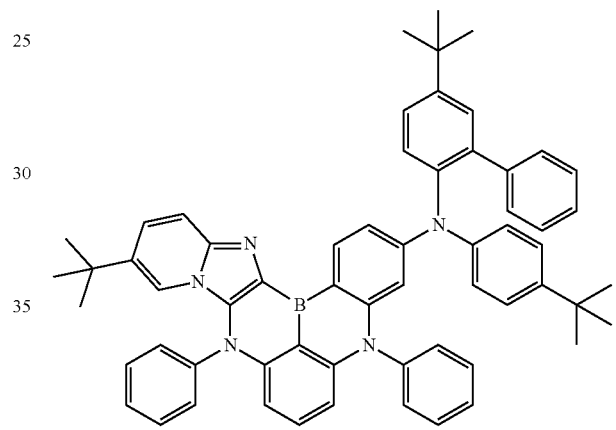
<Compound 117>
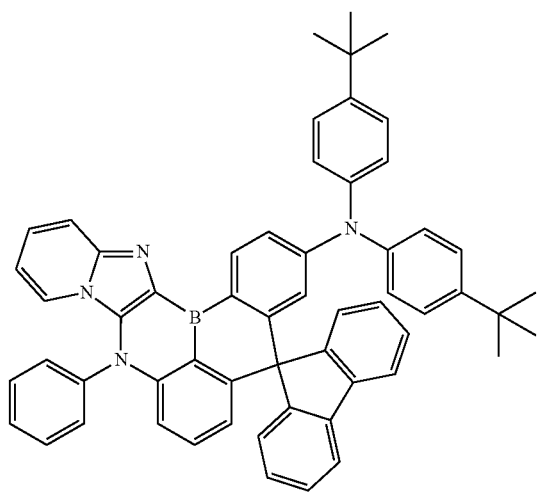

<Compound 118>
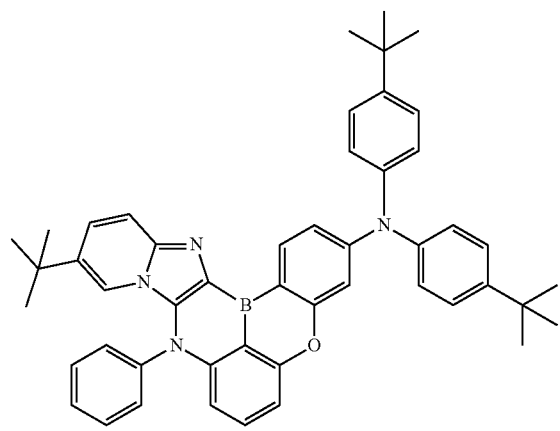
<Compound 119>
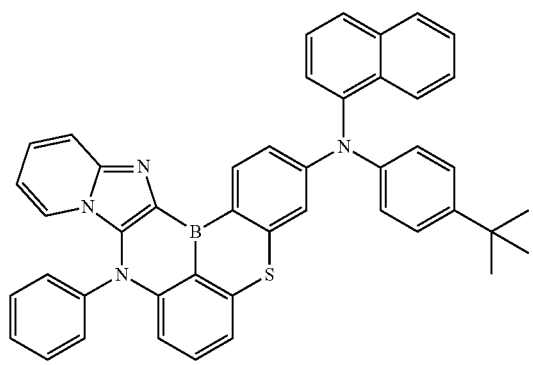
<Compound 120>
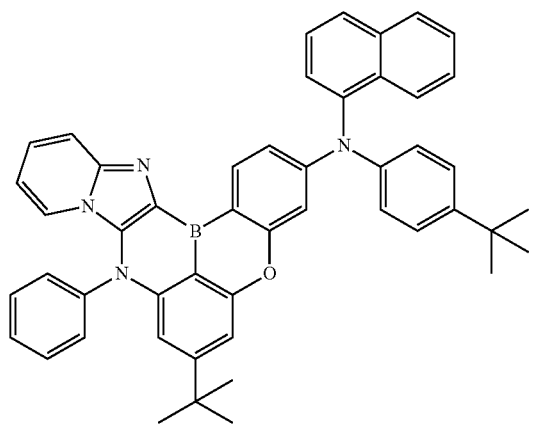
<Compound 121>
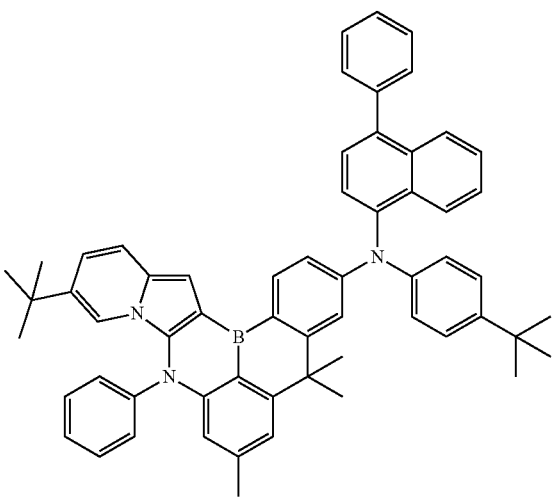
<Compound 122>
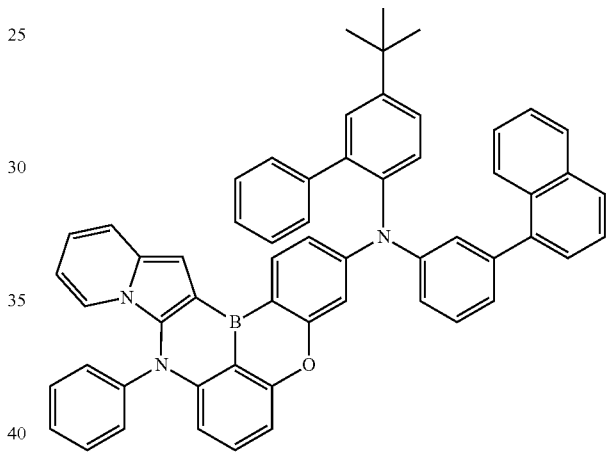
<Compound 123>
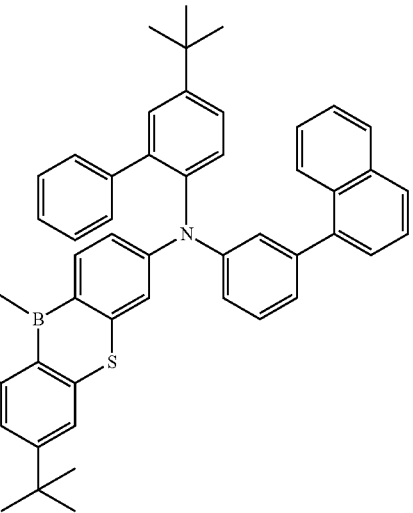

<Compound 124>
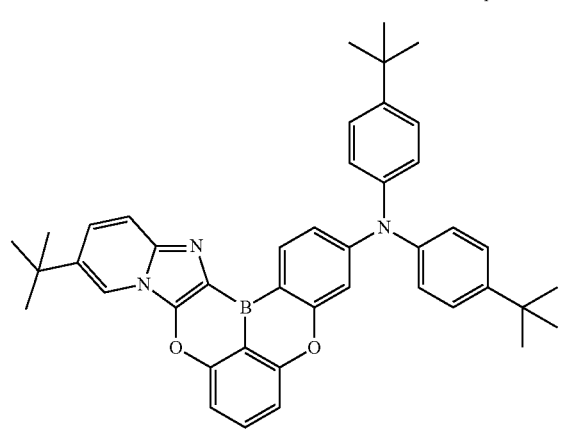
<Compound 125>
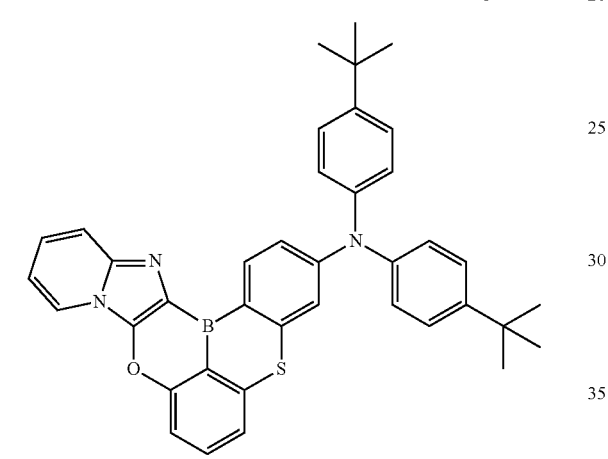
<Compound 126>
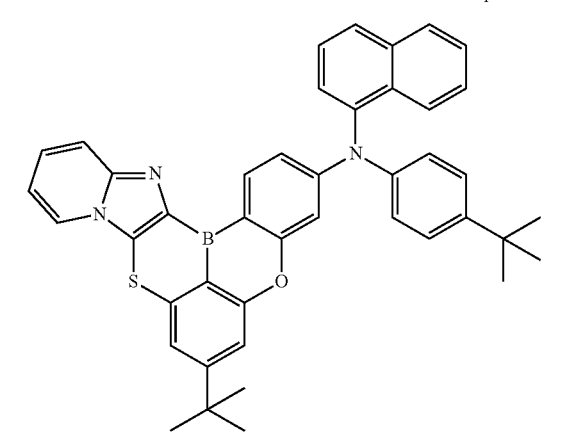
<Compound 127>
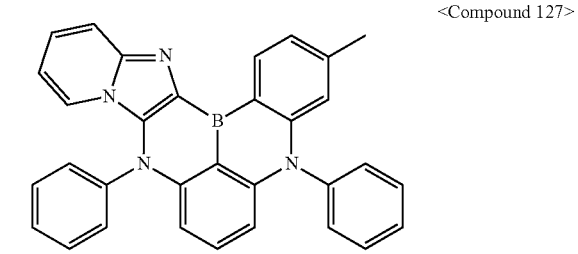
<Compound 128>
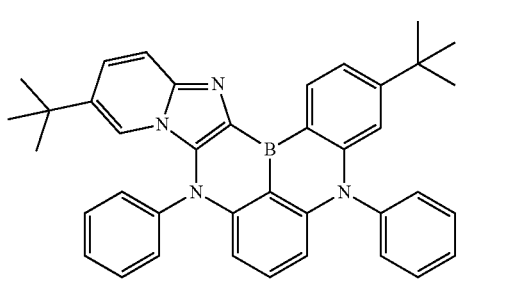
<Compound 129>
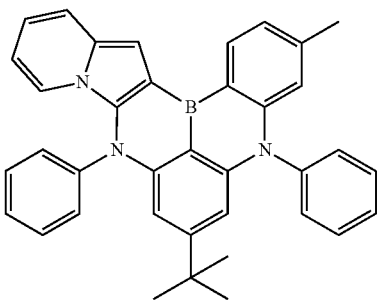
<Compound 130>
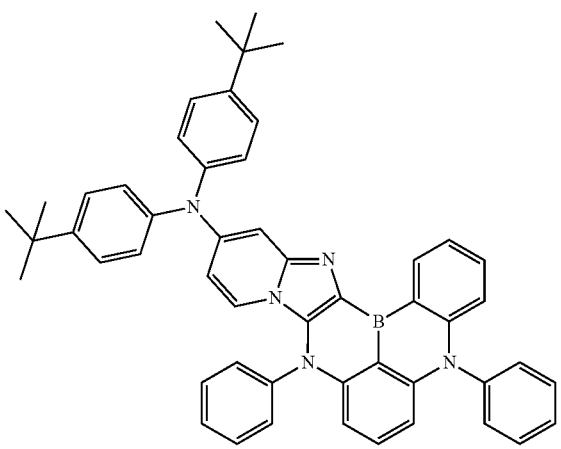
<Compound 131>
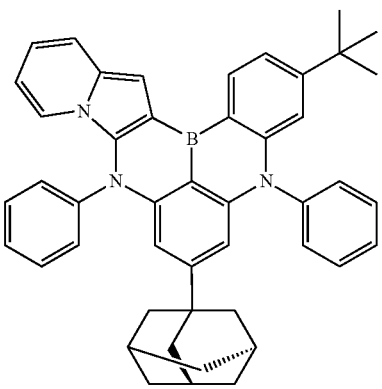

-continued

<Compound 132>

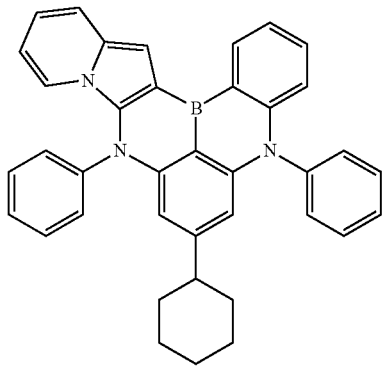

13. An organic light-emitting diode, comprising:
a first electrode;
a second electrode facing the second electrode; and
an organic layer interposed between the first electrode and the second electrode,
wherein the organic layer includes a boron compound of claims 1.

14. The organic light-emitting diode of claim 13, wherein the organic layer comprises at least one of a hole injection layer, a hole transport layer, a functional layer capable of both hole injection and hole transport, an electron blocking layer, a light-emitting layer, an electron transport layer, an electron injection layer, and a capping layer.

15. The organic light-emitting diode of claim 13, wherein the organic layer disposed between the first electrode and the second electrode comprises a light-emitting layer composed of a host and a dopant, wherein the boron compound represented by Chemical Formula A serves as the dopant.

16. The organic light-emitting diode of claim 15, wherein the light-emitting layer employs as a host an anthracene derivative represented by the following Chemical Formula D:

[Chemical Formula D]

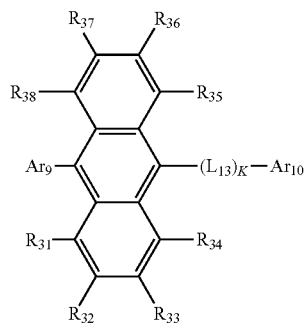

wherein
$R_{31}$ to $R_{38}$, which are same or different, are each as defined for $R_1$ to $R_{17}$ in claim 1;
$Ar_9$ and $Ar_{10}$, which are same or different, are each independently any one selected from a hydrogen atom, a deuterium atom, a substituted or unsubstituted alkyl of 1 to 30 carbon atoms, a substituted or unsubstituted aryl of 6 to 50 carbon atoms, a substituted or unsubstituted alkenyl of 2 to 30 carbon atoms, a substituted or unsubstituted alkynyl of 2 to 20 carbon atoms, a substituted or unsubstituted cycloalkyl of 3 to 30 carbon atoms, a substituted or unsubstituted cycloalkenyl of 5 to 30 carbon atoms, a substituted or unsubstituted heteroaryl of 2 to 50 carbon atoms, a substituted or unsubstituted heterocycloalkyl of 2 to 30 carbon atoms, a substituted or unsubstituted alkoxy of 1 to 30 carbon atoms, a substituted or unsubstituted aryloxy of 6 to 30 carbon atoms, a substituted or unsubstituted alkylthioxy of 1 to 30 carbon atoms, a substituted or unsubstituted arylthioxy of 6 to 30 carbon atoms, a substituted or unsubstituted alkylamine of 1 to 30 carbon atoms, a substituted or unsubstituted arylamine of 6 to 30 carbon atoms, a substituted or unsubstituted alkylsilyl of 1 to 30 carbon atoms, and a substituted or unsubstituted arylsilyl of 6 to 30 carbon atoms;
$L_{13}$, which functions as a linker, is a single bond or is selected from a substituted or unsubstituted arylene of 6 to 20 carbon atoms, and a substituted or unsubstituted heteroarylene of 2 to 20 carbon atoms; and
k is an integer of 1 to 3, wherein when k is 2 or greater, the corresponding $L_{13}$'s are same or different,
wherein the term "substituted" in the expression "substituted or unsubstituted" is as defined in claim 1.

17. The organic light-emitting diode of claim 16, wherein Ar9 in Chemical Formula D is a substituent represented by the following Chemical Formula D-1:

[Chemical Formula D-1]

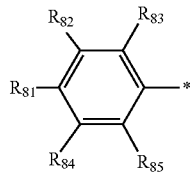

wherein, $R_{81}$ to $R_{85}$, which may be same or different, are as defined for $R_1$ to $R_{17}$ in claim 1; and can each be linked to an adjacent one to form a saturated or unsaturated cyclic ring.

18. The organic light-emitting diode of claim 14, wherein at least one selected from among the layers is deposited using a deposition process or a solution process.

19. The organic light-emitting diode of claim 13, wherein the organic light-emitting diode is used for a device selected from among a flat display device; a flexible display device; a monochrome or grayscale flat illumination; and a monochrome or grayscale flexible illumination device.

* * * * *